(12) United States Patent
Yamaguchi et al.

(10) Patent No.: US 12,400,923 B2
(45) Date of Patent: Aug. 26, 2025

(54) SEMICONDUCTOR PACKAGE, ELECTRONIC DEVICE, AND METHOD FOR MANUFACTURING SEMICONDUCTOR PACKAGE

(71) Applicant: DENSO CORPORATION, Kariya (JP)

(72) Inventors: Akihiro Yamaguchi, Kariya (JP); Norihisa Imaizumi, Kariya (JP); Ryuma Kamikomaki, Kariya (JP); Kouji Kondoh, Kariya (JP); Hirotaka Miyano, Kariya (JP); Tomohiro Yokochi, Kariya (JP); Gentarou Masuda, Kariya (JP)

(73) Assignee: DENSO CORPORATION, Kariya (JP)

( * ) Notice: Subject to any disclaimer, the term of this patent is extended or adjusted under 35 U.S.C. 154(b) by 660 days.

(21) Appl. No.: 17/559,608

(22) Filed: Dec. 22, 2021

(65) Prior Publication Data
US 2022/0115283 A1    Apr. 14, 2022

Related U.S. Application Data

(63) Continuation of application No. PCT/JP2020/026714, filed on Jul. 8, 2020.

(30) Foreign Application Priority Data

Jul. 10, 2019  (JP) .................................. 2019-128693
Jun. 30, 2020  (JP) .................................. 2020-113132

(51) Int. Cl.
*H01L 23/29*    (2006.01)
*H01L 21/56*    (2006.01)
(Continued)

(52) U.S. Cl.
CPC .......... *H01L 23/293* (2013.01); *H01L 21/561* (2013.01); *H01L 23/3735* (2013.01);
(Continued)

(58) Field of Classification Search
CPC ............. H01L 25/0657; H01L 25/0652; H01L 25/043; H01L 25/071; H01L 25/074;
(Continued)

(56) References Cited

U.S. PATENT DOCUMENTS 10,727,151 B2 * 7/2020 Chen ................. H01L 23/49513
2002/0022312 A1   2/2002 Tani et al.
(Continued)

FOREIGN PATENT DOCUMENTS

JP    2005-226096 A    8/2005
JP    2007-157863 A    6/2007
(Continued)

OTHER PUBLICATIONS

Yamaguchi et al., U.S. Appl. No. 19/191,967, filed Apr. 28, 2025 (as-filed specification and drawings).
(Continued)

*Primary Examiner* — Wael M Fahmy
*Assistant Examiner* — Quinton A Brasfield
(74) *Attorney, Agent, or Firm* — Posz Law Group, PLC

(57) ABSTRACT

A semiconductor package includes a semiconductor chip, a heat radiating member on which the semiconductor chip is mounted, and a sealing member sealing the semiconductor chip. The sealing member is made of a liquid crystal polymer.

17 Claims, 59 Drawing Sheets

(51) Int. Cl.
- H01L 23/00 (2006.01)
- H01L 23/373 (2006.01)
- H01L 23/473 (2006.01)
- H01L 25/16 (2023.01)
- H10D 64/23 (2025.01)
- H10D 64/27 (2025.01)

(52) U.S. Cl.
CPC ............ *H01L 23/473* (2013.01); *H01L 24/24* (2013.01); *H01L 24/29* (2013.01); *H01L 24/32* (2013.01); *H01L 24/73* (2013.01); *H01L 24/82* (2013.01); *H01L 24/97* (2013.01); *H01L 25/162* (2013.01); *H01L 2224/244* (2013.01); *H01L 2224/245* (2013.01); *H01L 2224/29111* (2013.01); *H01L 2224/29139* (2013.01); *H01L 2224/29147* (2013.01); *H01L 2224/32225* (2013.01); *H01L 2924/1033* (2013.01); *H01L 2924/10344* (2013.01); *H01L 2924/13064* (2013.01); *H10D 64/257* (2025.01); *H10D 64/519* (2025.01)

(58) Field of Classification Search
CPC .. H01L 25/0756; H01L 25/112; H01L 25/117; H01L 2224/08145; H01L 27/0688; H01L 23/3185; H01L 23/3157; H01L 21/56; H01L 21/563; H01L 23/5389; H01L 23/36; H01L 23/373; H01L 23/3735–3736; H01L 23/42; H01L 21/4871–4882; H01L 24/73; H01L 24/80; H01L 24/81; H01L 24/97; H01L 2224/29005–29009; H01L 2224/29022; H01L 2224/8034–80357; H01L 2224/8334; H01L 23/49827; H01L 23/5384; H01L 23/481; H01L 29/4175; H01L 2225/06541–06544; H01L 2225/06548; H01L 21/76898; H01L 21/486

See application file for complete search history.

(56) References Cited

U.S. PATENT DOCUMENTS

| | | | |
|---|---|---|---|
| 2007/0215999 A1* | 9/2007 | Kashimoto | H01L 21/565 257/E21.504 |
| 2010/0044845 A1* | 2/2010 | Funaya | H01L 25/16 257/E23.141 |
| 2011/0042797 A1* | 2/2011 | Park | H01L 21/563 257/E23.06 |
| 2013/0249075 A1 | 9/2013 | Tateiwa et al. | |
| 2015/0053474 A1* | 2/2015 | Nakashima | H05K 1/115 174/262 |
| 2016/0240471 A1* | 8/2016 | Klowak | H01L 23/49844 |
| 2016/0307826 A1 | 10/2016 | McKnight-MacNeil et al. | |
| 2017/0352603 A1* | 12/2017 | Ichiryu | H01L 21/4839 |
| 2020/0144209 A1* | 5/2020 | Aketa | H01L 24/13 |

FOREIGN PATENT DOCUMENTS

| | | |
|---|---|---|
| JP | 2015-119048 A | 6/2015 |
| JP | 2018-182043 A | 11/2018 |

OTHER PUBLICATIONS

Yamaguchi et al., U.S. Appl. No. 19/193,549, filed Apr. 29, 2025 (as-filed specification and drawings).

* cited by examiner

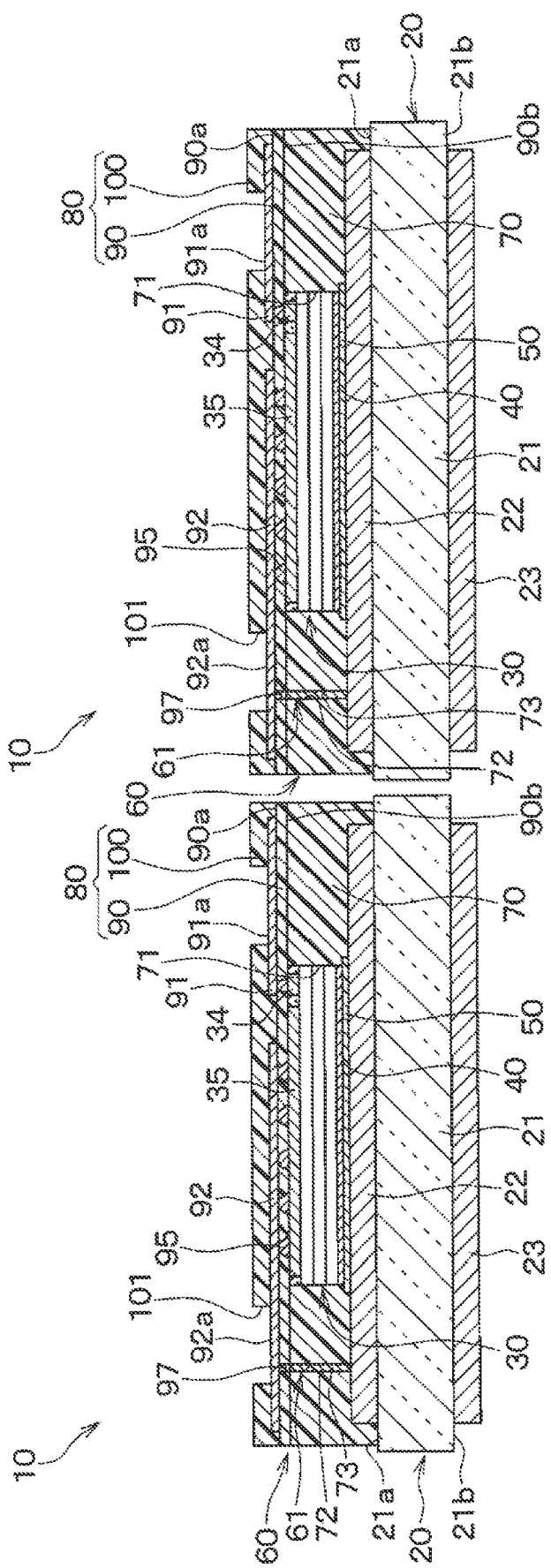

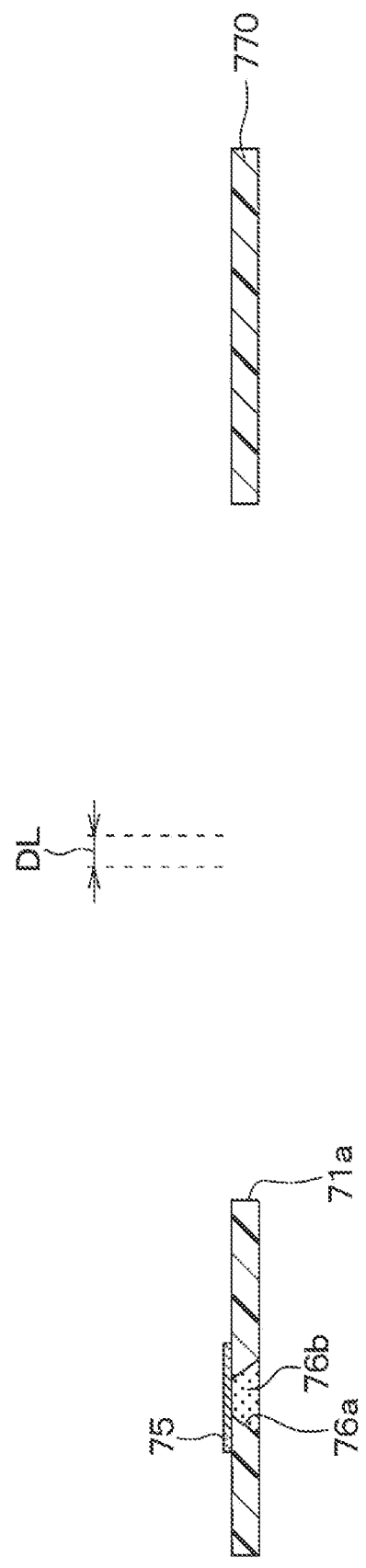

SEMICONDUCTOR PACKAGE, ELECTRONIC DEVICE, AND METHOD FOR MANUFACTURING SEMICONDUCTOR PACKAGE

CROSS REFERENCE TO RELATED APPLICATIONS

The present application is a continuation application of International Patent Application No. PCT/JP2020/026714 filed on Jul. 8, 2020, which designated the U.S. and claims the benefit of priority from Japanese Patent Application No. 2019-128693 filed on Jul. 10, 2019 and Japanese Patent Application No. 2020-113132 filed on Jun. 30, 2020. The entire disclosures of all of the above applications are incorporated herein by reference.

TECHNICAL FIELD

The present disclosure relates to a semiconductor package having a semiconductor chip sealed with a sealing member, an electronic device, and a method for manufacturing the semiconductor package.

BACKGROUND

In a semiconductor package, a semiconductor chip is generally sealed with a sealing member. The sealing member is, for example, made of a glass epoxy resin or the like.

SUMMARY

The present disclosure described a semiconductor package, an electronic device having the semiconductor package, and a method for manufacturing the semiconductor package. The semiconductor package includes a semiconductor chip, a heat radiating member on which the semiconductor chip is mounted, and a sealing member sealing the semiconductor chip. The sealing member is made of a liquid crystal polymer.

BRIEF DESCRIPTION OF DRAWINGS

Features and advantages of the present disclosure will become more apparent from the following detailed description made with reference to the accompanying drawings, in which:

FIG. 5G is a cross-sectional view showing a manufacturing process of the semiconductor package following FIG. 5F;

FIG. 8A is a cross-sectional view showing a manufacturing process of the semiconductor package according to the second embodiment;

DETAILED DESCRIPTION

Figure 1:
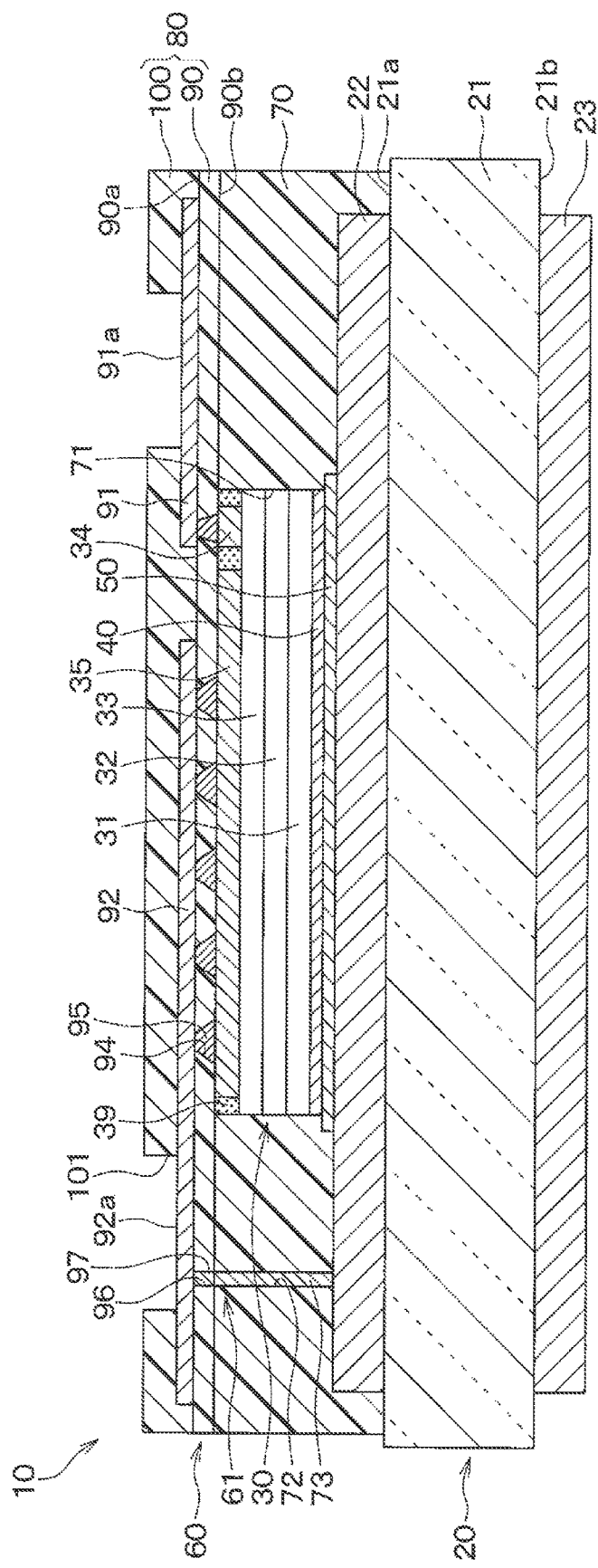
FIG. 1 is a cross-sectional view of a semiconductor package according to a first embodiment.

The inventors of the present disclosure have found that, when a semiconductor package in which a semiconductor chip is sealed with a sealing member made of glass epoxy resin is used on a vehicle, cracks are likely to be introduced into the sealing member, resulting in breakage. Namely, a semiconductor package for a vehicle needs to have durability.

The present disclosure provides a semiconductor package, an electronic device, and a method for manufacturing a semiconductor package, which are capable of suppressing breakage.

According to an aspect of the present disclosure, a semiconductor package includes a semiconductor chip, a heat radiating member on which the semiconductor chip is mounted, and a sealing member sealing the semiconductor chip, and the sealing member is made of a liquid crystal polymer.

According to the above aspect, the sealing member is made of a liquid crystal polymer. The liquid crystal polymer is a material having a higher material strength and being softer than a glass epoxy resin. Therefore, it is possible to suppress the introduction of cracks into the sealing member and restrict the semiconductor package from being broken.

According to an aspect of the present disclosure, an electronic device includes a semiconductor package, a cooler connected to a heat radiating member of the semiconductor package, and a mounting member electrically connected to a pad of the semiconductor package.

In this way, the electronic device can be configured using the semiconductor package. Since the electronic device has the cooler connected to the heat radiating member, the heat radiating property can further improve.

According to an aspect of the present disclosure, a method for manufacturing a semiconductor package includes: preparing a constituent substrate in which regions for constituting a plurality of heat radiating members are sectioned by a dicing line; preparing semiconductor chips having semiconductor elements; placing the semiconductor chips on the regions of the constituent substrate through a bonding member; placing a sealing constituent member accommodating the semiconductor chips; heating the constituent substrate and the semiconductor chips while pressurizing in a stacking direction of the constituent substrate and the semiconductor chips so as to form a sealing member encapsulating the semiconductor chips other than bonded portions of the semiconductor chips bonded with the bonding member and being bonded with the heat radiating members; and dividing the constituent substrate along the dicing line, in which the sealing constituent member is made of a liquid crystal polymer.

According to the method, a semiconductor package, which is capable of suppressing the introduction of cracks into the sealing member, is manufactured.

Hereinafter, embodiments of the present disclosure will be described with reference to the drawings. In the embodiments described below, same or equivalent parts are designated with the same reference numerals.

First Embodiment

Configurations of a semiconductor package 10 of a first embodiment will be described with reference to FIGS. 1 to 4D. The semiconductor package 10 of the present embodiment is preferably mounted on a vehicle and used for the vehicle.

As shown in FIGS. 1 to 4D, the semiconductor package 10 includes a heat radiating member 20, a semiconductor chip 30, a sealing member 60, and the like. The heat radiating member 20 has an insulating substrate 21 made of silicon nitride (SiN), aluminum nitride (ALN), or the like. The heat radiating member 20 has a first surface metal film 22 formed on a first surface 21a of the insulating substrate 21, and a second surface metal film 23 formed on a second surface 21b of the insulating substrate 21. In the present embodiment, the first surface metal film 22 and the second surface metal film 23 are made of copper and each have a thickness of about 10 to 100 μm. Further, the first surface metal film 22 and the second surface metal film 23 have the same planar shape and are symmetrically arranged with the insulating substrate 21 interposed therebetween.

Figure 2:
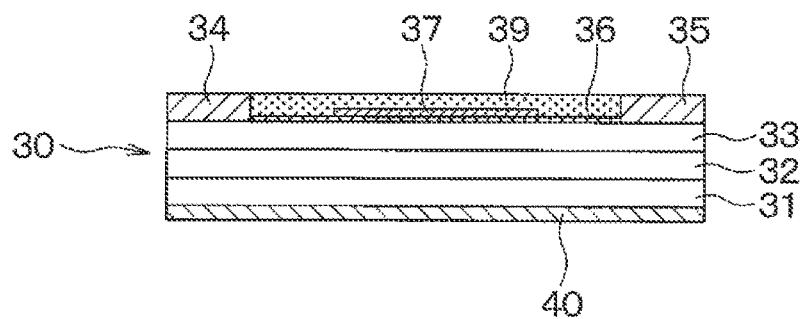
FIG. 2 is a cross-sectional view of a semiconductor chip of the semiconductor package shown in FIG. 1.
Figure 3:
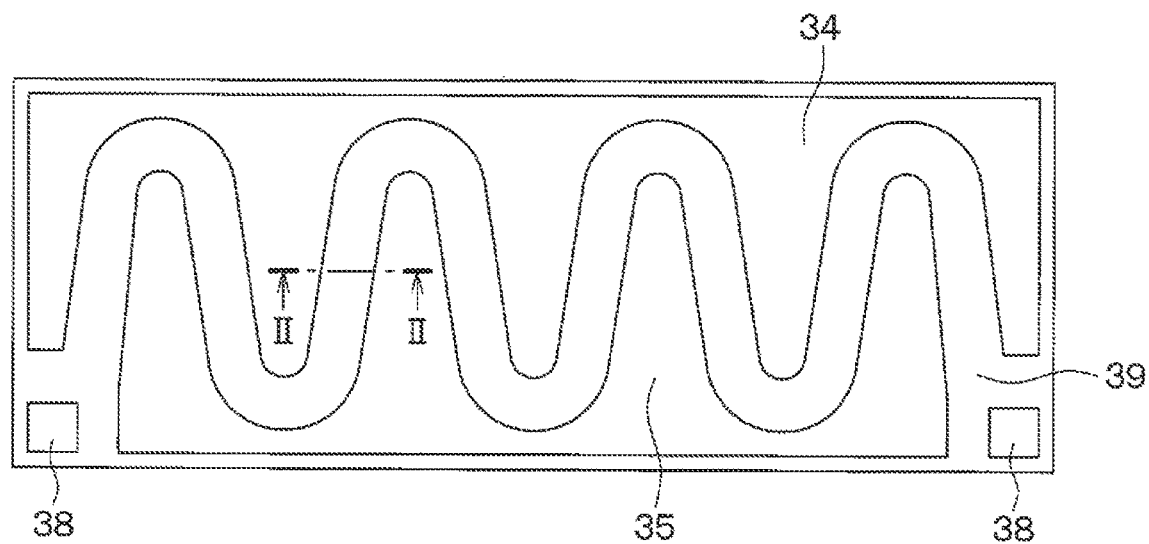
FIG. 3 is a plan view of the semiconductor chip shown in FIG. 1.

As shown in FIGS. 2 and 3, the semiconductor chip 30 is formed with a high electron mobility transistor using a two-dimensional electron gas (that is, 2DEG), in the present embodiment. Note that FIG. 2 corresponds to a cross section along the line II-II in FIG. 3.

Specifically, the semiconductor chip 30 has a support substrate 31, a buffer layer 32, and a semiconductor layer 33 stacked on top of another in the stated order. The semiconductor chip 30 has substantially a rectangular outer shape. The support substrate 31 is made of silicon, silicon carbide (hereinafter, also simply referred to as SiC) or the like. The semiconductor layer 33 is formed by a stack of epitaxial layers such as a gallium nitride (GaN) layer and an aluminum gallium nitride (AlGaN) layer, and a two-dimensional electron gas is generated inside.

A drain electrode 34 and a source electrode 35 are disposed on the surface of the semiconductor layer 33, and are separated from each other. In the present embodiment, the drain electrode 34 and the source electrode 35 are each formed in a comb-like shape, and are formed so that the comb teeth mesh with each other. In the present embodiment, the drain electrode 34 corresponds to a first electrode, and the source electrode 35 corresponds to a second electrode.

Further, on the surface of the semiconductor layer 33, an insulating film 36 is formed at a portion located between the drain electrode 34 and the source electrode 35. A gate wiring 37 is formed on the insulating film 36 at a position away from the drain electrode 34 and the source electrode 35. The gate wiring 37 is appropriately routed along an area located between the source electrode 35 and the drain electrode 34, and is connected to a gate electrode 38 arranged at the outer edge portion on the surface of the semiconductor layer 33. Although not particularly limited, the drain electrode 34, the source electrode 35, and the gate electrode 38 are made of, for example, copper. The gate wiring 37 is made of, for example, a metal such as aluminum, platinum, or copper, or a poly-semiconductor doped with impurities.

A protective film 39 is formed on the surface of the semiconductor layer 33 so as to cover the gate wiring 37 while exposing the drain electrode 34, the source electrode 35, and the gate electrode 38.

A back surface electrode 40 is formed on a surface of the support substrate 31 opposite to the semiconductor layer 33. The back surface electrode 40 is electrically connected to the source electrode 35, which will be described in detail later. As a result, the source electrode 35 and the support substrate 31 are electrically connected via the back surface electrode 40, and a current collapse is suppressed.

In the semiconductor chip 30, the on and off of the current flowing between the drain electrode 34 and the source electrode 35 via the two-dimensional electron gas is controlled by controlling the gate voltage applied to the gate wiring 37. That is, the semiconductor chip 30 of the present embodiment is provided with a horizontal semiconductor element that causes a current to flow in a planar direction of the semiconductor chip.

The semiconductor chip 30 of the present embodiment has the configuration as described above. With the above configuration, the semiconductor chip 30 has substantially the rectangular shape including a first surface side on which the source electrode 35 and the like are disposed, a second surface side on which the back surface electrode 40 is disposed, and a side surface connecting between the first surface side and the second surface side.

As shown in FIG. 1, the semiconductor chip 30 is arranged via the bonding member 50 on the first surface metal film 22 formed on the heat radiating member 20 so that the back surface electrode 40 faces the heat radiating member 20. The bonding member 50 is made of a conductive material. In the present embodiment, the bonding member 50 is provided by a sintered body containing silver tin (AgSn) as a main component. Therefore, the back surface electrode 40 is in a state of being electrically connected to the first surface metal film 22 via the bonding member 50. In a case where the bonding member 50 is made by mixing copper powder or the like having a higher thermal conductivity than silver tin, the thermal conductivity of the bonding member 50 is further increased.

In the present embodiment, the bonding member 50 is arranged so as to protrude from the semiconductor chip 30, when viewed in a stacking direction of the heat radiating member 20 and the semiconductor chip 30 (hereinafter, simply referred to as the stacking direction). In other words, the bonding member 50 is arranged so that the semiconductor chip 30 is located inside the bonding member 50, when viewed in the stacking direction. Thereby, for example, it is possible to suppress the concentration of stress on the end portion of the bonding surface between the semiconductor chip 30 and the bonding member 50, as compared with a case where the semiconductor chip 30 protrudes from the bonding member 50 in the stacking direction. As such, it is possible to suppress the occurrence of cracks on the bonding surface between the semiconductor chip 30 and the bonding member 50.

The sealing member 60 is arranged on the heat radiating member 20 so as to be bonded to the heat radiating member 20 while sealing portions of the semiconductor chip 30 excluding the portion bonded to the bonding member 50. That is, the sealing member 60 is arranged on the heat radiating member 20 so as to seal the first surface side and the side surface of the semiconductor chip 30. The sealing member 60 includes a side sealing part 70 that seals the side surface of the semiconductor chip 30, and a surface sealing part 80 that seals the first surface side of the semiconductor chip 30. The side sealing part 70 and the surface sealing part 80 are each made of a liquid crystal polymer (hereinafter, simply referred to as LCP). Note that the LCP is a material having higher material strength and being softer than glass epoxy resin. That is, the LCP is a material in which cracks are less likely to be introduced than glass epoxy resin.

Figure 4A:
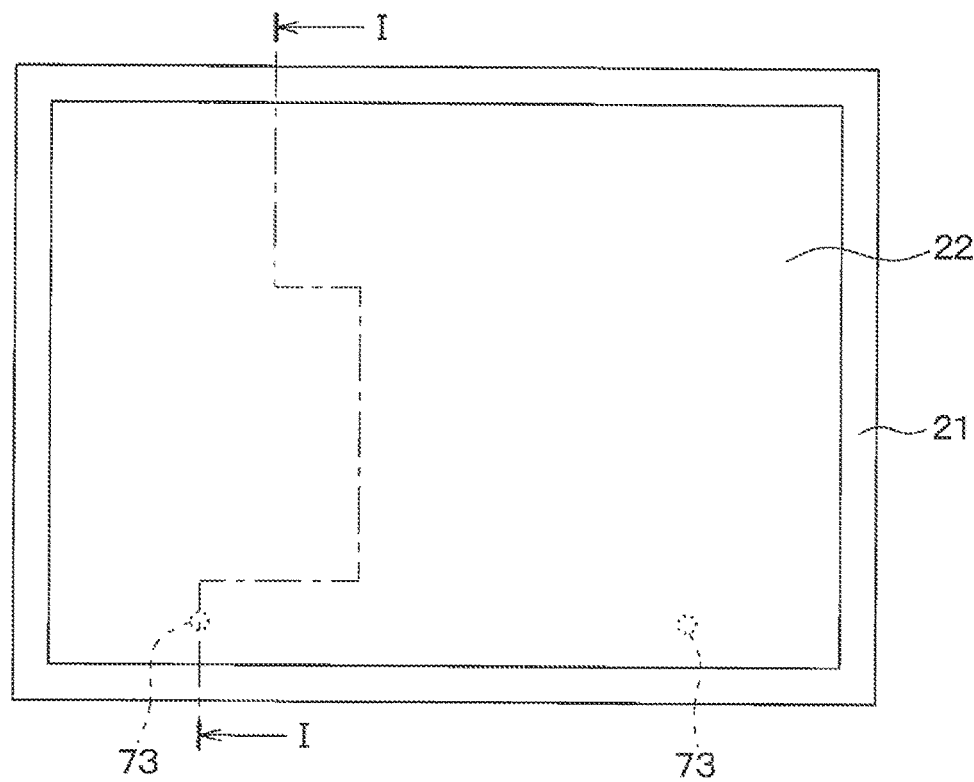
FIG. 4A is a plan view of a heat radiating member of the semiconductor package shown in FIG. 1, when viewed from one side of the heat radiating member.
Figure 4B:
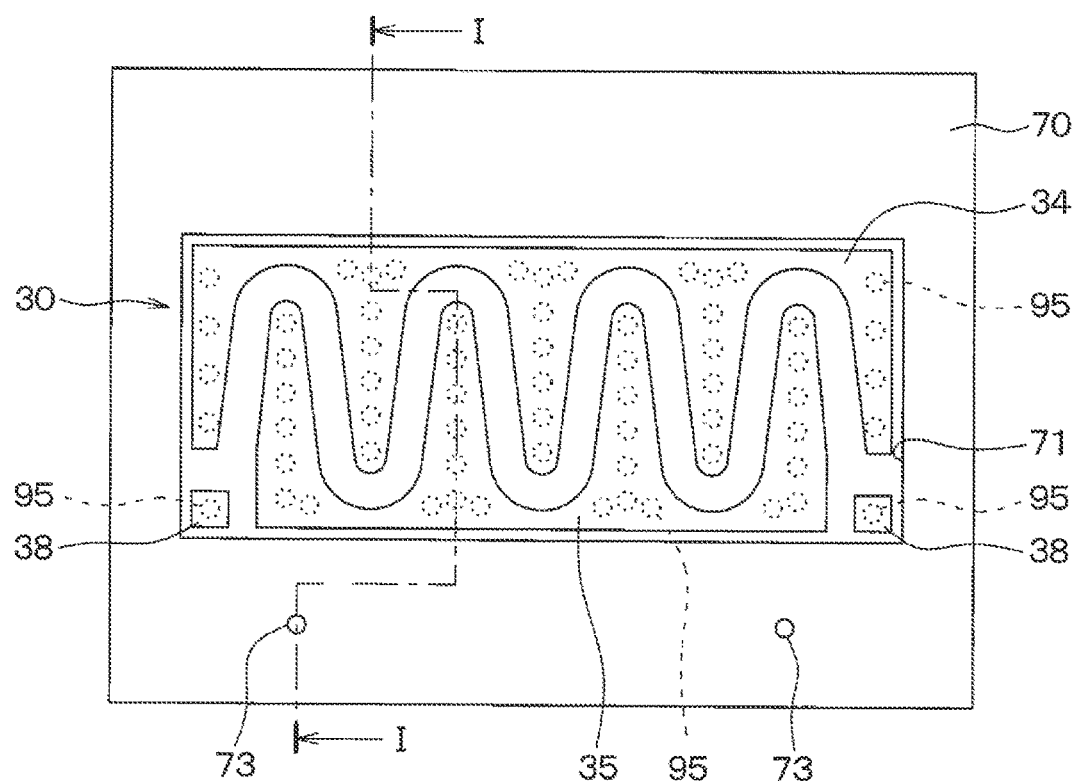
FIG. 4B is a plan view of a semiconductor chip and a side sealing part of the semiconductor package shown in FIG. 1, when viewed from one side of the heat radiating member.

In the present embodiment, the side sealing part 70 is an injection-molded product formed by injection molding, and has a substantially rectangular shape. The side sealing part 70 is arranged on the heat radiating member 20 so as to be joined to the heat radiating member 20 while sealing the side surface of the semiconductor chip 30. Specifically, as shown in FIGS. 1 and 4B, the side sealing part 70 is formed with a first through hole 71 penetrating in the stacking direction, and the semiconductor chip 30 and the bonding member 50 are disposed in the first through hole 71. The first through hole 71 is formed so as to expose substantially a central portion of the first surface metal film 22.

The side sealing part 70 is further formed with a second through hole 72 so as to expose the outer edge portion of the first surface metal film 22. A lower connecting via 73 connecting to the first surface metal film 22 is disposed in the second through hole 72. The lower connecting via 73 is provided by a sintered body containing silver tin as a main component, and is also connected to an upper connecting via 97, which will be described later. In a case where the lower connecting via 73 is made by mixing copper powder or the like having a higher thermal conductivity than silver tin, the thermal conductivity of the lower connecting via 73 is further increased. In FIG. 4A, the lower connecting via 73 connecting to the first surface metal film 22 is shown by a dotted line. In the similar figures described later, the lower connecting via 73 connecting to the first surface metal film 22 is also shown by a dotted line. Further, in the present embodiment, the lower connecting via 73 is arranged in a columnar shape.

Figure 4C:
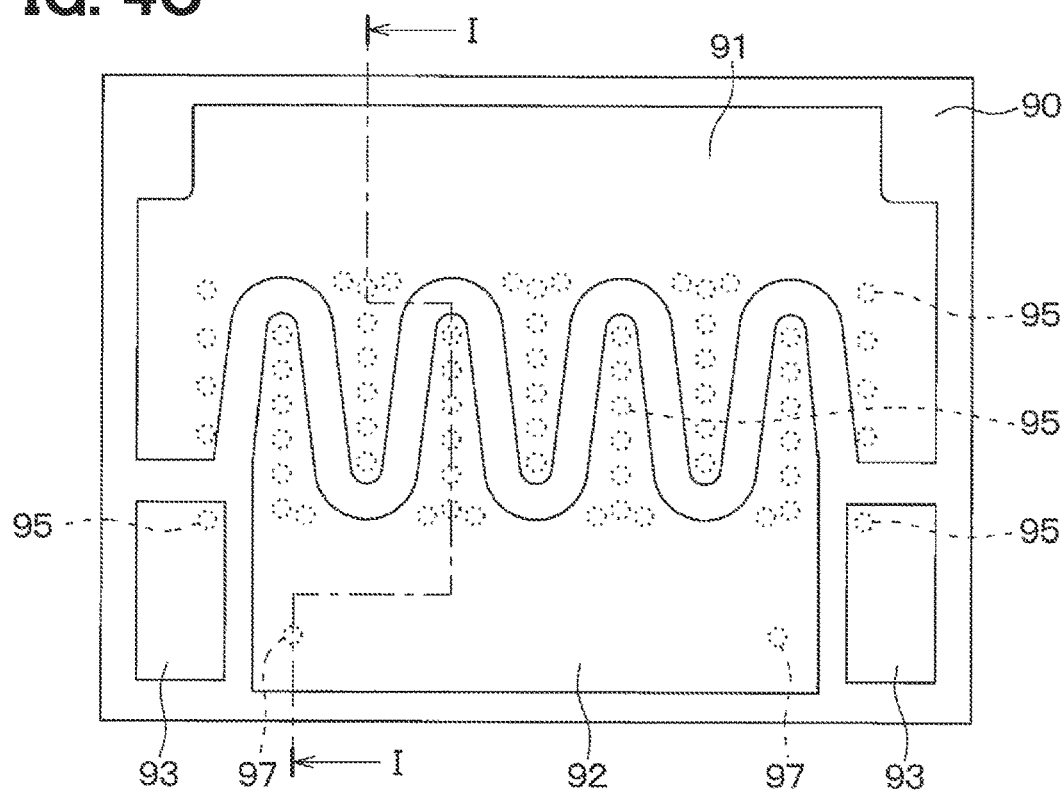
FIG. 4C is a plan view of a first sealing member of the semiconductor package shown in FIG. 1, when viewed from one side of the heat radiating member.

As shown in FIGS. 1 and 4C, the surface sealing part 80 is provided by a stack of film-shaped first sealing member 90 and second sealing member 100. The first sealing member 90 is made of an LCP film having a first surface 90a and a second surface 90b. The first sealing member 90 has a plurality of patterns 91 to 93 formed of copper foil or the like on the first surface 90a side. The first sealing member 90 is formed with through holes 94 and 96 for exposing the pattern 91 to 93 on the second surface 90b side. Upper connecting vias 95 and 97 are arranged in the through holes 94 and 96. The upper connecting vias 95 and 97 are each made of a sintered body containing silver tin as a main component. In a case where the upper connecting via 97 is made by mixing copper powder or the like having a higher thermal conductivity than silver tin, the thermal conductivity of the upper connecting via 97 is further increased.

Specifically, on the first surface 90a of the first sealing member 90, a drain pattern 91 having a shape corresponding to the drain electrode 34 is formed at a position facing the drain electrode 34 of the semiconductor chip 30. On the first surface 90a of the first sealing member 90, a source pattern 92 having a shape corresponding to the source electrode 35 is formed at a position facing the source electrode 35 of the semiconductor chip 30. On the first surface 90a of the first sealing member 90, a gate pattern 93 having a shape corresponding to the gate electrode 38 is formed at a position facing the gate electrode 38 of the semiconductor chip 30. In the present embodiment, the drain pattern 91 corresponds to a first pattern, and the source pattern 92 corresponds to a second pattern.

The through holes 94 are formed at a position between the drain pattern 91 and the drain electrode 34, a position between the source pattern 92 and the source electrode 35, and a position between the gate pattern 93 and the gate electrode 38. The upper connecting via 95 is arranged in each of the through holes 94. As a result, the source pattern 92, the drain pattern 91, and the gate pattern 93 are electrically connected to the source electrode, the drain electrode 34, and the gate electrode 38 via the upper connecting vias 95, respectively.

In the present embodiment, a plurality of the upper connecting vias 95 connecting the drain pattern 91 and the drain electrode 34 and a plurality of the upper connecting vias 95 connecting the source pattern 92 and the source electrode 35 are formed. As a result, the inductance can be reduced and the speed of switching operation can be increased.

Each of the pattern 91 to 93 is formed of, for example, a copper foil. In this case, each of the pattern 91 to 93 preferably has a thickness of about 18 μm or less so that the thermal expansion of the pattern 93 in the thickness direction does not increase.

The through hole 96 is formed at a position connecting the source pattern 92 and the second through hole 72 of the side sealing part 70. The upper connecting via 97 is arranged in the through hole 96, and is electrically connected to the lower connecting via 73 of the side sealing part 70 and the source pattern 92. As a result, in the present embodiment, the source electrode 35 of the semiconductor chip 30 is electrically connected to the back surface electrode 40 via the upper connecting vias 95, the source pattern 92, the upper connecting via 97, the lower connecting via 73, and the first surface metal film 22.

In FIGS. 4B and 4C, the upper connecting vias 95 and 97 are shown by dotted lines. In the similar figures described later, the upper connecting vias 95 and 97 are shown by the dotted lines. In the present embodiment, the upper connecting via 95 is formed in a columnar shape. Hereinafter, the lower connecting via 73 formed in the side sealing part 70 and the upper connecting via 97 connected to the lower connecting via 73 are collectively referred to as a connecting via 61 formed in the sealing member 60. That is, in the present embodiment, the connecting via 61 formed in the sealing member 60 is arranged so as to connect the source pattern 92 and the first surface metal film 22, and has a columnar shape.

Figure 4D:
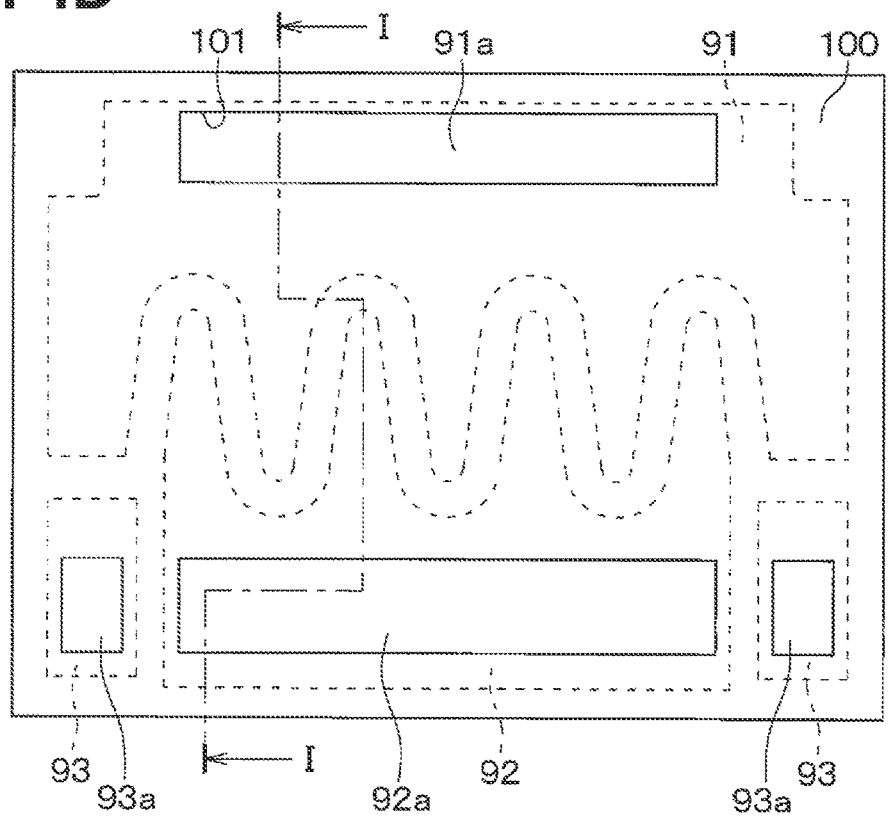
FIG. 4D is a plan view of the first sealing member and a second sealing member of the semiconductor package shown in FIG. 1, when viewed from one side of the heat radiating member.

As shown in FIGS. 1 and 4D, the second sealing member 100 is made of an LCP film and is arranged on the first sealing member 90. The second sealing member 100 is formed with contact holes 101 that expose the patterns 91 to 93. As a result, a drain pad 91a is formed by a portion of the drain pattern 91 exposed from the contact hole 101. A source pad 92a is formed by a portion of the source pattern 92 exposed from the contact hole 101. A gate pad 93a is formed by a portion of the gate pattern 93 exposed from the contact hole 101. Although not particularly limited, the thickness of each of the patterns 91 to 93 is, for example, 18 μm or less.

In the present embodiment, the contact holes 101 are formed at the positions different from the semiconductor chip 30 in the stacking direction. That is, the pads 91a, 92a, and 93a are formed at the positions different from the semiconductor chip 30 in the stacking direction. In other words, the pads 91a, 92a, and 93a are formed so as not to overlap the semiconductor chip 30 in the stacking direction. As a result, when a printed circuit board or the like is mounted on the pads 91a, 92a, 93a via solder or the like, the stress applied to the semiconductor chip 30 can be reduced, and the semiconductor chip 30 can be suppressed from being broken. It should be noted that such a configuration can be appropriately applied in each of embodiments described later.

The second sealing member 100 is pressurized and integrated with the first sealing member 90 and the like, as will be described later. Therefore, the second sealing member 100 is also in a state of being inserted between the drain pattern 91 and the source pattern 92 formed in the first sealing member 90. As a result, the second sealing member 100 can exhibit a function as a solder resist and also a function of increasing the insulation creepage distance between the drain pattern 91 and the source pattern 92.

The sealing member 60 of the present embodiment has the configuration as described above. The sealing member 60 is arranged so as to be located inside the heat radiating member 20 in the stacking direction, that is, when viewed in the stacking direction. That is, the heat radiating member 20 has a size in which the sealing member 60 is located in the heat radiating member 20 in the stacking direction. Thus, the outer edge portion of the first surface 21a of the insulating substrate 21 (that is, the heat radiating member 20) is exposed from the sealing member 60. As a result, it is possible to suppress stress from concentrating on the end portion of the bonding surface between the sealing member 60 and the heat radiating member 20. Therefore, it is possible to suppress the occurrence of cracks on the bonding surface between the sealing member 60 and the heat radiating member 20, and it is possible to restrict the sealing member 60 from peeling off from the heat radiating member 20.

In the present embodiment, respective members are chemically bonded with active groups being bonded to each other, more specifically, covalently bonded (i.e., molecularly bonded) so as to enhance the adhesion. In the present embodiment, the heat radiating member 20 is subjected to ultraviolet treatment or atmospheric pressure plasma treatment after surface cleaning such as ethanol cleaning so as to improve the adhesion between the heat radiating member 20 and the sealing member 60. Thereafter, an alkaline solution containing a silicate is applied so as to form the active groups in the heat radiating member 20.

Further, in order to improve adhesion of the peripheral region of the semiconductor chip 30, the drain electrode 34, the source electrode 35, the gate electrode 38 and the like with the sealing member 60, the drain electrode 34 and the like are subjected to a surface-cleaning by ethanol cleaning or the like and then an oxide removal by etching with dilute sulfuric acid or the like. Thereafter, by applying an aqueous solution of an organic compound containing a silanol group and an amino group, the active groups are formed on the drain electrode 34 and the like. The peripheral region includes peripheries of the drain electrode 34, the source electrode 35, and the gate electrode 38, and side surfaces of the substrate formed by the stack of the support substrate 31, the buffer layer 32, and the semiconductor layer 33. Since the drain electrode 34, the source electrode 35, the gate electrode 38, and the like are portions connected to the upper connecting vias 95 described later, the active groups may not be formed in these portions. That is, the active groups may be formed only in portions of the semiconductor chip 30 other than the portions where the drain electrode 34, the source electrode 35, and the gate electrode 38 are formed.

Further, the side sealing part 70, the first sealing member 90 and the second sealing member 100 are subjected to a surface cleaning such as cleaning with ethanol, and then to an ultraviolet treatment or atmospheric plasma treatment, so as to improve adhesion between the side sealing part 70 and the first sealing member 90 and between the first sealing member 90 and the second sealing member 100. Thereafter, by applying an aqueous solution of an organic compound having a silanol group and an amino group, active groups are formed on the side sealing part 70, the first sealing member 90 and the second sealing member 100.

The semiconductor package 10 of the present embodiment has the configuration as described above. Next, a method for manufacturing the semiconductor package 10 will be described with reference to FIGS. 5A to 5G and FIG. 6. FIGS. 5A to 5G are diagrams showing a process of manufacturing two adjacent semiconductor packages 10. Actually, a plurality of semiconductor packages 10 more than two are manufactured in the same process, as shown in FIG. 6. Further, when preparing each member in the following steps, a process for forming an active group is appropriately performed.

Figure 5A:
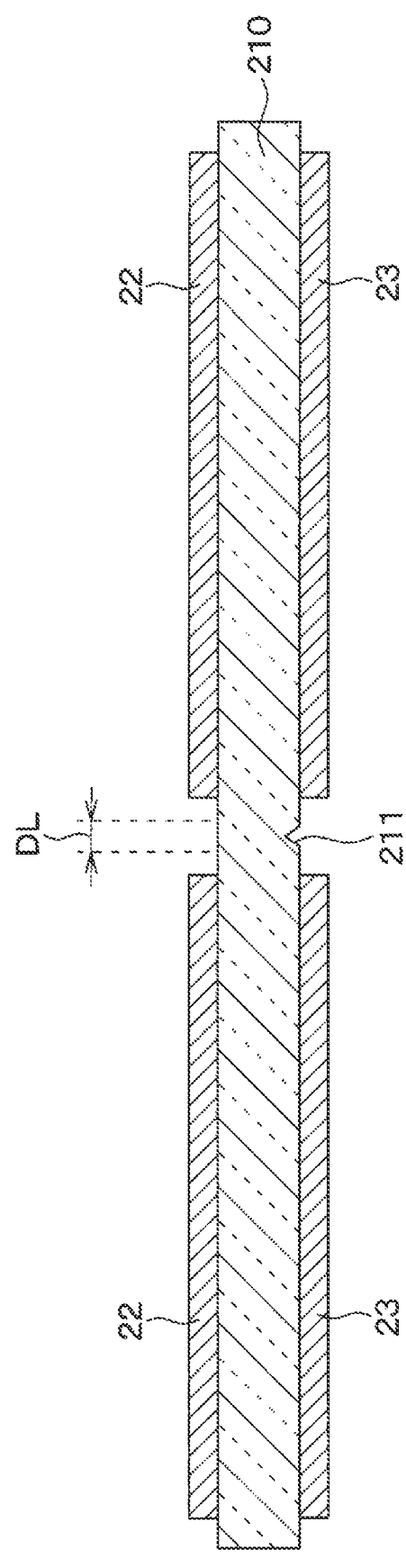
FIG. 5A is a cross-sectional view showing a manufacturing process of the semiconductor package shown in FIG. 1.
Figure 6:
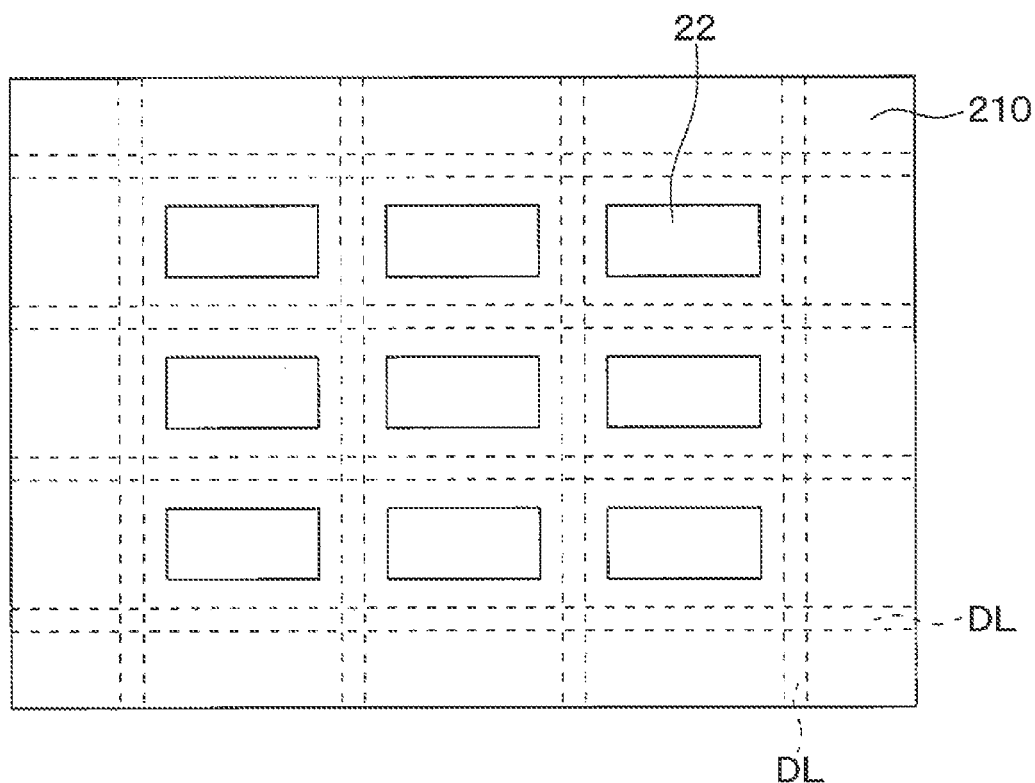
FIG. 6 is a plan view of a constituent substrate.

First, as shown in FIGS. 5A and 6, a constituent substrate 210, which is a continuous substrate in which the insulating substrates 21 are integrated through a dicing line DL, is prepared. Then, a first surface metal film 22 and a second surface metal film 23 are formed in the portion of the constituent substrate 210 that becomes the insulating substrate 21.

Further, a groove portion 211 is formed on a surface of the constituent substrate 210 on the side on which the second surface metal film 23 is formed. The groove portion 211 is formed at a position corresponding to the dicing line DL and along the dicing line DL. In this case, the groove portion 211 has a depth of about 0.1 t to 0.5 t, where t is the thickness of the constituent substrate 210. In this case, it is described an example in which the groove portion 211 is formed on the surface of the constituent substrate 210 on the side on which the second surface metal film 23 is formed. However, the groove portion 211 may be formed on a surface of the constituent substrate 210 on which the first surface metal film 22 is formed. Alternatively, the groove portion 211 may be formed on the surface on which the first surface metal film 22 is formed and on the surface on which the second surface metal film 23 is formed, in the constituent substrate 210.

Figure 5B:
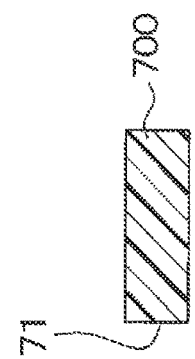
FIG. 5B is a cross-sectional view showing a manufacturing process of the semiconductor package following FIG. 5A.
Figure 5B:
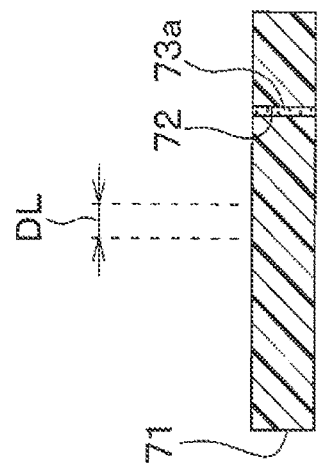
Figure 5B:
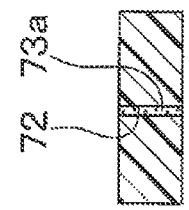

Then, as shown in FIG. 5B, a side constituent member 700 in which side sealing parts 70 are integrated through the dicing line DL is prepared. Next, a first through hole 71 and a second through hole 72 are formed in a portion of the side constituent member 700 that becomes the side sealing part 70. Thereafter, for example, a sintered body 73a for constituting a lower connecting via 73 is arranged in the second through hole 72, such as by press fitting or the like. In this case, a conductive paste for constituting the lower connecting via 73 may be arranged in the second through hole 72 by a printing method or the like. As the sintered body 73a arranged by press fitting or the like, for example, a sintered body containing silver tin as a main component is used. As the conductive paste arranged by the printing method, a paste provided by mixing a powder containing silver tin as a main component with an organic solvent is used.

Figure 5C:
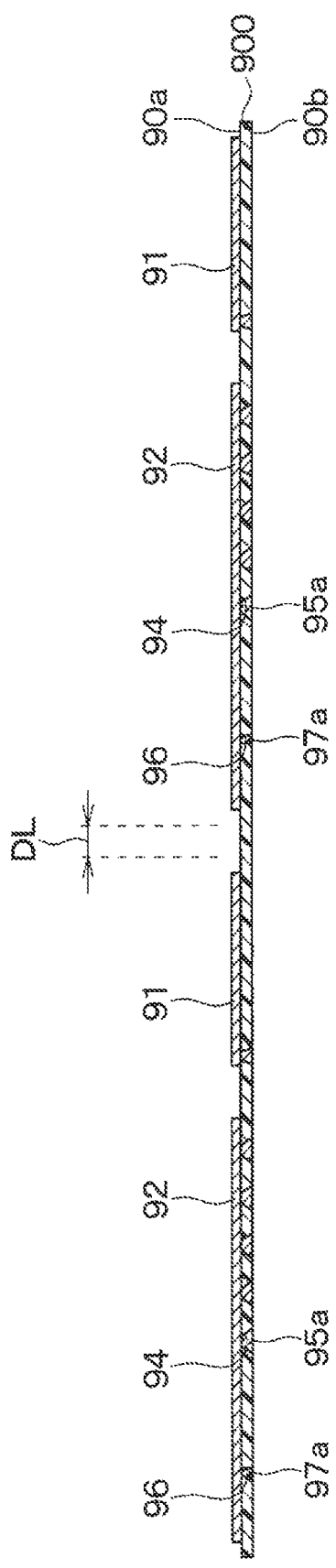
FIG. 5C is a cross-sectional view showing a manufacturing process of the semiconductor package following FIG. 5B.

Similarly, as shown in FIG. 5C, a first constituent member 900 in which first sealing members 90 are integrated through the dicing line DL is prepared. Then, a drain pattern 91 and a source pattern 92 are formed on portions of the first constituent member 900 that becomes the first sealing member 90. Further, in a cross section different from that of FIG. 5C, a gate pattern 93 is formed in a portion of the first constituent member 900 that becomes the first sealing member 90. Then, through holes 94 and 96 are formed in portions of the first constituent member 900 that become the first sealing member 90 by a laser or the like, and sintered bodies 95a and 97a for constituting upper connecting vias 95 and 97 are formed in the through holes 94 and 96 by press fitting or the like. In this case, a conductive paste for constituting the upper connecting vias 95 and 97 may be arranged in the through holes 94 and 96 by a printing method or the like. As the sintered bodies 95a and 97a arranged by press fitting or the like, for example, a sintered body containing silver tin as a main component is used. As the conductive paste arranged by the printing method, a paste provided by mixing a powder containing silver tin as a main component with an organic solvent is used.

Figure 5D:
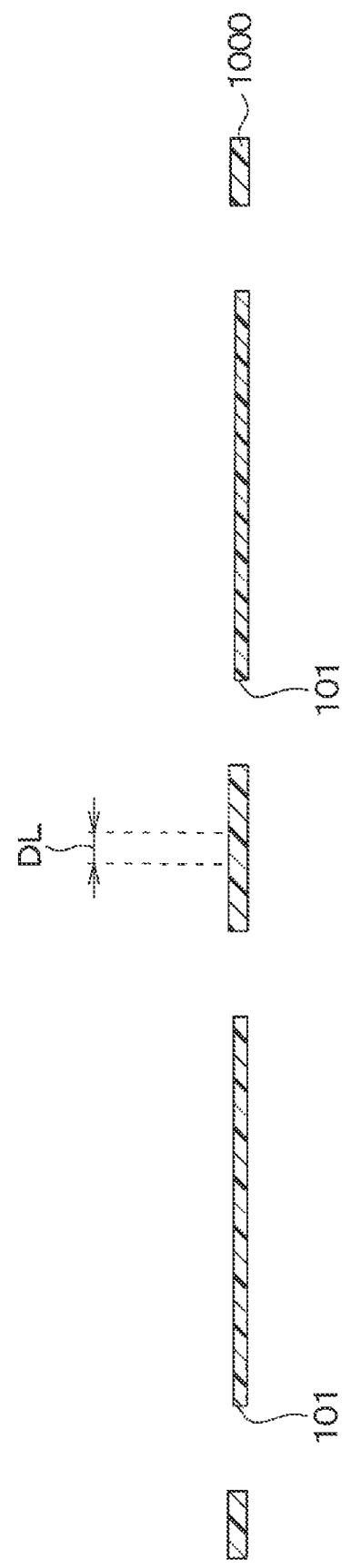
FIG. 5D is a cross-sectional view showing a manufacturing process of the semiconductor package following FIG. 5C.

Further, as shown in FIG. 5D, a second constituent member 1000 in which second sealing members 100 are integrated through the dicing line DL is prepared. Then, a contact hole 101 is formed in a portion of the second constituent member 1000 that becomes the second sealing member 100.

Figure 5E:
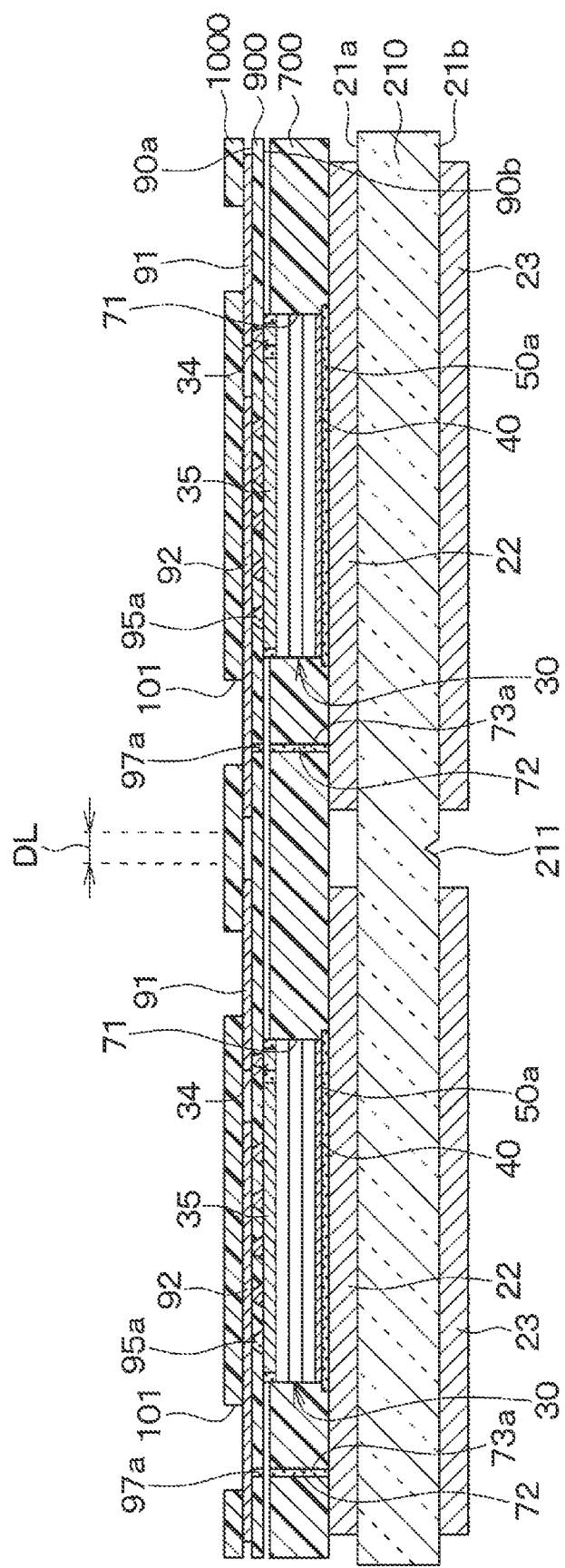
FIG. 5E is a cross-sectional view showing a manufacturing process of the semiconductor package following FIG. 5D.

Subsequently, as shown in FIG. 5E, the side constituent member 700 is arranged on the constituent substrate 210, and the semiconductor chip 30 is arranged in the first through hole 71 via a sintered body 50a constituting a bonding member 50. In this case, a conductive paste for constituting the bonding member 50 may be arranged in the first through hole 71 by a printing method or the like. Then, the first constituent ember 900 and the second constituent member 1000 are sequentially stacked on the side constituent member 700 and the semiconductor chip 30. That is, the side constituent member 700, the first constituent member 900, and the second constituent member 1000 are arranged on the constituent substrate 210 so as to accommodate the semiconductor chip 30. In the present embodiment, the side constituent member 700, the first constituent member 900, and the second constituent member 1000 correspond to a sealing constituent member. Further, as the sintered body 50a, for example, a sintered body containing silver tin as a main component is used. As the conductive paste arranged by the printing method, the paste provided by mixing a powder containing silver tin as a main component with an organic solvent is used.

Figure 5F:
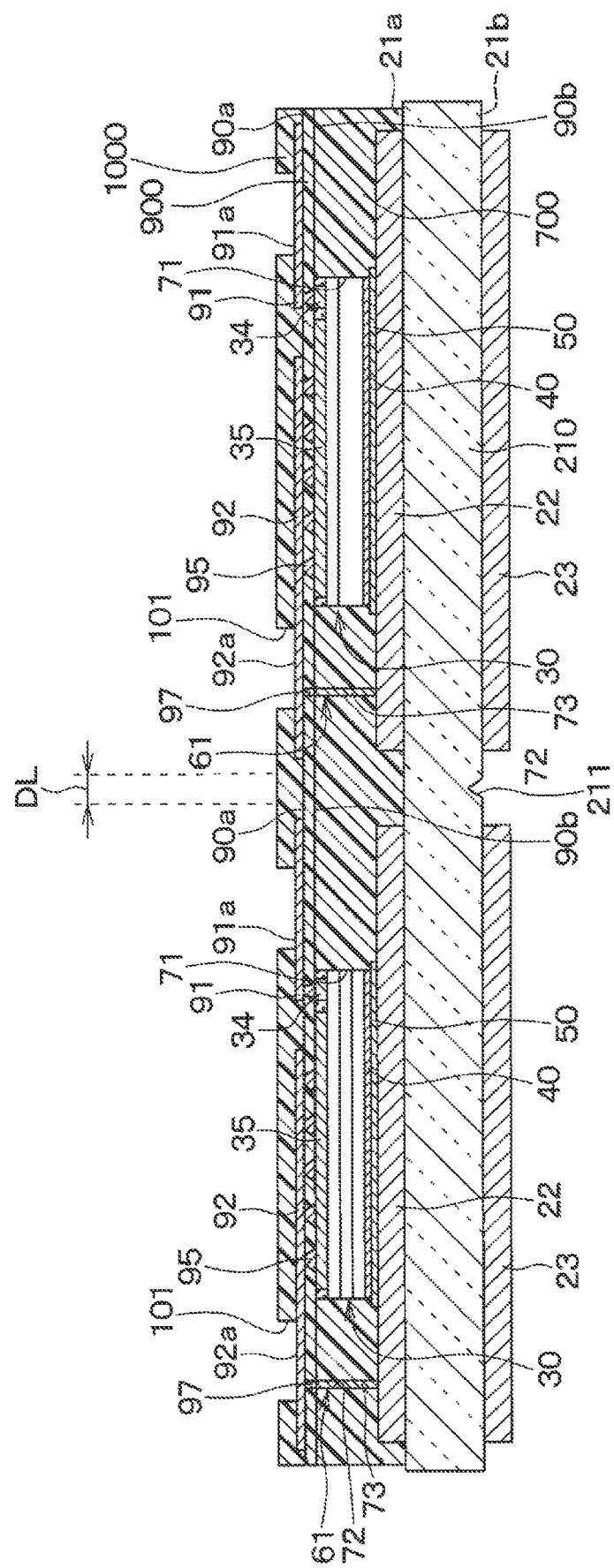
FIG. 5F is a cross-sectional view showing a manufacturing process of the semiconductor package following FIG. 5E.

Then, as shown in FIG. 5F, the constituent substrate 210, the side constituent member 700, the semiconductor chip 30, the first constituent member 900, and the second constituent member 1000 are integrated by applying pressure in the stacking direction while heating. At this time, the bonding member 50, the lower connecting via 73, and the upper connecting vias 95 and 97 are formed from the sintered bodies 50a, 73a, 95a, and 97a. Similarly, when the conductive paste is arranged, the bonding member 50, the lower connecting via 73, and the upper connecting vias 95 and 97 are formed from respective conductive pastes.

Then, as shown in FIG. 5G, the above body is divided into chips along the dicing line DL. In the present embodiment, since the groove portion 211 is formed in the constituent substrate 210, dicing can be easily performed. Then, the outer edge portion of the sealing member 60 is removed by a laser or the like so that the outer edge portion of the first surface 21a of the insulating substrate 21 is exposed from the sealing member 60. In this way, the semiconductor package 10 shown in FIG. 1 is manufactured.

In the present embodiment, as described above, the sealing member 60 is made of the LCP, and the LCP is a material having higher material strength and being softer than the glass epoxy resin. Therefore, it is possible to suppress the introduction of cracks into the sealing member 60 and the destruction of the semiconductor package 10.

The semiconductor package 10 is bonded by chemical bonding in which active groups are bonded to each other at the interface between the heat radiating member 20 and the sealing member 60. Specifically, the interface between the heat radiating member 20 and the sealing member 60 is covalently bonded. Therefore, it is possible to suppress the occurrence of peeling at the interface between the heat radiating member 20 and the sealing member 60. Further, the interface between the semiconductor chip 30 and the sealing member 60 is bonded by chemical bonding. Therefore, it is possible to suppress the occurrence of peeling at the interface between the semiconductor chip 30 and the sealing member 60. Further, since the interface between the semiconductor chip 30 and the sealing member 60 is bonded by chemical bonding, the bondability between the semiconductor chip 30 and the sealing member 60 can be improved. Therefore, it is possible to reduce the area where the semiconductor chip 30 and the sealing member 60 are bonded. In particular, in a case where the support substrate 31 of the semiconductor chip 30 is made of SiC, the cost tends to be higher than that of the case where the support substrate 31 is made of silicon. Therefore, the size of the semiconductor chip 30 can be reduced by reducing the area where the semiconductor chip 30 and the sealing member 60 are bonded to each other, hence the costs can be reduced by reducing the size of the semiconductor chip 30.

The bonding member 50 is arranged so that the semiconductor chip 30 is located within the bonding member 50 when viewed in the stacking direction. Therefore, it is possible to suppress the concentration of stress on the end portion of the bonding surface between the semiconductor chip 30 and the bonding member 50, as compared with the case, for example, where the semiconductor chip 30 protrudes from the bonding member 50 when viewed in the stacking direction. Therefore, it is possible to suppress the occurrence of cracks on the bonding surface between the semiconductor chip 30 and the bonding member 50.

Further, the heat radiating member 20 has a size such that the sealing member 60 is located within the heat radiating member 20 when viewed in the stacking direction. Therefore, it is possible to suppress stress from concentrating on the end portion of the bonding surface between the sealing member 60 and the heat radiating member 20. Therefore, it is possible to suppress the occurrence of cracks on the bonding surface between the sealing member 60 and the heat radiating member 20, and it is possible to suppress the sealing member 60 from peeling off from the heat radiating member 20.

Further, since the side sealing part 70 is provided of an injection molded product, mass production can be easily realized.

Further, the LCP constituting the second sealing member 100 is arranged between the drain pattern 91 and the source pattern 92. Therefore, the second sealing member 100 can exhibit a function as a solder resist, and also can exhibit a function of increasing the insulation creepage distance between the drain pattern 91 and the source pattern 92.

In the present embodiment, the source electrode 35 of the semiconductor chip 30 is electrically connected to the back surface electrode 40. Therefore, the current collapse can be reduced.

Further, the heat radiating member 20 is configured to have the first surface metal film 22 and the second surface metal film 23 on the insulating substrate 21. Therefore, it is possible to suppress the heat radiating member 20 from being deformed. In the present embodiment, in this case, the first surface metal film 22 and the second surface metal film 23 have the same shape and are symmetrically formed with respect to the insulating substrate 21 on opposite sides of the insulating substrate 21. Therefore, it is possible to further suppress the deformation of the heat radiating member 20.

When the semiconductor package 10 is manufactured, the groove portion 211 is formed in the constituent substrate 210. Therefore, dicing can be easily performed. In the present embodiment, then example in which the groove portion 211 is formed before integrating the constituent substrate 210 and the side constituent member 700 or the like is described hereinabove. Alternatively, the groove portion 211 may be formed after the constituent substrate 210 and the side constituent member 700 or the like are integrated. That is, the groove portion 211 may be formed on the constituent substrate 210 before being divided into chips along the dicing line DL.

Second Embodiment

A second embodiment will be described hereinafter. In the present embodiment, the configuration of the side sealing part 70 is modified from that of the first embodiment. Other configurations are the same as those of the first embodiment, and therefore the descriptions of the same configurations will be omitted.

Figure 7:
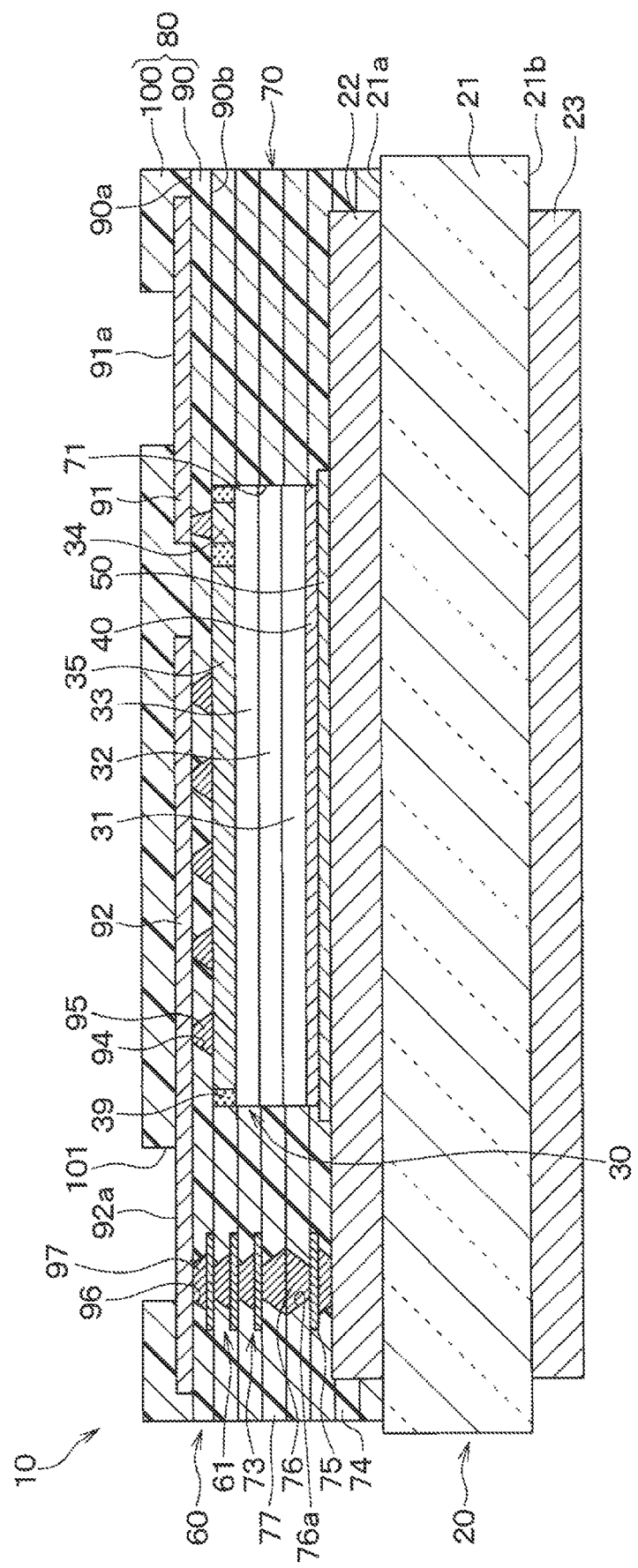
FIG. 7 is a cross-sectional view of a semiconductor package according to a second embodiment.

As shown in FIG. 7, in the semiconductor package 10 of the present embodiment, the side sealing part 70 is formed by a stack of plate-shaped members 74 made of LCP films and integrated in layers. The plate-shaped member 74 is configured to have an LCP film 77, a pattern 75 formed on the LCP film 77, and a connecting via 76 arranged in a through hole 76a. That is, in the present embodiment, the plate-shaped members 74 constituting the side sealing part 70 and the first and second sealing members 90 and 100 have similar configurations to each other in which the patterns 75, 91 to 93 and the vias 73, 95, and 97 are appropriately formed in the respective LCP films 77. The lower connecting via 73 is configured by connecting the patterns 75 and the connecting vias 76 formed in the respective plate-shaped members 74. That is, the connecting via 61 is made of the upper connecting via 97 and the lower connecting via 73 made of the patterns 75 and the connecting vias 76 formed in the respective plate-shaped members 74.

The semiconductor chip 30 of the present embodiment is formed with a horizontal semiconductor element. The pattern 75 formed on each plate-shaped member 74 does not serve as a portion that allows an electric current to flow. Therefore, the pattern 75 formed on each plate-shaped member 74 may be thinner than the patterns 91 to 93 formed in the first sealing member 90, and is, for example, 12 µm or less. As a result, the quantity of materials constituting the pattern 75 can be reduced.

In the present embodiment, the connecting vias 76 of the plate-shaped members 74 adjacent to each other in the stacking direction are electrically connected via the pattern 75. Therefore, the connecting vias 76 of the plate-shaped members 74 may be arranged so as to overlap with each other in the stacking direction, or may be arranged so as not to overlap with each other in the stacking direction.

Also in the present embodiment, it is preferable that the adjacent plate-shaped members 74 are bonded by chemical bonding in which the active groups are bonded to each other. In this case, for example, the active group may be only formed in the pattern 75 and the via 76. According to this, it is possible to reduce the cost as compared with the case where the active group is formed on the whole of each plate-shaped member 74.

The side sealing part 70 is manufactured by stacking the plate-shaped members 74 and then by applying pressure while heating. That is, in the present embodiment, in the process of FIG. 5B, a plate-shaped member constituent member 770 in which the LCP films 77 are integrated through the dicing line DL is prepared, as shown in FIG. 8A. The number of plate-shaped member constituent members 770 prepared corresponds to the number of layers for forming the side sealing part 70. In this case, the number of plate-shaped member constituent members 770 is preferably set such that the total thickness of the plate-shaped member constituent members 770 is larger than the thickness of the semiconductor chip 30. As a result, it is possible to improve the quality after molding in the step of pressurizing while heating in FIG. 5F and later, which will be described later. Further, the preparing the first constituent member 900 and the second constituent member 1000 in the first embodiment is similar to the preparing the plate-shaped member constituent member 770 on the point that the plate-shaped member 74 in which the LCP films 77 are integrated through the dicing line DL.

Then, a through hole 71a corresponding to the first through hole 71 and a through hole 76a are formed in the plate-shaped member constituent member 770, and a constituent body 76b constituting the connecting via 76 is arranged in the through hole 76a. As the constituent body 76b, a conductive paste, a sintered body, or the like is used.

Figure 8B:
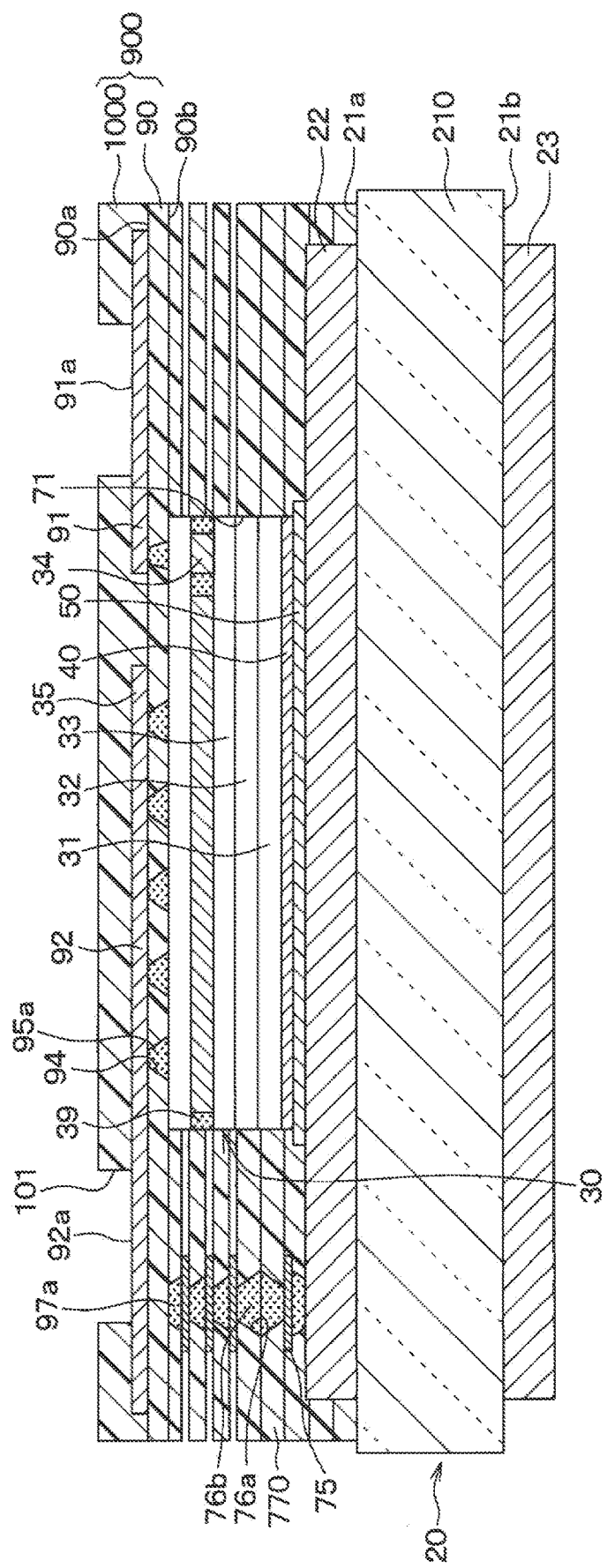
FIG. 8B is a cross-sectional view showing a manufacturing process of the semiconductor package according to the second embodiment.

Then, in the process of FIG. 5E, the plate-shaped member constituent members 770 are sequentially stacked on the constituent substrate 210, and the semiconductor chip 30, the first constituent member 900, and the second constituent member 1000 are arranged in order, as shown in FIG. 8B. Although the region constituting one semiconductor package 10 is shown in FIG. 8B, in reality, the portions constituting the plurality of semiconductor packages 10 are continuous to each other through the dicing line DL, as shown in FIG. 5E. Thereafter, the semiconductor package 10 shown in FIG. 7 is manufactured by performing the process shown in FIG. 5F and the processes after FIG. 5F.

As described above, even if the side sealing part 70 is formed by the stack of plate-shaped members 74 instead of the injection molded product, the same effects as those of the first embodiment can be achieved.

Third Embodiment

A third embodiment will be described hereinafter. In the present embodiment, the heat radiating member 20 is not provided with the first surface metal film 22 and the second surface metal film 23, as compared with the first embodiment. Other configurations are the same as those of the first embodiment, and therefore the descriptions of the same configurations will be omitted.

Figure 9:
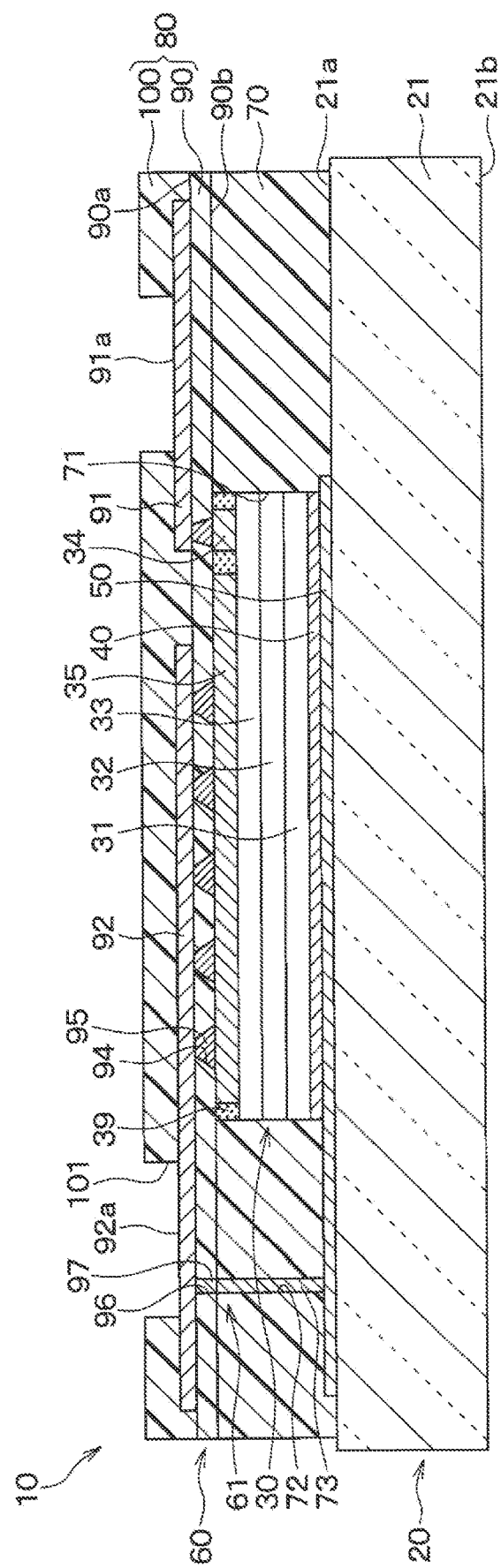
FIG. 9 is a cross-sectional view of a semiconductor package according to a third embodiment.

As shown in FIG. 9, in the semiconductor package 10 of the present embodiment, the heat radiating member 20 is not provided with the first surface metal film 22 and the second surface metal film 23. The semiconductor chip 30 is arranged on the heat radiating member 20 via the bonding member 50. The bonding member 50 of the present embodiment is made of a conductive material such as one in which silver particles are mixed with an organic solvent, and has a thickness of about 0.1 nm to 20 µm. That is, the bonding member 50 is sufficiently thinner than the first surface metal film 22 of the first embodiment described above.

Further, the bonding member 50 is extended along a planar direction of the heat radiating member 20 and is connected to the lower connecting via 73. That is, the bonding member 50 extends up to a position to be connected to the lower connecting via 73. The source pattern 92 is connected to the back surface electrode 40 of the semiconductor chip 30 by being connected to the bonding member 50 through the connecting via 61 formed in the sealing member 60.

According to this, since the heat radiating member 20 is not provided with the first surface metal film 22 and the second surface metal film 23, the same effects as those of the first embodiment can be achieved while reducing the number of parts. The bonding member 50 is formed to be sufficiently thinner than the first surface metal film 22. Therefore, even if the bonding member 50 is not arranged on the second surface 21b of the insulating substrate 21, the insulating substrate 21 is less likely to be deformed.

Further, since the second surface metal film 23 is not arranged on the heat radiating member 20, the constituent substrate 210 can be easily fixed when the dicing shown in FIG. 5G is performed in the manufacturing process. Therefore, the dicing can be simplified.

Fourth Embodiment

A fourth embodiment will be described hereinafter. In the present embodiment, the sealing member 60 is formed with a plurality of the connecting vias 61 with respect to the first embodiment described above. Other configurations are the same as those of the first embodiment, and therefore the descriptions of the same configurations will be omitted.

Figure 10A:
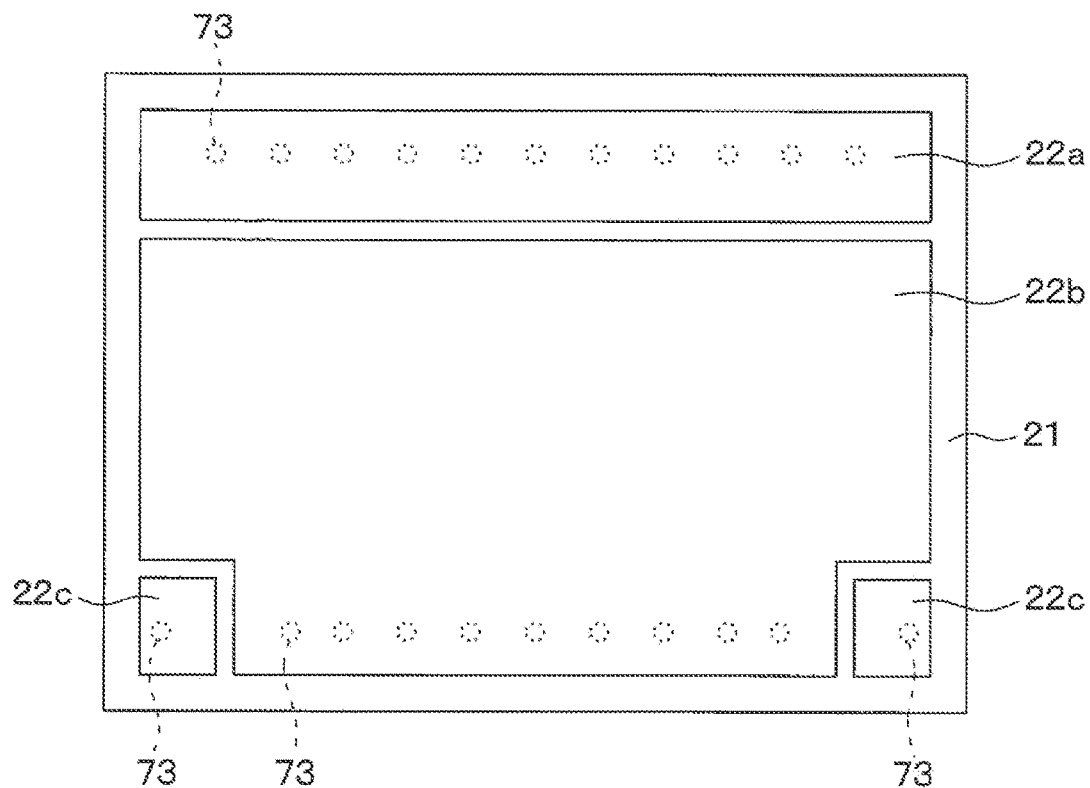
FIG. 10A is a plan view of a heat radiating member of a semiconductor package according to a fourth embodiment, when viewed from one side of the heat radiating member.
Figure 10B:
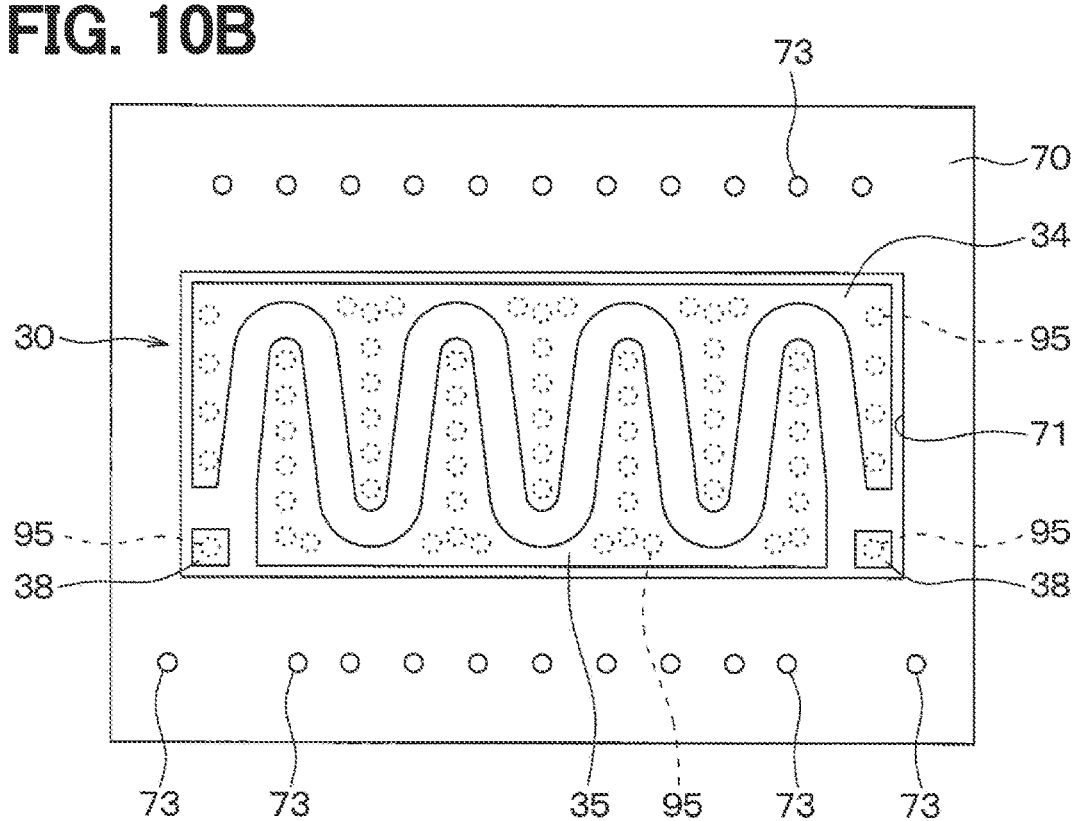
FIG. 10B is a plan view of a semiconductor chip and a side sealing part of the semiconductor package according to the fourth embodiment, when viewed from one side of the heat radiating member.
Figure 10C:
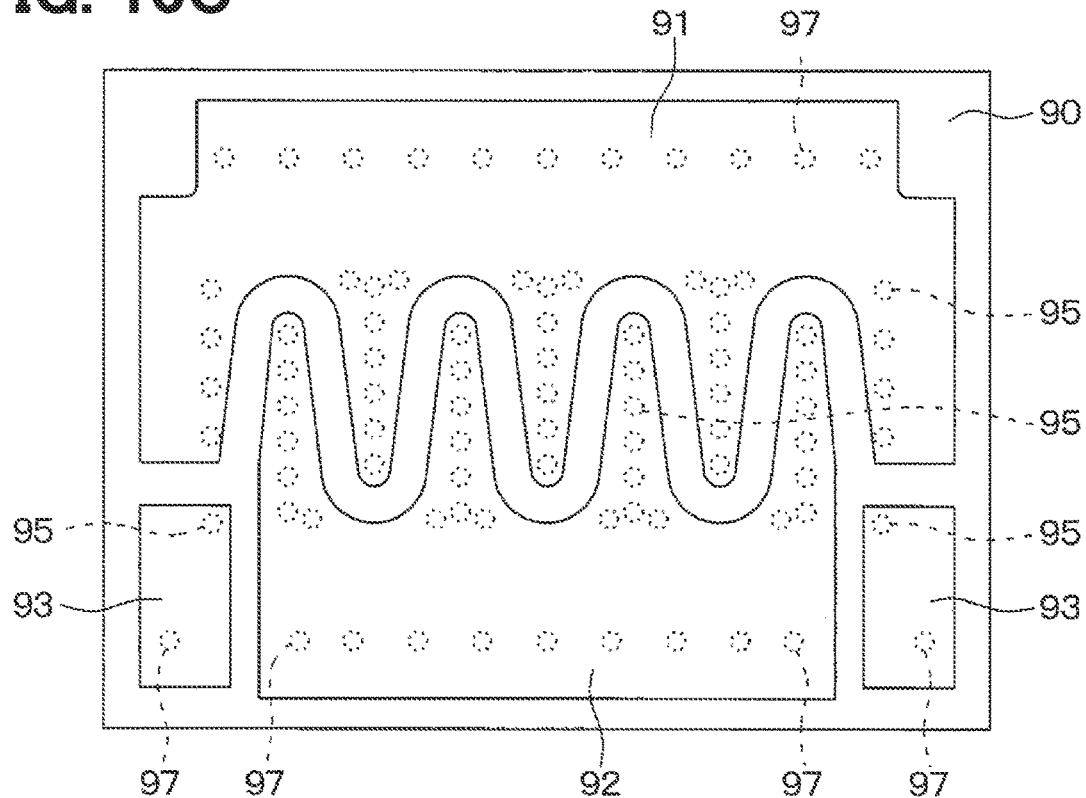
FIG. 10C is a plan view of a first sealing member of the semiconductor package according to the fourth embodiment, when viewed from one side of the heat radiating member.

As shown in FIGS. 10A to 10C, the semiconductor package 10 of the present embodiment is formed with a plurality of the connecting vias 61. Specifically, the first surface metal film 22 of the heat radiating member 20 is sectioned into multiple regions including a drain region 22a connected to the drain pattern 91, a source region 22b connected to the source pattern 92, and a gate region 22c connected to the gate pattern 93. The semiconductor chip 30 is arranged on the source region 22b via the bonding member 50. In the present embodiment, the drain region 22a corresponds to a first region, and the source region 22b corresponds to a second region.

The side sealing part 70 is formed with a plurality of the lower connecting vias 73 connected to the drain region 22a. The side sealing part 70 is formed with a plurality of the lower connecting vias 73 connected to the source region 22b. Further, the side sealing part 70 is formed with a plurality of the lower connecting vias 73 connected to the gate region 22c.

The number of the lower connecting vias 73 connected to the source region 22b is larger than that of the first embodiment. In the present embodiment, the lower connecting vias 73 connected to the drain region 22a and the lower connecting vias 73 connected to the source region 22b are located on opposite sides of the semiconductor chip 30.

The first sealing member 90 is formed with the upper connecting via 97 so as to be connected to the lower connecting via 73 connected to the drain region 22a. The first sealing member 90 is formed with the upper connecting via 97 so as to be connected to the lower connecting via 73 connected to the source region 22b. Further, the first sealing member 90 is formed with the upper connecting via 97 so as to be connected to the lower connecting via 73 connected to the gate region 22c.

That is, the sealing member 60 is formed with a connecting via 61 so as to connect the drain pattern 91 and the drain region 22a. The sealing member 60 is formed with a connecting via 61 so as to connect the source pattern 92 and the source region 22b. Further, the sealing member 60 is formed with a connecting via 61 so as to connect the gate pattern 93 and the gate region 22c.

Further, in the present embodiment, each of the connecting vias 61 has a diameter smaller than that of the upper connecting via 95 connecting the source electrode 35 and the source pattern 92 and the upper connecting via 95 connecting the drain electrode 34 and the drain pattern 91. In other words, each of the connecting vias 61 has a cross-sectional area smaller than the upper connecting via 95 connecting the source electrode 35 and the source pattern 92 and the upper connecting via 95 connecting the drain electrode 34 and the drain pattern 91, in a cross section defined orthogonal to the stacking direction.

As described above, in the present embodiment, the first surface metal film 22 is divided into the plurality of regions. The drain pattern 91 and the gate pattern 93 are connected to the first surface metal film 22 via the connecting vias 61. Therefore, a large number of connecting vias 61 are formed on the sealing member 60. Therefore, the connecting vias 61 can suppress the sealing member 60 from expanding in the stacking direction. The present embodiment can achieve the same effects as those of the first embodiment while suppressing the introduction of cracks into the connecting vias 61.

In the present embodiment, the connecting via 61 has the smaller diameter than the upper connecting via 95 connecting the drain electrode 34 and the drain pattern 91 and the upper connecting via 95 connecting the source electrode 35 and the source pattern 92. Therefore, in the manufacturing process, the sintered bodies 73a and 97a can be easily arranged in the through holes 72 and 96 by press fitting, as compared with the case where the connecting via 61 has the same diameter as the upper connecting via 95. Therefore, the manufacturing process can be simplified. Since the connecting vias 61 are provided for suppressing the thermal expansion of the sealing member 60 and do not allow a current to flow therein, the electrical characteristics of the semiconductor package 10 do not change even if the diameter of the connecting via 61 is reduced.

Figure 11:
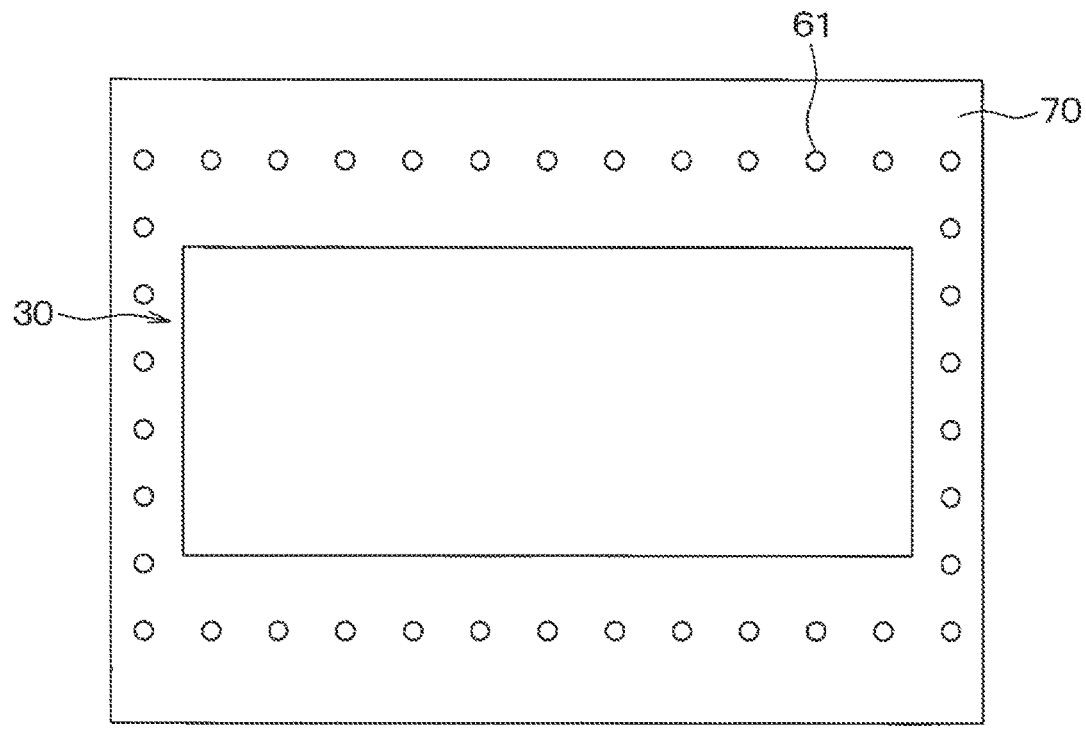
FIG. 11 is a schematic diagram showing a relationship between connecting vias and the semiconductor chip according to the fourth embodiment.

Although not particularly shown, it is preferable that the number of the connecting vias 61 is larger as the thermal expansion of the sealing member 60 in the stacking direction can be more suppressed. In this case, in order to evenly suppress the thermal expansion of the sealing member 60, the connecting via 61 may be formed along the outer surface of the sealing member 60. That is, in the stacking direction, the connecting via 61 may be formed so as to surround the semiconductor chip 30. In other words, the connecting vias 61 may be formed so as to face the respective side surfaces of the semiconductor chip 30. For example, in FIGS. 10A to 10C, the connecting vias 61 (that is, the lower connecting vias 73 and the upper connecting vias 97) connecting the drain pattern 91 and the drain region 22a may be further formed at both ends in the left-right direction of the figure. That is, as shown in FIG. 11, the connecting vias 61 may be formed so as to surround the semiconductor chip 30.

Fifth Embodiment

A fifth embodiment will be described hereinafter. In the present embodiment, a test pattern is arranged with respect to the first embodiment. Other configurations are the same as those of the first embodiment, and therefore the descriptions of the same configurations will be omitted.

Figure 12A:
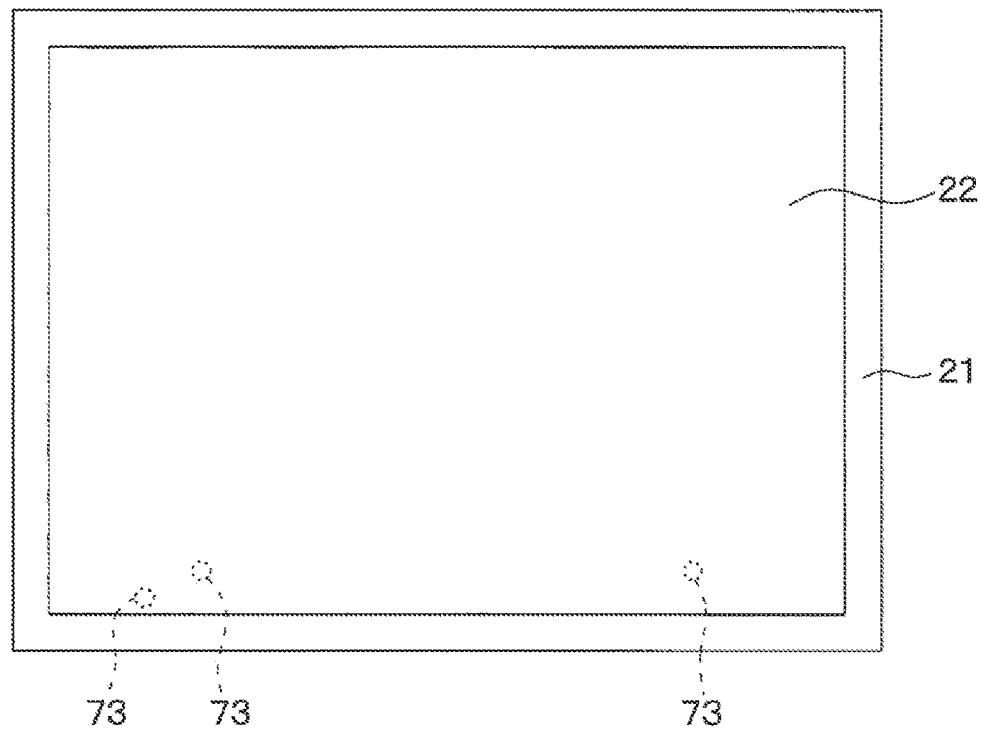
FIG. 12A is a plan view of a heat radiating member of a semiconductor package according to a fifth embodiment, when viewed from one side of the heat radiating member.
Figure 12B:
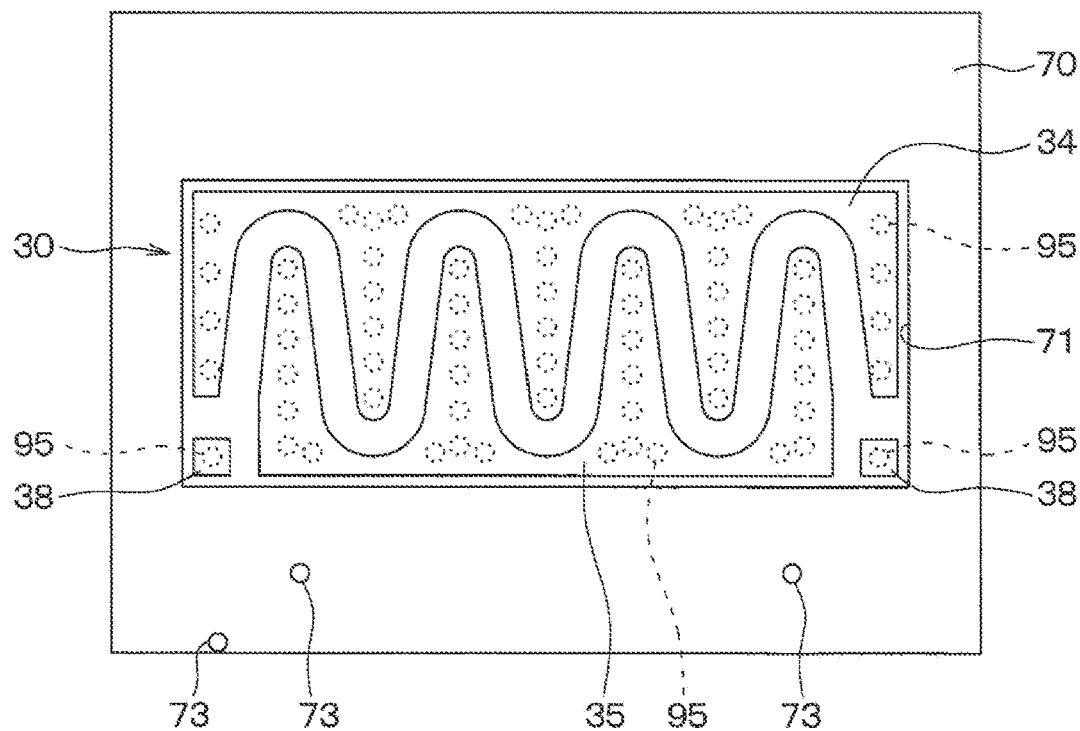
FIG. 12B is a plan view of a semiconductor chip and a side sealing part of the semiconductor package according to the fifth embodiment, when viewed from one side of the heat radiating member.
Figure 12C:
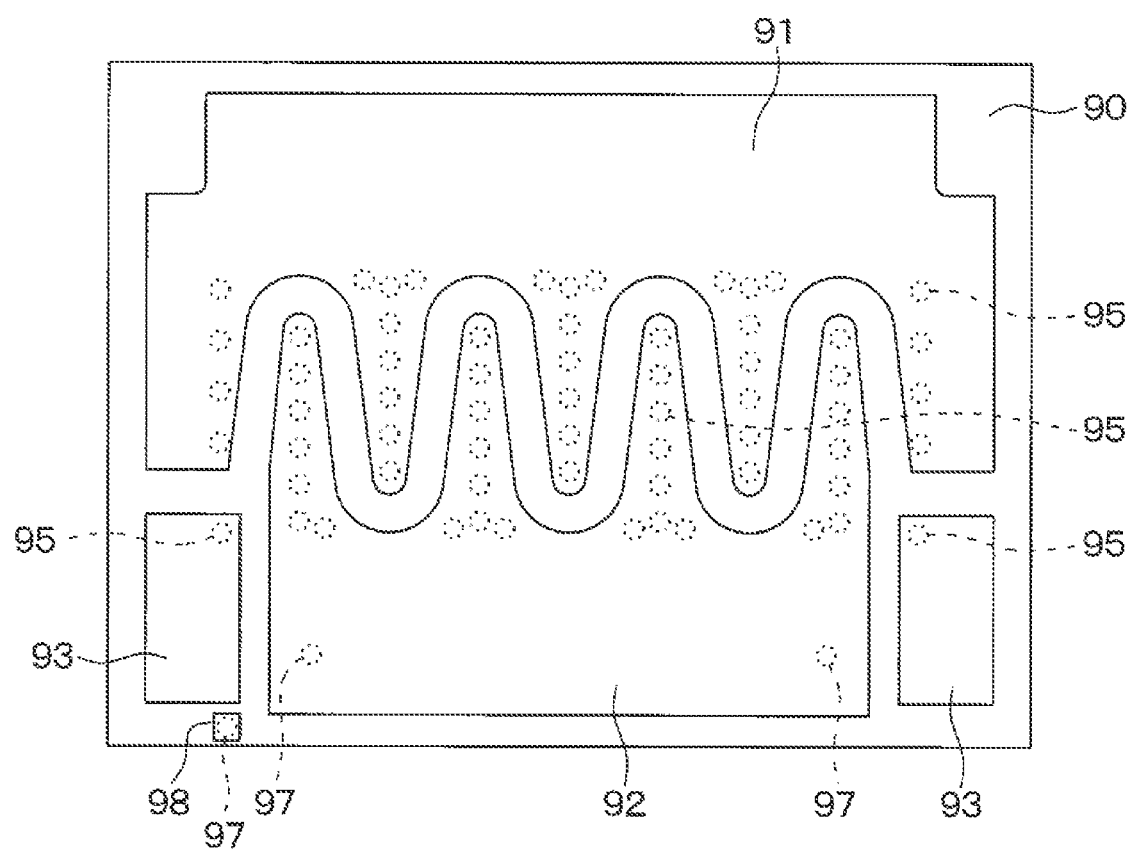
FIG. 12C is a plan view of a first sealing member according to the fifth embodiment, when viewed from one side of the heat radiating member.

As shown in FIGS. 12A to 12C, in the semiconductor package 10 of the present embodiment, a test pattern 98 is arranged on the first surface 90a of the first sealing member 90, and is partitioned from the drain pattern 91, the source pattern 92, and the gate pattern 93. The test pattern 98 is made of copper foil or the like, similarly to the drain pattern 91 or the like.

Further, the first sealing member 90 is formed with an upper connecting via 97 connected to the test pattern 98. The side sealing part 70 is formed with a lower connecting via 73 so as to connect the upper connecting via 97 connected to the test pattern 98 and the first surface metal film 22. That is, the sealing member 60 is formed with a connecting via 61 so as to connect the test pattern 98 and the first surface metal film 22. The source pattern 92 and the test pattern 98 are both electrically connected to the first surface metal film 22 and have the same potential.

According to this, by measuring the conduction resistance between the test pattern 98 and the source pattern 92, the conduction state between the source electrode 35 and the back surface electrode 40 of the semiconductor chip 30 can be inspected, as well as the same effects as those of the first embodiment described above can be achieved.

Sixth Embodiment

A sixth embodiment will be described hereinafter. In the present embodiment, the configurations of the semiconductor chip 30 and the heat radiating member 20 are modified from those of the first embodiment. Other configurations are the same as those of the first embodiment, and therefore the descriptions of the same configurations will be omitted.

Figure 13:
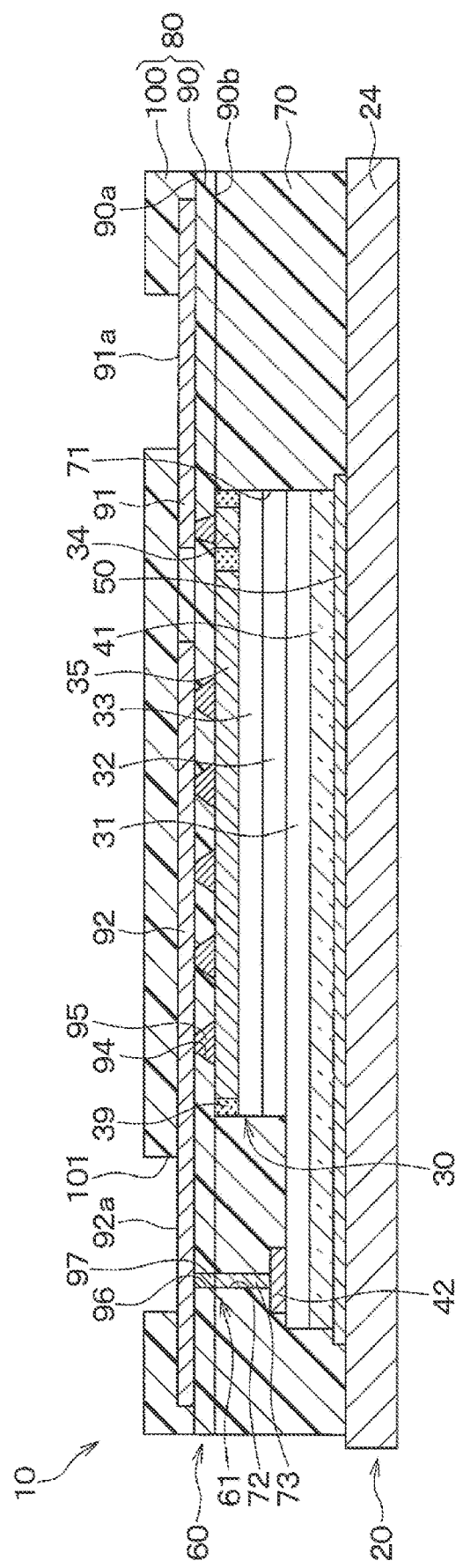
FIG. 13 is a cross-sectional view of a semiconductor package according to a sixth embodiment.

As shown in FIG. 13, in the semiconductor package 10 of the present embodiment, the semiconductor chip 30 is configured to have an insulating substrate 41, a support substrate 31, a buffer layer 32, and a semiconductor layer 33 stacked in order. The insulating substrate 41 is made of silicon nitride, aluminum nitride, or the like. In the present embodiment, the support substrate 31 corresponds to a first substrate, and the semiconductor layer 33 corresponds to a second substrate.

The planar size of the support substrate 31 and the planar size of the insulating substrate 41 are larger than those of the buffer layer 32 and the semiconductor layer 33. That is, the support substrate 31 and the insulating substrate 41 each have a shape including a portion protruding from the semiconductor layer 33 and the buffer layer 32, when viewed in the stacking direction of the insulating substrate 41, the support substrate 31, the buffer layer 32, and the semiconductor layer 33. Further, an electrode film 42 is formed on the portion of the support substrate 31 that protrudes from the semiconductor layer 33 and the buffer layer 32. Note that, in the present embodiment, the semiconductor chip 30 is not provided with the back surface electrode 40.

The semiconductor chip 30 is arranged such that the insulating substrate 41 is disposed on the heat radiating member 20 via the bonding member 50. The bonding member 50 of the present embodiment may be provided by a sintered body made by mixing metal particles, such as silver particles or silver and tin metal particles, in an organic solvent. Alternatively, the bonding member 50 may be provided by a highly heat-dissipating adhesive or the like, as long as the insulating substrate 41 and the semiconductor chip 30 can be mechanically connected to each other.

The sealing member 60 is formed with the connecting via 61 so as to electrically connect the source pattern 92 and the electrode film 42. That is, in the present embodiment, the source electrode 35 is electrically connected to the support substrate 31 through the upper connecting via 95, the source pattern 92, the connecting via 61, and the electrode film 42. Even if the source electrode 35 and the support substrate 31 are electrically connected in this way, the current collapse can be reduced.

In the present embodiment, since the source electrode 35 and the support substrate 31 are electrically connected as described above, the heat radiating member 20 is provided by a metal plate 24 made of such as copper. Therefore, the heat radiating property of the heat radiating member 20 can be improved, as compared with the case where the heat radiating member 20 is made of silicon nitride, aluminum nitride, or the like.

As described above, in the present embodiment, since the heat radiating member 20 is provided by the metal plate 24, the same effects as those of the first embodiment can be obtained while improving the heat radiating property of the heat radiating member 20.

Seventh Embodiment

A seventh embodiment will be described hereinafter. In the present embodiment, a plurality of semiconductor chips 30 are integrally sealed by a sealing member 60, with respect to the first embodiment. Other configurations are the same as those of the first embodiment, and therefore the descriptions of the same configurations will be omitted.

Figure 14:
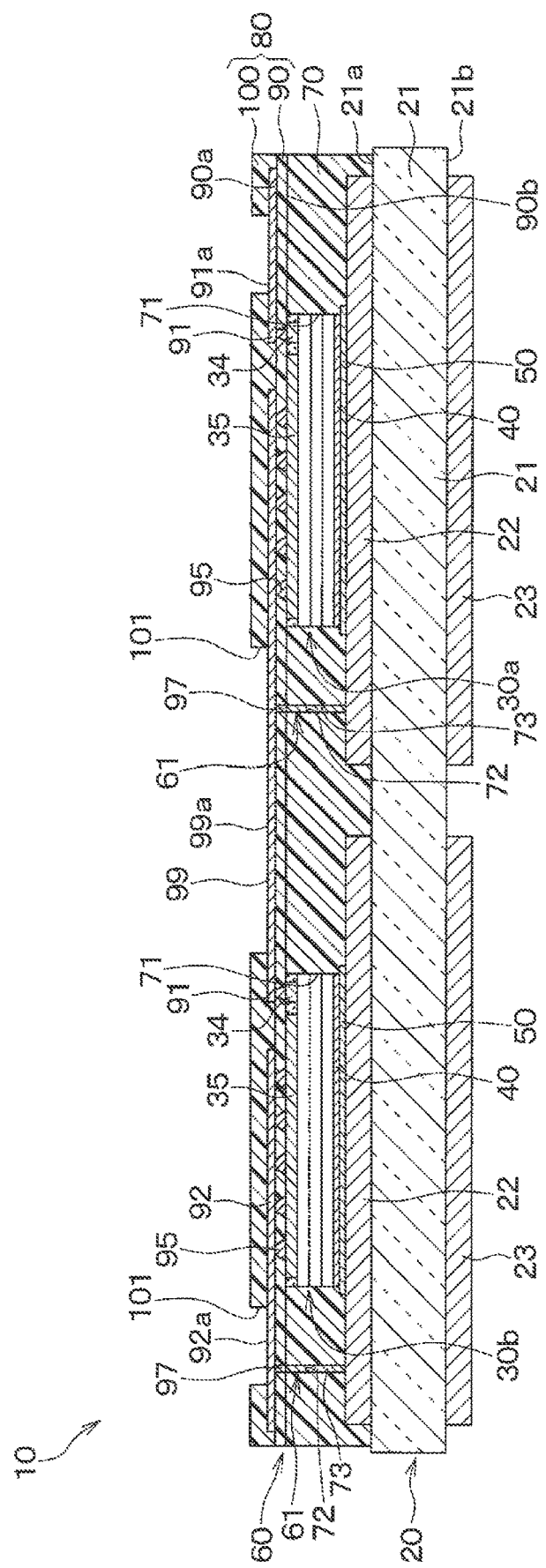
FIG. 14 is a cross-sectional view of a semiconductor package according to a seventh embodiment.

The semiconductor package 10 of the present embodiment is a so-called 2-in-1 package in which two semiconductor chips 30 are integrally sealed by the sealing member 60. The two semiconductor chips 30 have the same configuration. Hereinafter, one semiconductor chip 30 will be referred to as a first semiconductor chip 30a, and the other semiconductor chip 30 will be referred to as a second semiconductor chip 30b. In FIG. 14, the first semiconductor chip 30a is shown on the right side, and the second semiconductor chip 30b is shown on the left side.

Specifically, two first surface metal films 22 are formed on the heat radiating member 20 and are separated from each other. The first semiconductor chip 30a and the second semiconductor chip 30b are arranged on the right first surface metal film 22 and the left first surface metal film 22 through the bonding members 50, respectively.

The sealing member 60 is arranged so as to integrally seal the first and second semiconductor chips 30a and 30b. Specifically, the side sealing part 70 is arranged so as to seal the side surfaces of the first and second semiconductor chips 30a and 30b. Further, the surface sealing part 80 is arranged so as to seal the first surfaces of the first and second semiconductor chips 30a and 30b.

The first sealing member 90 is formed with the drain pattern 91 connected to the drain electrode 34 of the first semiconductor chip 30a and the source pattern 92 connected to the source electrode 35 of the second semiconductor chip 30b. Further, the first sealing member 90 is formed with a connection pattern 99 that is electrically connected to the source electrode 35 of the first semiconductor chip 30a and the drain electrode 34 of the second semiconductor chip 30b. Moreover, the first sealing member 90 is formed with the gate pattern 93 connected to the gate electrode 38 of the first semiconductor chip 30a and the gate pattern 93 connected to the gate electrode 38 of the second semiconductor chip 30b, in a cross section different from that shown in FIG. 14.

The first sealing member 90 is formed with an upper connecting via 95 as to connect the drain electrode 34 of the first semiconductor chip 30a and the drain pattern 91. The first sealing member 90 is formed with an upper connecting via 95 so as to connect the source electrode 35 of the second semiconductor chip 30b and the source pattern 92. The first sealing member 90 is formed with an upper connecting via 95 so as to connect the source electrode 35 of the first semiconductor chip 30a and the connection pattern 99. Also, the first sealing member 30 is formed with an upper connecting via 95 so as to connect the drain electrode 34 of the second semiconductor chip 30b and the connection pattern 99. That is, the first semiconductor chip 30a and the second semiconductor chip 30b are in a state in which the source electrode 35 of the first semiconductor chip 30a and the drain electrode 34 of the second semiconductor chip 30b are electrically connected to each other.

Further, the first sealing member 90 is formed with an upper connecting via 95 so as to connect the gate electrode 38 of the first semiconductor chip 30a and the gate pattern 93 in a cross section different from that shown in FIG. 14. The first sealing member 90 is formed with an upper connecting via 95 so as to connect the gate electrode 38 of the second semiconductor chip 30b and the gate pattern 93.

The sealing member 60 is formed with a connecting via 61 so as to connect the connection pattern 99 and the first surface metal film 22 on which the first semiconductor chip 30a is arranged. The sealing member 60 is formed with a connecting via 61 so as to connect the source pattern 92 and the first surface metal film 22 on which the second semiconductor chip 30b is arranged. As a result, in each of the first and second semiconductor chips 30a and 30b, the source electrode 35 and the other surface electrode 40 are electrically connected to each other.

The second sealing member 100 is formed with contact holes 101 to expose a part of the drain pattern 91, a part of the source pattern 92, and a part of the connection pattern 99. The portions of the drain pattern 91, the source pattern 92, and the connection pattern 99 exposed from the contact holes 101 serve as the drain pad 91a, the source pad 92a, and the connection pad 99a.

Further, the second sealing member 100 has a contact hole 101 formed in a cross section different from that shown in FIG. 14 to expose a part of the gate pattern 93. Then, as described with reference to FIG. 4D and the like, the portion of the gate pattern 93 exposed from the contact hole 101 serves as the gate pad 93a.

Figure 15:
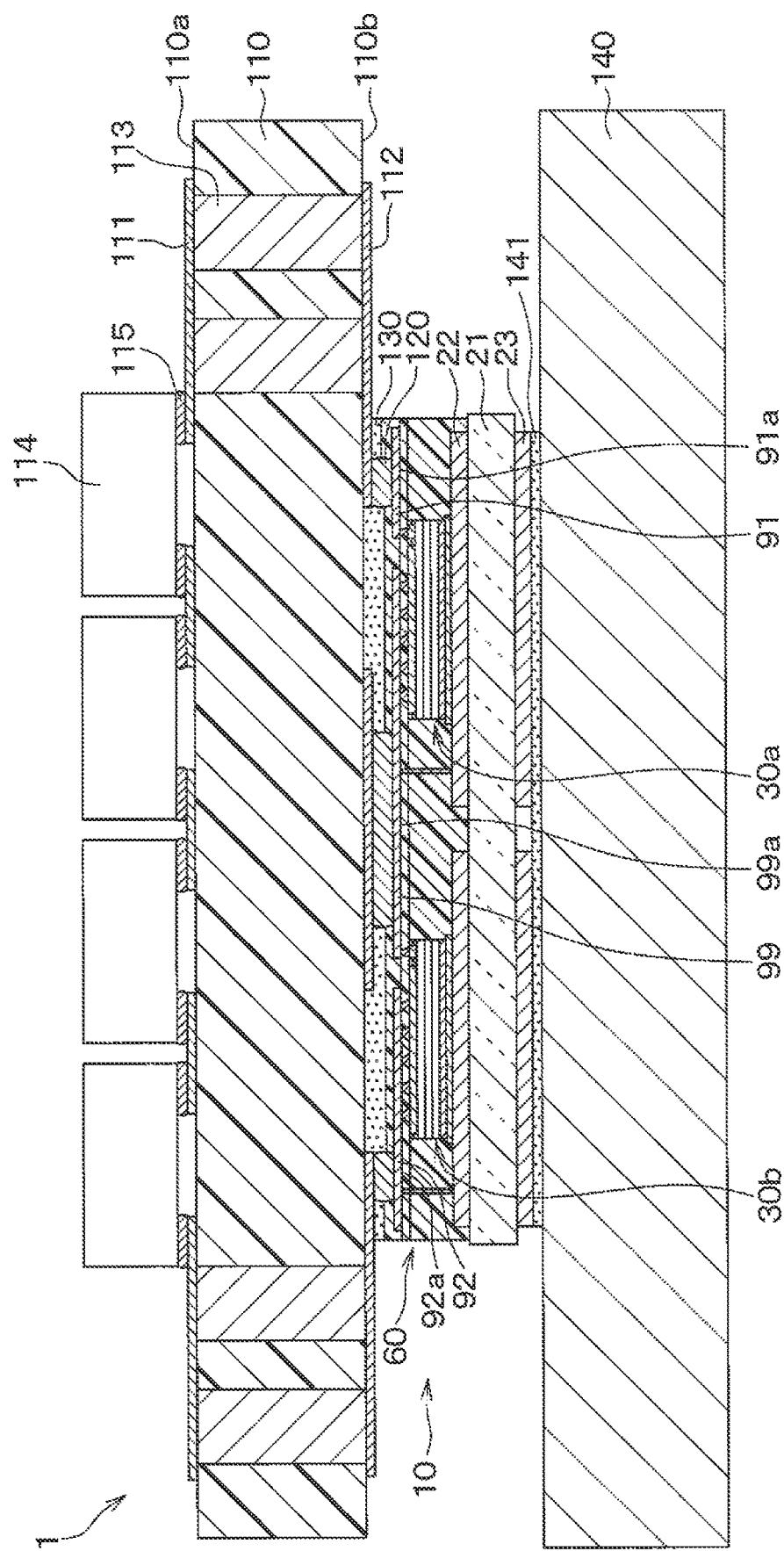
FIG. 15 is a cross-sectional view showing a state in which the semiconductor package shown in FIG. 14 is mounted on a printed circuit board.

Such a semiconductor package 10 is used, for example, in a DC/DC converter circuit or an inverter circuit so that the first semiconductor chip 30a constitutes an upper arm and the second semiconductor chip 30b constitutes a lower arm. In this case, the drain pad 91a serves as a higher voltage side pad, the source pad 92a serves as a lower voltage side pad, and the connection pad 99a serves as an output pad. As shown in FIG. 15, the semiconductor package 10 is used so as to constitute an electronic device 1 together with a printed circuit board 110 as a mounting member, a cooler 140, and the like.

The printed circuit board 110 has a first surface 110a and a second surface 110b opposite to the first surface 110a. The printed circuit board 110 is formed with a first surface wiring pattern 111 on the first surface 110a and a second surface wiring pattern 112 on the second surface 110b. The printed circuit board 110 is formed with a though-hole electrode 113 so as to electrically connect the first surface wiring pattern 111 and the second surface wiring pattern 112. On the printed circuit board 110, an electronic component 114 such as a ceramic capacitor is arranged on the first surface wiring pattern 111 via solder 115 or the like as a connecting member.

In the semiconductor package 10, the drain pad 91a, the source pad 92a, and the connection pad 99a are connected to second surface wiring patterns 112 of the printed circuit board 110 through solder 120 as a connecting member, respectively. Further, in the semiconductor package 10, the gate pad 93a is connected to a second surface wiring pattern 112 of the printed circuit board 110 through a solder 120 in a cross section different from that shown in FIG. 15. The solder 120 is preferably made of solder bumps rather than being arranged in a paste form, so that reliability can be improved by ensuring the height.

Further, an underfill material 130 is arranged between the printed board 110 and the semiconductor package 10 in order to ensure the reliability of the solder 120 and the insulation with the drain pad 91a, the source pad 92a, the gate pad 93a, and the connection pad 99a.

A cooler 140 is arranged on the second surface metal film 23 of the semiconductor package 10 through a connecting member 141 such as a thermal paste. The cooler 140 is made of metal or the like.

Also in the semiconductor package 10 in which the plurality of semiconductor chips 30 are integrally sealed by the sealing member 60 as described above, the same effects as those of the first embodiment can be achieved.

Modification of Seventh Embodiment

A modification of the seventh embodiment will be described hereinafter. In the seventh embodiment, the semiconductor package 10 in which the two semiconductor chips 30 are sealed in the sealing member 60 has been described. Alternatively, the semiconductor package 10 may be configured as follows. For example, the semiconductor package 10 may be a so-called 4-in-1 package in which four semiconductor chips 30 are sealed in the sealing member 60. As another example, the semiconductor package 10 may be a so-called 6-in-1 package in which six semiconductor chips 30 are sealed in the sealing member 60.

Eighth Embodiment

An eighth embodiment will be described hereinafter. In the embodiment, the semiconductor chip 30 is formed with a vertical semiconductor element, differently from the first embodiment. Other configurations are the same as those of the first embodiment, and therefore the descriptions of the same configurations will be omitted.

Figure 16:
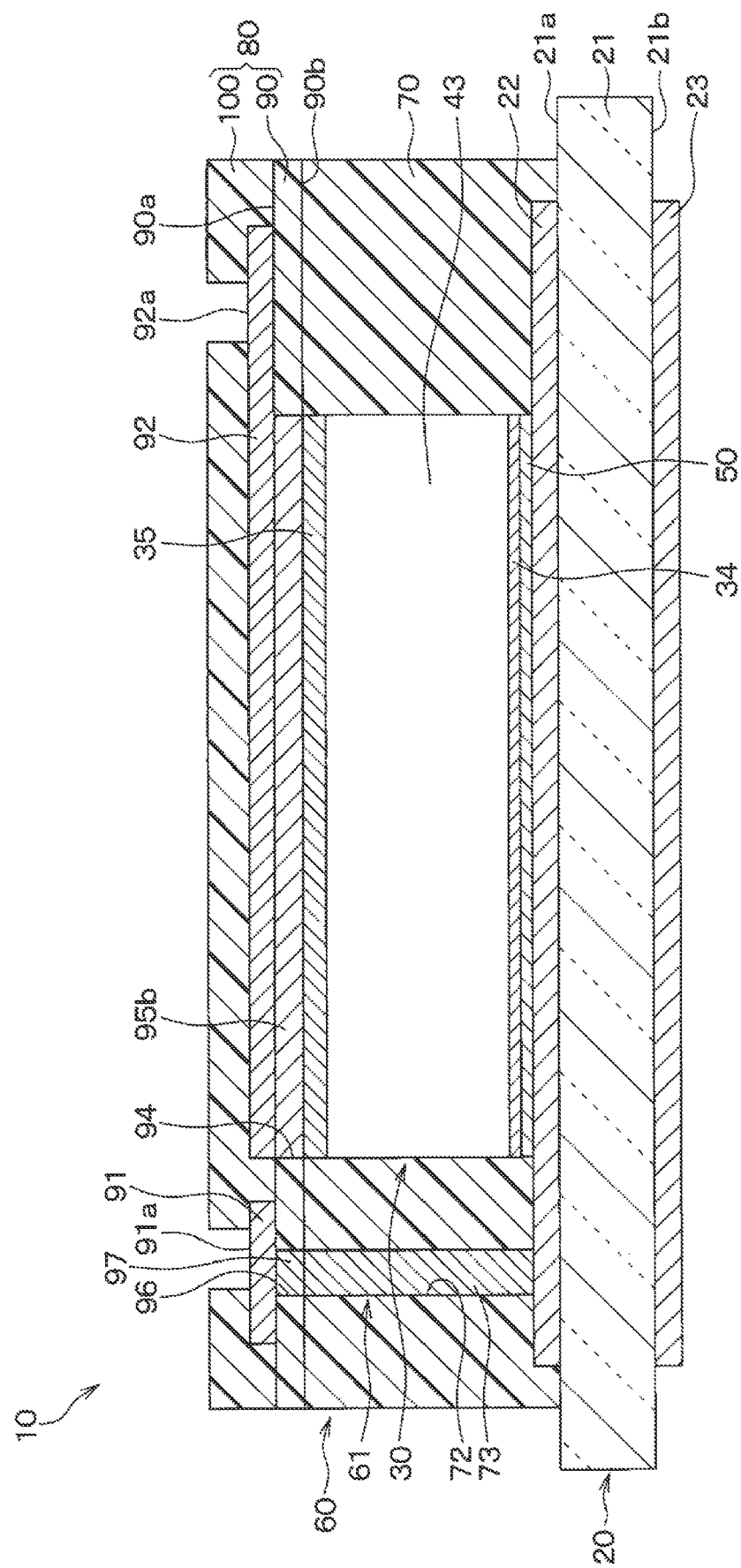
FIG. 16 is a cross-sectional view of a semiconductor package according to an eighth embodiment.

As shown in FIG. 16, in the semiconductor package 10 of the present embodiment, the semiconductor chip 30 is formed with a vertical semiconductor element that causes a current to flow in a thickness direction of the semiconductor chip 30. For example, the semiconductor chip 30 of the present embodiment has a semiconductor substrate 43 made of silicon, silicon carbide (SiC), or the like. Although the detailed configuration of the semiconductor chip 30 is not shown, the drain electrode 34 is formed on a side adjacent to the heat radiating member 20, and the source electrode 35 and the like are formed on the side opposite to the heat radiating member 20. Further, the semiconductor chip 30 is formed with a gate wiring 37, a gate electrode 38, and the like on the side opposite to the heat radiating member 20 in a cross section different from that shown in FIG. 16. In the semiconductor chip 30, the drain electrode 34 is connected to the first surface metal film 22 through the bonding member 50 having conductivity. In the present embodiment, the drain electrode 34 corresponds to the first electrode and the back surface electrode.

The source pattern 92 and the drain pattern 91 are formed on the first sealing member 90. Further, a gate pattern 93 is formed on the first sealing member 90 in a cross section different from that shown in FIG. 16.

In the first sealing member 90, further, a solid pattern 95b is arranged in the through hole 94 so as to connect the source pattern 92 and the source electrode 35. In the present embodiment, the solid pattern 95b is arranged so that the resistance can be reduced. Alternatively, the source pattern 92 and the source electrode 35 may be connected by the upper connecting via 95 as in the first embodiment. Further, in a cross section different from that shown in FIG. 16, the upper connecting via 95 is arranged so as to connect the gate pattern 93 and the gate electrode 38.

Further, the sealing member 60 is formed with the connecting via 61 so as to electrically connect the drain pattern 91 and the second surface metal film 22. As a result, the drain pattern 91 is connected to the drain electrode 34 through the connecting via 61 and the first surface metal film 22. In order to exert a function of allowing an electric current, it is preferable to form a plurality of the connecting vias 61 so that the inductance can be reduced.

Also in the configuration in which the semiconductor chip 30 is formed with the vertical semiconductor element, the same effects as those of the first embodiment can be achieved.

Ninth Embodiment

A ninth embodiment will be described hereinafter. In the present embodiment, the plate-shaped member 74 is arranged also between the semiconductor chip 30 and the heat radiating member 20 with respect to the second embodiment. Other configurations are the same as those of the second embodiment, and therefore the descriptions of the same configurations will be omitted.

Figure 17:
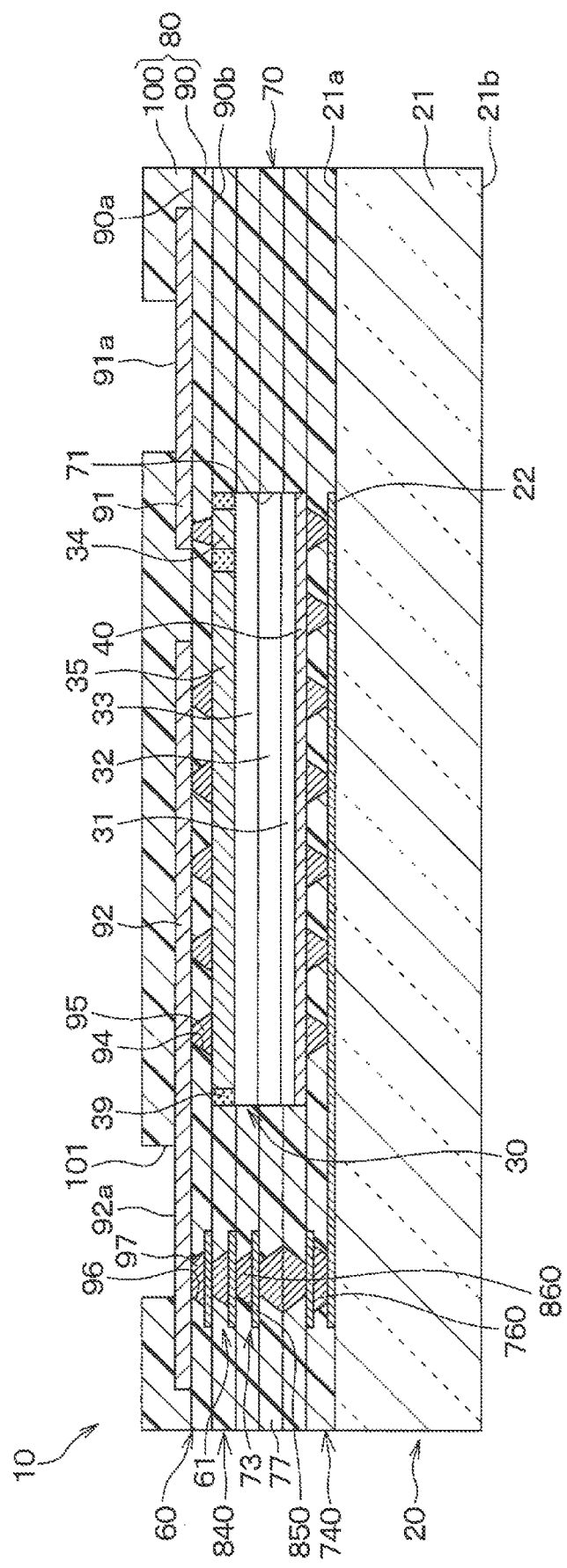
FIG. 17 is a cross-sectional view of a semiconductor package according to a ninth embodiment.

In the semiconductor package 10 of the present embodiment, as shown in FIG. 17, the plate-shaped member 74 is arranged also between the back surface electrode 40 of the semiconductor chip 30 and the heat radiating member 20. In the present embodiment, the plate-shaped member 74 arranged between the back surface electrode 40 of the semiconductor chip 30 and the heat radiating member 20 is also referred to as a lower layer plate-shaped member 740, and the plate-shaped member 74 arranged on the lower layer plate-shaped member 740 is also referred to as an intermediate layer plate-shaped member 840. The lower layer plate-shaped member 740 has a structure in which a lower layer connecting via 760 is appropriately formed in the LCP film 77. The lower layer plate-shaped member 740 is arranged so as to cover the first surface metal film 22. The intermediate layer plate-shaped member 840 has a similar configuration in which an intermediate layer pattern 850 and an intermediate layer connecting via 860 are appropriately formed on the LCP film. The intermediate layer plate-shaped member 840 is arranged on the lower layer plate-shaped member 740.

The back surface electrode 40 of the semiconductor chip 30 and the first surface metal film 22 are connected to each other through the lower layer connecting via 760 formed in the lower layer plate-shaped member 740. In the present embodiment, the first surface metal film 22 extends to a position below the intermediate layer connecting via 860 formed in the intermediate layer plate-shaped member 840. The intermediate layer connecting via 860 is connected to the first surface metal film 22 via the lower layer connecting via 760. Thereby, in the present embodiment, the back surface electrode 40 of the semiconductor chip 30 is electrically connected to the source electrode 35. In the present embodiment, the thickness of the first surface metal film 22 thinner than that of the first surface metal film 22 of the first embodiment so that the lower layer plate-shaped member 740 can cover the first surface metal film 22. The insulating substrate 21 is not provided with the second surface metal film 23 on the second surface 21b. However, the insulating substrate 21 may be provided with the second surface metal film 23 on the second surface 21b.

In the present embodiment, the outer edge portion of the first surface 21a of the heat radiating member 20 is also sealed by the sealing member 60. That is, the sealing member 60 is arranged so that the outer edge end portion coincides with the outer edge portion of the heat radiating member 20 in the stacking direction. This type of semiconductor package 10 can be formed by refraining the removal of the outer edge portion of the sealing member 60 after the dividing along the dicing line DL into the chips in the process shown in FIG. 5G. Further, in each of the embodiments described above and embodiments described hereinafter, the outer edge portion of the first surface 21a of the heat radiating member 20 may be sealed by the sealing member 60 or may be exposed from the sealing member 60, according to the configuration of each embodiment.

As described above, the lower layer plate-shaped member 740 can be arranged so that the back surface electrode 40 of the semiconductor chip 30 is connected to the source electrode 35 through the lower layer connecting via 760 formed in the lower layer plate-shaped member 740.

Tenth Embodiment

A tenth embodiment will be described hereinafter. In the present embodiment, the location of the lower layer connecting via 760 is defined with respect to the ninth embodiment. Other configurations are the same as those of the ninth embodiment, and therefore the descriptions of the same configurations will be omitted.

Figure 18:
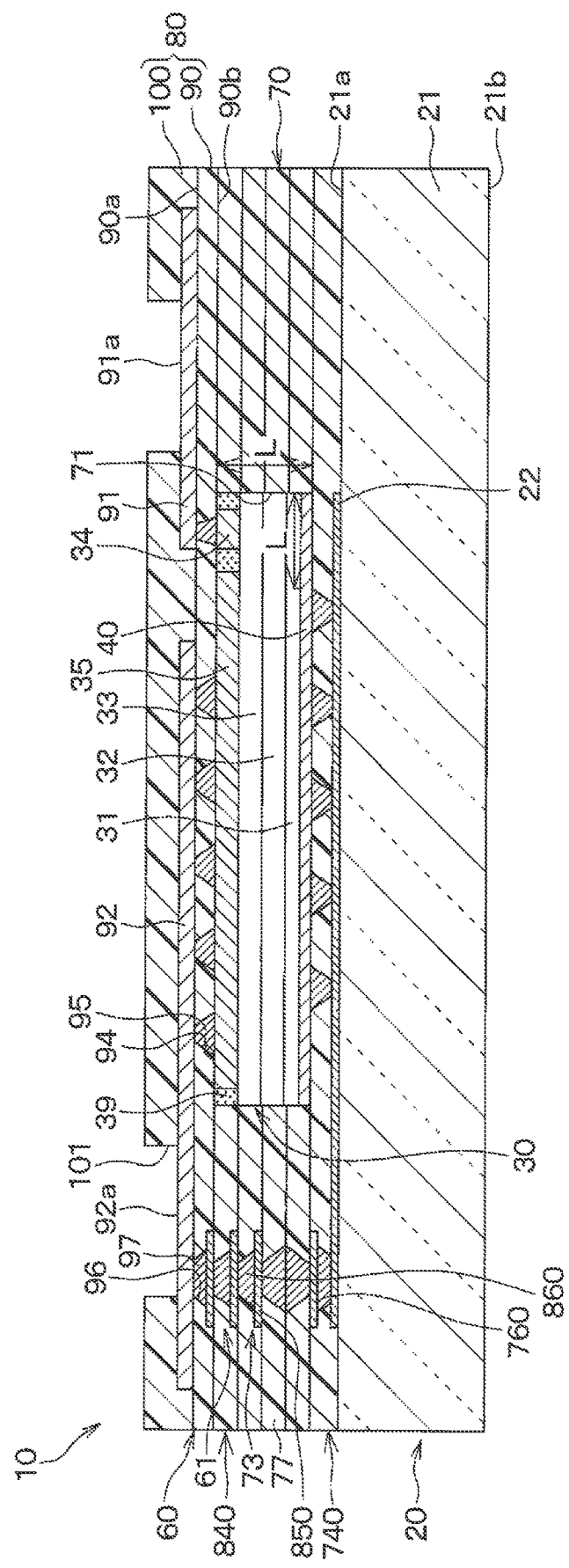
FIG. 18 is a cross-sectional view of a semiconductor package according to a tenth embodiment.

As shown in FIG. 18, the semiconductor package 10 of the present embodiment is arranged so that a lower layer connecting via 760 is connected to the inner edge portion of the semiconductor chip 30, and the lower layer connecting via 760 is not connected to the outer edge portion of the semiconductor chip 30. In the present embodiment, the lower layer connecting via 760 is arranged at a position separated from the outer edge portion of the semiconductor chip 30 by a distance L, which is the thickness of the semiconductor chip 30.

In such a semiconductor package 10, it is possible to suppress the lower layer connecting via 760 from being broken, and it is possible to improve the reliability. That is, the semiconductor chip 30 is more likely to bend as the outer edge portion thereof, and a large stress is likely to be generated. Therefore, by arranging the lower layer connecting via 760 at a position different from the portion where the stress caused in the semiconductor chip 30 is large, it is possible to suppress the lower layer connecting via 760 from being broken.

Eleventh Embodiment

An eleventh embodiment will be described hereinafter. In the present embodiment, the configuration of the lower layer plate-shaped member 740 is modified from that of the ninth embodiment. Other configurations are the same as those of the ninth embodiment, and therefore the descriptions of the same configurations will be omitted.

Figure 19:
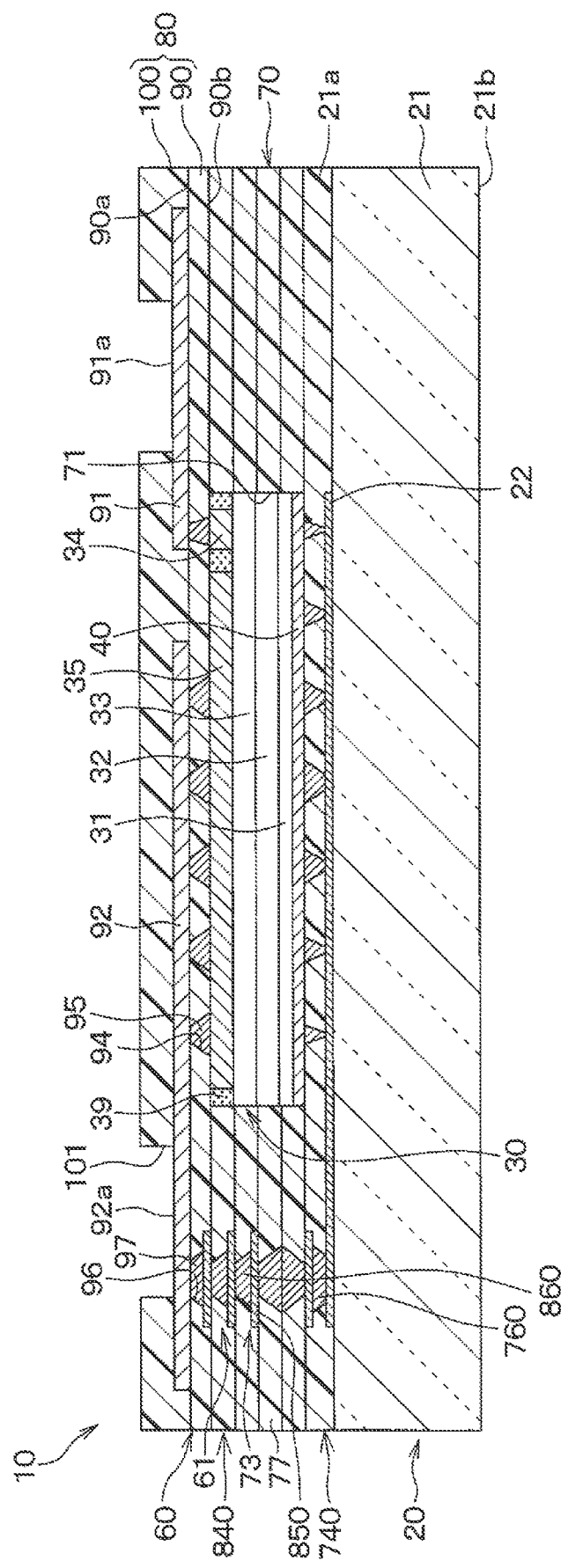
FIG. 19 is a cross-sectional view of a semiconductor package according to an eleventh embodiment.
Figure 20:
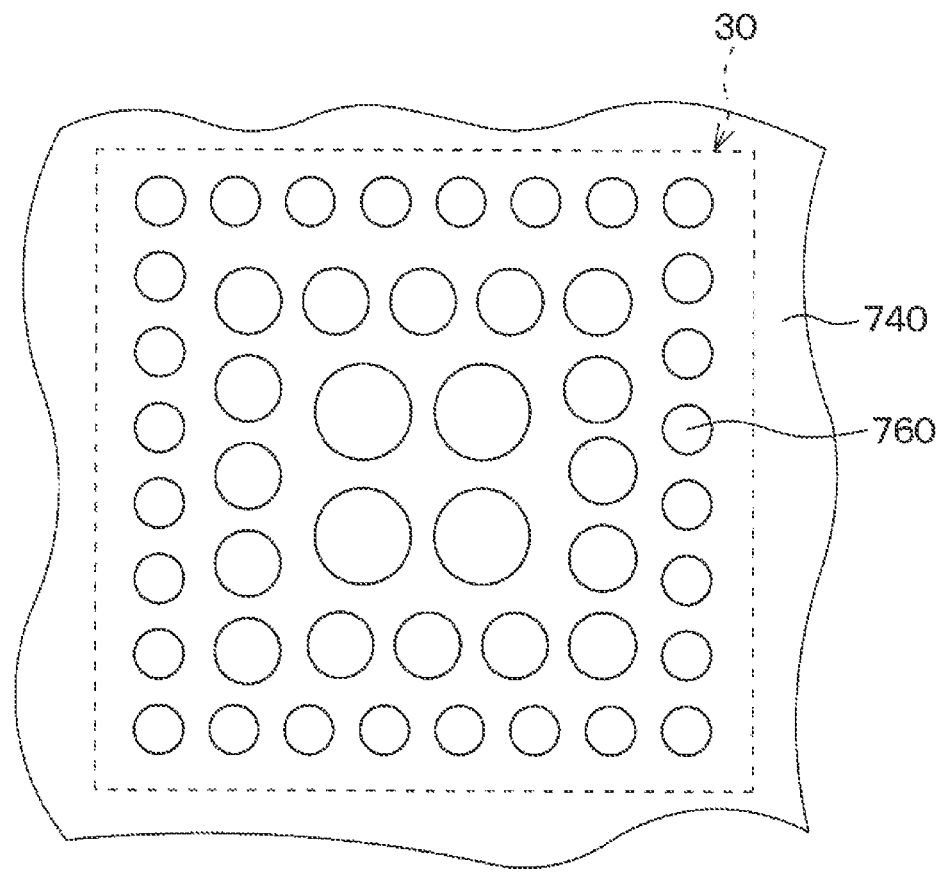
FIG. 20 is a schematic plan view of a portion of a lower layer plate-shaped member shown in FIG. 19, the portion being located under the semiconductor package.

As shown in FIGS. 19 and 20, in the semiconductor package 10 of the present embodiment, the diameter of the lower layer connecting via 760 formed in the lower layer plate-shaped member 740 is different depending on the position where the lower layer connecting via 760 is arranged. Specifically, in the lower layer connecting vias 760, the diameter of the one connected to the inner edge portion of the semiconductor chip 30 is larger than the diameter of the one connected to the outer edge portion of the semiconductor chip 30. In other words, in the lower layer connecting vias 760, the connection area of the portion connected to the inner edge portion of the semiconductor chip 30 is larger than the connection area of the portion connected to the outer edge portion of the semiconductor chip 30. More specifically, the diameter of the lower layer connecting vias 760 is gradually reduced from the one connected to the inner edge portion of the semiconductor chip 30 toward the one connected to the outer edge portion.

In such a semiconductor package 10, the temperature of the inner edge portion of the semiconductor chip 30 tends to be higher than that of the outer edge portion. Therefore, heat radiation can be improved by arranging the lower layer connecting via 760 having a larger diameter in the high temperature area of the semiconductor chip 30. Further, as described in the tenth embodiment, the semiconductor chip 30 is more likely to bend in the outer edge portion than in the inner edge portion, and a large stress is likely to be generated. Therefore, by arranging the lower layer connecting via 760 having a smaller diameter in the portion of the semiconductor chip 30 where the stress tends to increase, it is possible to suppress the lower layer connecting via 760 from being broken. That is, according to the semiconductor package 10 of the present embodiment, it is possible to suppress the destruction of the lower layer connecting via 760 while improving the heat radiation.

Twelfth Embodiment

A twelfth embodiment will be described hereinafter. In the present embodiment, the configuration of the lower layer plate-shaped member 740 is modified from that of the ninth embodiment. Other configurations are the same as those of the ninth embodiment, and therefore the descriptions of the same configurations will be omitted.

Figure 21:
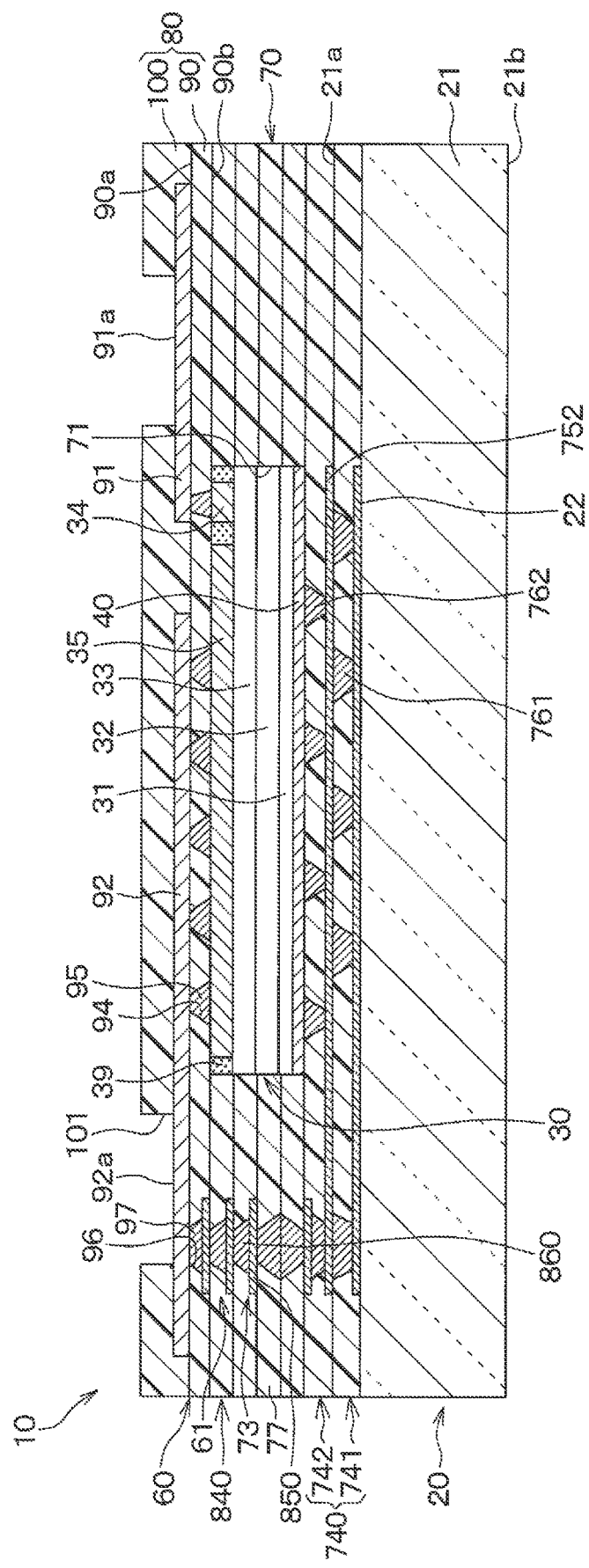
FIG. 21 is a cross-sectional view of a semiconductor package according to a twelfth embodiment.

In the present embodiment, as shown in FIG. 21, the lower layer plate-shaped member 740 is configured by having a first lower layer plate-shaped member 741 and a second lower layer plate-shaped member 742 stacked on the heat radiating member 20. The first lower layer plate-shaped member 741 is formed with the first lower layer connecting via 761 as the lower layer connecting via 760. The second lower layer plate-shaped member 742 is formed with a lower layer pattern 752 and a second lower layer connecting via 762 as the lower layer connecting via 760.

Specifically, in the second lower layer plate-shaped member 742, a plurality of second lower layer connecting vias 762 are formed on the second lower layer plate-shaped member 742 so as to be connected to the back surface electrode 40 of the semiconductor chip 30, and a second lower layer connecting via 762 is formed so as to be connected to the intermediate layer connecting via 860 formed in the intermediate layer plate-shaped member 840. A lower layer pattern 752 is formed in the second lower layer plate-shaped member 742 so as to connect the second lower layer connecting vias 762 to each other. That is, the lower layer pattern 752 extends from the position located below the semiconductor chip 30 to the position located below the intermediate layer connecting via 860.

In the first lower layer plate-shaped member 741, a plurality of first lower layer connecting vias 761 are formed so as to connect the lower layer pattern 752 formed in the second lower layer plate-shaped member 742 and the first surface metal film 22. The first surface metal film 22 of the present embodiment has substantially the same size as the lower layer pattern 752 and is formed so as to face the lower layer pattern 752. That is, the first surface metal film 22 extends from the position located below the semiconductor chip 30 to the position located below the intermediate layer connecting via 860, similarly to the lower layer pattern 752. The first lower layer connecting via 761 is also connected to the lower layer pattern 752 at a position outside the semiconductor chip 30 in the stacking direction.

Figure 22:
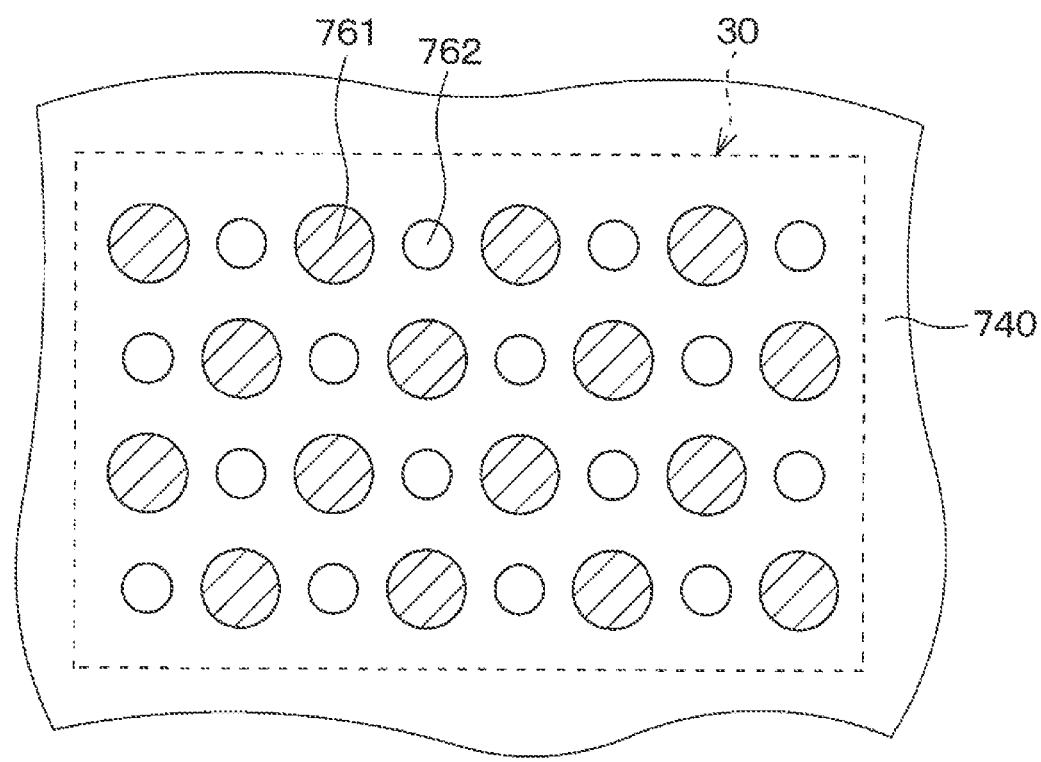
FIG. 22 is a schematic plan view of a portion of a lower layer plate-shaped member shown in FIG. 21, the portion being located under the semiconductor package.

In the present embodiment, as shown in FIGS. 21 and 22, the first lower layer connecting via 761 formed in the first lower layer plate-shaped member 741 has the diameter larger than that of the second lower layer connecting via 762 formed in the second lower layer plate-shaped member 742. Further, the first lower layer connecting via 761 formed in the first lower layer plate-shaped member 741 and the second lower layer connecting via 762 formed in the second lower layer plate-shaped member 742 are arranged at different positions in the stacking direction. In other words, the first lower layer connecting via 761 formed in the first lower layer plate-shaped member 741 and the second lower layer connecting via 762 formed in the second lower layer plate-shaped member 742 are arranged so as not to overlap in the stacking direction. In the present embodiment, the first lower layer connecting via 761 formed in the first lower layer plate-shaped member 741 and the second lower layer connecting via 762 formed in the second lower layer plate-shaped member 742 are arranged alternately and in a staggered pattern when viewed in the stacking direction. In FIG. 22, the first lower layer connecting via 761 is hatched for easy understanding.

As described above, the lower layer plate-shaped member 740 may be configured by stacking the first lower layer plate-shaped member 741 and the second lower layer plate-shaped member 742. In such a semiconductor package 10, the temperature of the second lower layer plate-shaped member 742 tends to be higher than that of the first lower layer plate-shaped member 741. Therefore, by making the second lower layer connecting via 762 formed in the second lower layer plate-shaped member 742 smaller than the first lower layer connecting via 761 formed in the first lower layer plate-shaped member 741, it is possible to suppress the second lower layer connecting via 762 from being broken and improve the reliability.

Further, the first surface metal film 22 and the lower layer pattern 752 formed in the second lower layer plate-shaped member 742 extend to the position outside of the semiconductor chip 30 in the stacking direction. The first lower layer connecting via 761 formed in the first lower layer plate-shaped member 741 is connected to the lower layer pattern 752 formed in the second lower layer plate-shaped member 742 also at a position outside the semiconductor chip 30 in the stacking direction. Therefore, when the heat generated in the semiconductor chip 30 is propagated from the second lower layer connecting via 762 to the lower layer pattern 752, the heat diffuses in the lower layer pattern 752 in the planar direction, and is propagated to the insulating substrate 21 through the first lower layer connecting via 761 and the first surface metal film 22. Therefore, the heat radiation can be improved, as compared with the configuration in which the first lower layer connecting via 761 formed in the first lower layer plate-shaped member 741 is connected to the lower layer pattern 752 formed in the second lower layer plate-shaped member 742 only inside the semiconductor chip 30 in the stacking direction. In this case, although not particularly shown, by increasing the number of the first lower layer connecting vias 761 to be greater than the number of the second lower layer connecting vias 762, it is possible to further facilitate heat radiation to the heat radiating member 20.

Further, the first lower layer connecting via 761 and the second lower layer connecting via 762 are arranged so as to be at different positions in the stacking direction. Therefore, the stress that can be generated in the first lower layer connecting via 761 and the second lower layer connecting via 762 is reduced, as compared with the case where the first lower layer connecting via 761 and the second lower layer connecting via 762 overlap in the stacking direction. Thus, it is possible to further improve the reliability.

Thirteenth Embodiment

A thirteenth embodiment will be described hereinafter. In the present embodiment, a roughened portion is formed on the insulating substrate 21 as compared with the ninth embodiment. Other configurations are the same as those of the ninth embodiment, and therefore the descriptions of the same configurations will be omitted.

Figure 23:
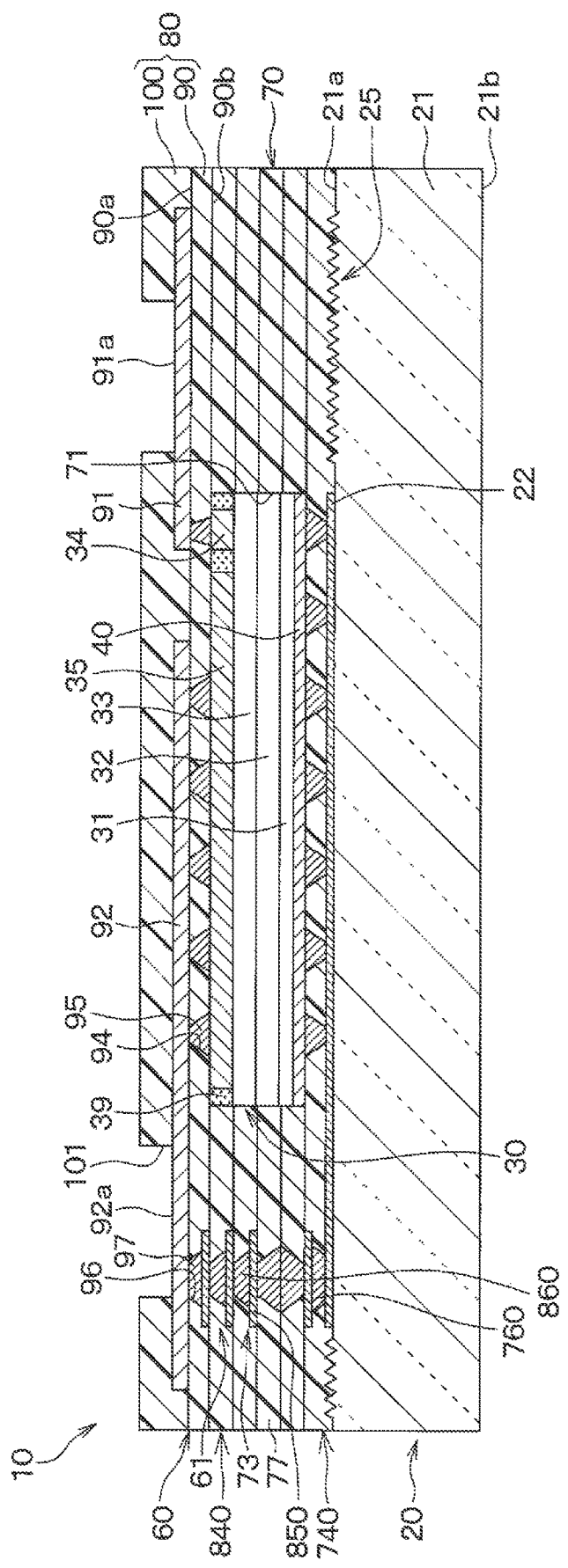
FIG. 23 is a cross-sectional view of a semiconductor package according to a thirteenth embodiment.

In the semiconductor package 10 of the present embodiment, as shown in FIG. 23, the insulating substrate 21 is formed with a roughened portion 25 in an area bonded to the sealing member 60. In the present embodiment, the roughened portion 25 is formed in a frame shape surrounding the portion of the insulating substrate 21 on which the first surface metal film 22 is formed. Such a roughened portion 25 is formed, for example, by subjecting the insulating substrate 21 to a laser treatment, a blast treatment, or the like.

According to this, since the roughened portion 25 is formed on the insulating substrate 21, the adhesion between the lower layer plate-shaped member 740 and the insulating substrate 21 can be improved in the area where the roughened portion 25 is formed. Therefore, it is possible to suppress the lower layer plate-shaped member 740 and the insulating substrate 21 from peeling off.

Modification of Thirteenth Embodiment

Figure 24:
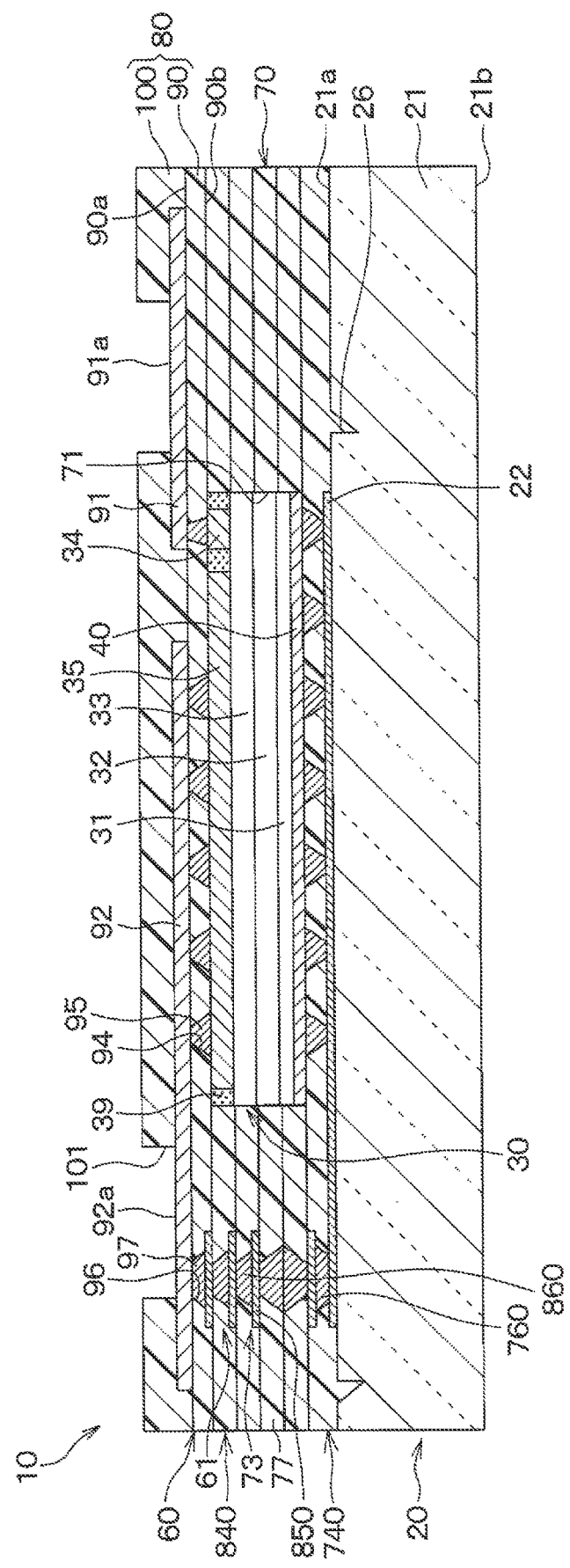
FIG. 24 is a cross-sectional view of a semiconductor package according to a modified example of the thirteenth embodiment.

A modification of the thirteenth embodiment will be described hereinafter. In place of the roughened portion 25 formed in the thirteenth embodiment, the insulating substrate 21 may be formed with a groove portion 26, as shown in FIG. 24. According to this, in the portion where the groove portion 26 is formed, the adhesion between the LCP film 77 constituting the lower layer plate-shaped member 740 and the insulating substrate 21 can be improved. Thus, the same effects as the twelfth embodiment described above can be achieved. Further, by forming the groove portion 26, if the peeling progresses from the interface between the lower layer plate-shaped member 740 and the insulating substrate 21, the groove portion 26 changes the traveling direction of the peeling. Therefore, the progress of peeling can be suppressed.

Fourteenth Embodiment

A fourteenth embodiment will be described hereinafter. In the present embodiment, a recess is formed in the insulating substrate 21 as compared with the first embodiment. Other configurations are the same as those of the first embodiment, and therefore the descriptions of the same configurations will be omitted.

Figure 25:
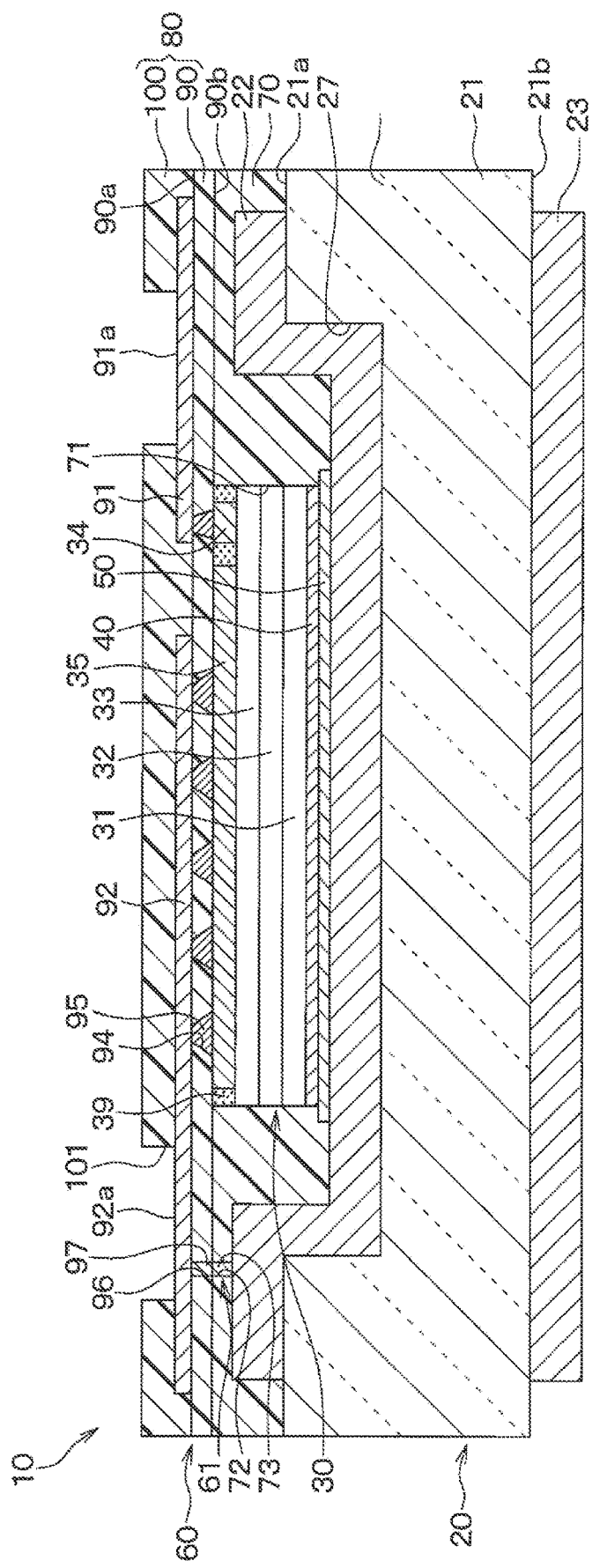
FIG. 25 is a cross-sectional view of a semiconductor package according to a fourteenth embodiment.

As shown in FIG. 25, the semiconductor package 10 of the present embodiment has a recessed portion 27 formed on the first surface 21a side of the insulating substrate 21. The recessed portion 27 has a bottom surface larger than the size of the flat surface of the semiconductor chip 30, and a depth shallower than the thickness of the semiconductor chip 30.

The first surface metal film 22 extends from the bottom surface of the recessed portion 27 to the periphery of the portion where the recessed portion 27 is formed. The first surface metal film 22 is connected to the lower connecting via 73 at a portion different from the portion where the recessed portion 27 is formed. The semiconductor chip 30 is arranged so that the back surface electrode 40 side is received in the recessed portion 27. However, the semiconductor chip 30 is received in the recessed portion 27 so that the side including the drain electrode 34 and the source electrode 35 protrudes from the recessed portion 27.

In such a semiconductor package 10, since the semiconductor chip 30 is arranged in the recessed portion 27 formed in the insulating substrate 21, the amount of resin of the sealing member 60 that seals the semiconductor chip 30 can be reduced. Therefore, the amount of LCP used, which tends to be more expensive than the insulating substrate 21, can be reduced, and the cost can be reduced.

Fifteenth Embodiment

A fifteenth embodiment will be described hereinafter. In the present embodiment, the intermediate layer pattern 850 is excluded from the intermediate layer plate-shaped member 840 of the ninth embodiment. Other configurations are the same as those of the ninth embodiment, and therefore the descriptions of the same configurations will be omitted.

Figure 26:
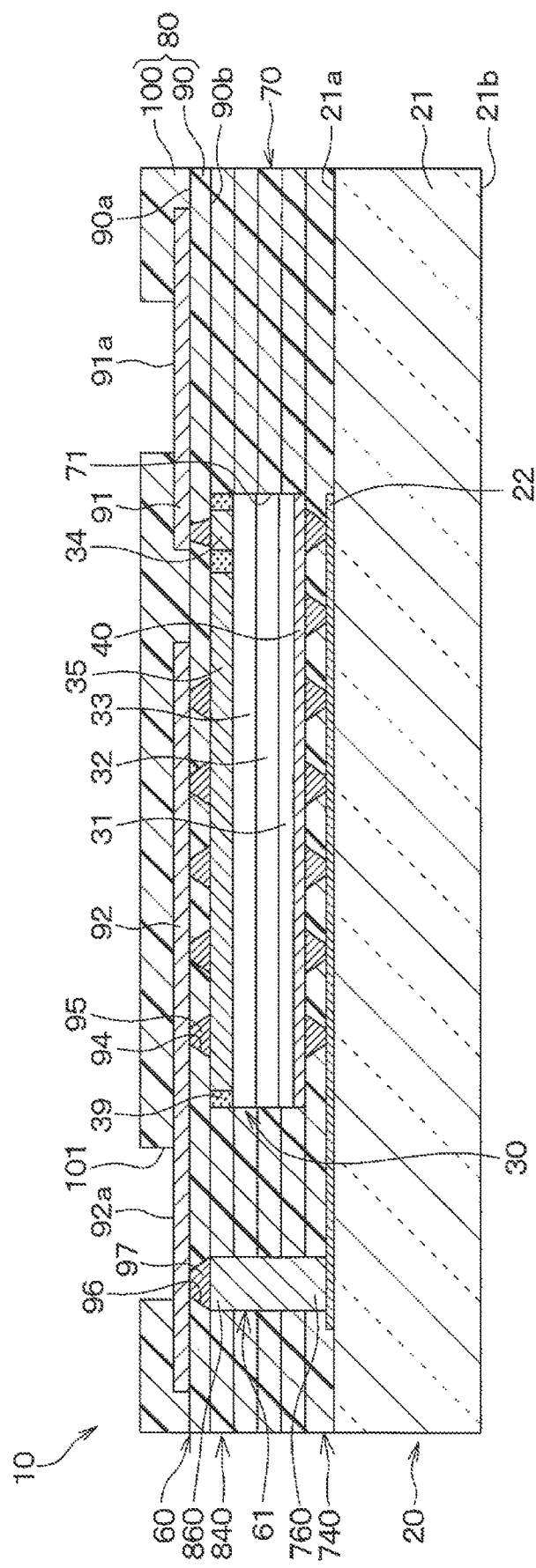
FIG. 26 is a cross-sectional view of a semiconductor package according to a fifteenth embodiment.

In the semiconductor package 10 of the present embodiment, as shown in FIG. 26, the intermediate layer pattern 850 is not formed in the intermediate layer plate-shaped member 840. The middle layer connecting vias 860 in the intermediate layer plate-shaped member 840 are directly connected to each other.

Such a semiconductor package 10 is manufactured, for example, as follows. That is, when the plate-shaped member constituent member 770 of FIG. 8A described in the second embodiment is prepared, the through hole 76a is not formed in the plate-shaped member constituent member 770 constituting the intermediate layer plate-shaped member 840, and the constituent body 76b is not arranged. Then, the plate-shaped member constituent member 770 constituting the intermediate layer plate-shaped member 840 and the plate-shaped member constituent member 770 constituting the lower layer plate-shaped member 740 are stacked and preliminarily integrated by temporary pressing or the like. Next, through holes 76a are collectively formed in the plate-shaped member constituent member 770 constituting the intermediate layer plate-shaped member 840 and the plate-shaped member constituent member 770 constituting the lower layer plate-shaped member 740 by using a laser, a drill, a punch, or the like. Subsequently, the constituent body 76b such as the conductive paste is arranged in the through holes 76a. As a result, the intermediate layer connecting via 860 formed in each intermediate layer plate-shaped member 840 is easily connected without forming the intermediate layer pattern 850 in the intermediate layer plate-shaped member 840.

According to this, since the intermediate layer pattern 850 in the intermediate layer plate-shaped member 840 can be reduced, the number of members can be reduced.

It should be noted that the configuration of the present embodiment can be applied to each of the embodiments descried hereinabove and each of the embodiments described hereinafter. For example, when the present embodiment is applied to the twelfth embodiment, it may be possible to delete the lower layer pattern 752 arranged between the second lower layer connecting via 762 formed in the second lower layer plate-shaped member 742 and the first lower layer connecting via 761 formed in the first lower layer plate-shaped member 741. In this case, the lower layer pattern 752 can be configured to have only a portion located below the semiconductor chip 30. That is, in the semiconductor package 10 of the present embodiment, the pattern 75 may be appropriately removed from the plate-shaped members 74 adjacent to each other in the stacking direction.

Sixteenth Embodiment

A sixteenth embodiment will be described hereinafter. In the present embodiment, the semiconductor chip 30 is formed with the vertical semiconductor element in the configuration of the ninth embodiment. That is, the present embodiment is combination of the ninth embodiment and the eighth embodiment. Other configurations are the same as those of the ninth embodiment, and therefore the descriptions of the same configurations will be omitted.

Figure 27:
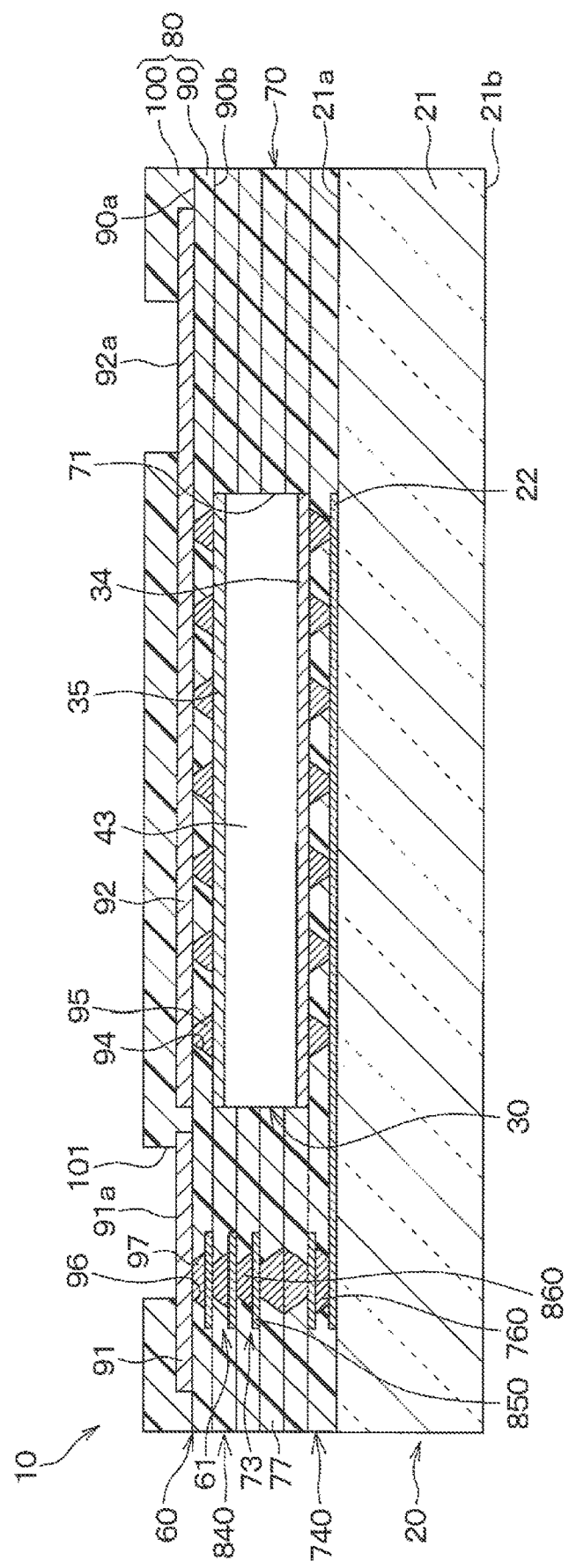
FIG. 27 is a cross-sectional view of a semiconductor package according to a sixteenth embodiment.

As shown in FIG. 27, in the semiconductor package 10 of the present embodiment, the semiconductor chip 30 is formed with the vertical semiconductor element similar to that of the eighth embodiment. Specifically, the semiconductor chip 30 is formed with the drain electrode 34 on the heat radiating member 20 side and the source electrode 35 on the opposite side to the heat radiating member 20. Further, the semiconductor chip 30 is formed with a gate wiring 37, a gate electrode 38, and the like on the opposite side of the heat radiating member 20 in a cross section different from that of FIG. 27.

In the semiconductor chip 30, the drain electrode 34 is connected to the first surface metal film 22 through the lower layer connecting via 760. In the present embodiment, the drain electrode 34 corresponds to the first electrode and the back surface electrode.

In this way, the sealing member 60 may be made of a plurality of plate-shaped members 74, as well as the semiconductor chip 30 may have the vertical semiconductor element.

Seventeenth Embodiment

A seventh embodiment will be described hereinafter. In the present embodiment, a capacitor is arranged in the sealing member 60 in the configuration of the sixteenth embodiment. Other configurations are the same as those of the sixteenth embodiment, and therefore the descriptions of the same configurations will be omitted.

Figure 28:
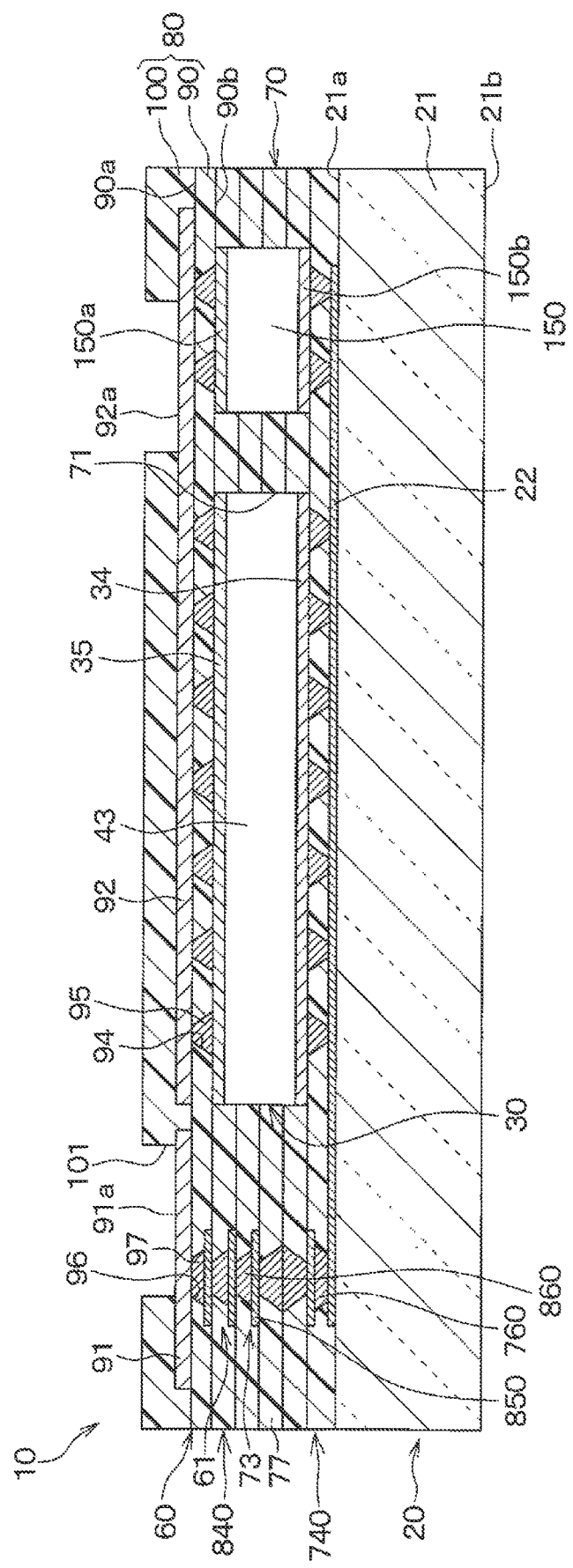
FIG. 28 is a cross-sectional view of a semiconductor package according to a seventeenth embodiment.

In the present embodiment, as shown in FIG. 28, a capacitor 150 having a pair of electrodes 150a and 150b is also arranged in the sealing member 60. Specifically, the capacitor 150 is located in the vicinity of the semiconductor chip 30 and on the side of the semiconductor chip 30. Further, the capacitor 150 is arranged so that one electrode 150a is located on the first sealing member 90 side and the other electrode 150b is located on the lower layer plate-shaped member 740 side. The capacitor 150 of the present embodiment is made of silicon or the like, and has a thickness substantially equal to the thickness of the semiconductor chip 30.

The source pattern 92 formed in the first sealing member 90 extends up to a position facing the capacitor 150. The first surface metal film 22 formed on the insulating substrate 21 extends up to a position facing the capacitor 150.

The one electrode 150a of the capacitor 150 is connected to the source pattern 92 through the upper connecting via 95, and is also connected to the first surface metal film 22, which is connected to the drain electrode 34 of the semiconductor chip 30, via the lower layer connecting via 760.

In the present embodiment, the source pattern 92, the upper connecting via 95, the first surface metal film 22, and the lower layer connecting via 760 correspond to the wiring layer. Such a semiconductor package 10 is manufactured by arranging the capacitor 150 in the plate-shaped member constituent member 770, similarly to the semiconductor chip 30.

In the semiconductor package 10 of the present embodiment, since the capacitor 150 is arranged in the sealing member 60, the semiconductor chip 30 and the capacitor 150 can be arranged close to each other, and thus the wiring layer connecting the semiconductor chip 30 and the capacitor 150 can be shortened. Therefore, it is possible to reduce the parasitic inductance.

Further, the semiconductor package 10 of the present embodiment is configured by arranging the capacitor 150 in the sealing member 60 similarly to the semiconductor chip 30. Therefore, as compared with the case where the capacitor 150 is arranged at another place and connected to the semiconductor chip 30, the structure can be simplified and the manufacturing process can be simplified.

Although the example in which the capacitor 150 has the same thickness as the semiconductor chip 30 has been described above, the capacitor 150 may be formed thinner than the semiconductor chip 30 as another example. In this case, for example, the intermediate layer pattern 850 and the intermediate layer connecting via 860 may be appropriately formed in the intermediate layer plate-shaped member 840 arranged between the one electrode 150a of the capacitor 150 and the source pattern 92, thereby to connect the one electrode 150a of the capacitor 150 and the source pattern 92.

Eighteenth Embodiment

An eighteenth embodiment will be described hereinafter. In the present embodiment, a heat radiating member is added on the second sealing member 100 of the semiconductor package 10 in the configuration of the ninth embodiment. Other configurations are the same as those of the ninth embodiment, and therefore the descriptions of the same configurations will be omitted.

Figure 29:
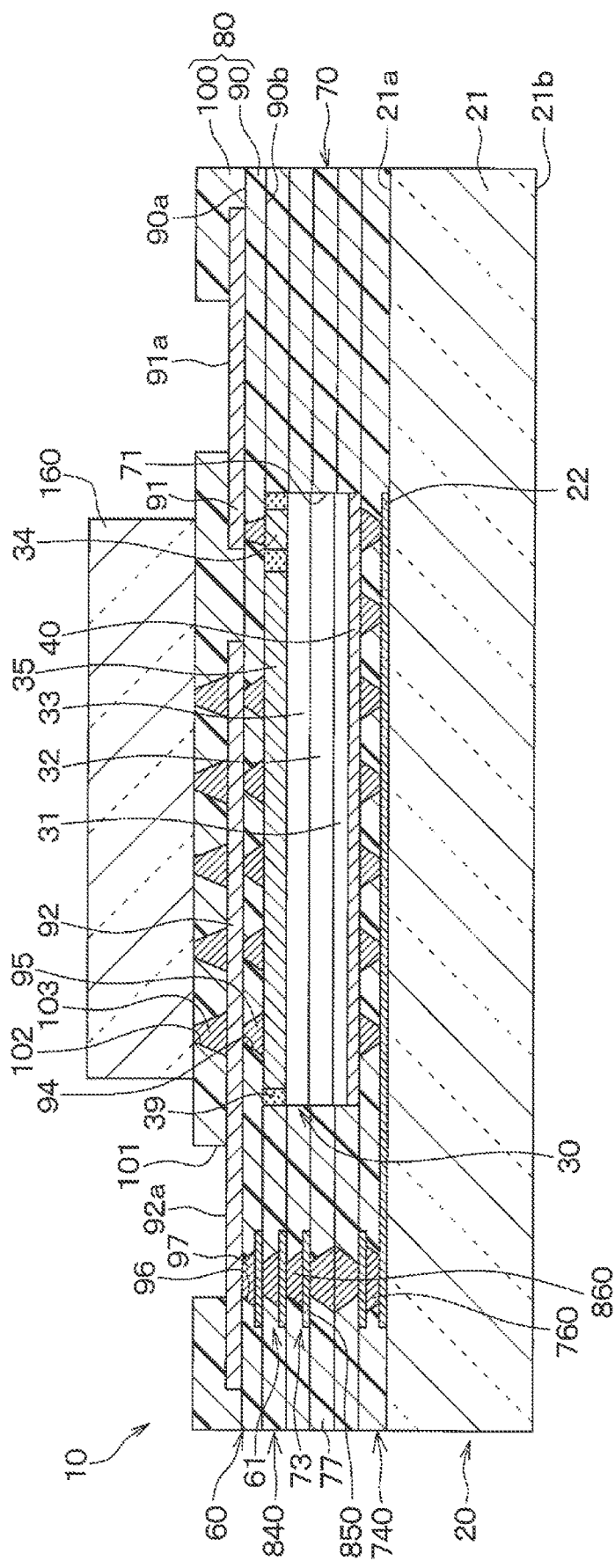
FIG. 29 is a cross-sectional view of a semiconductor package according to an eighteenth embodiment.

In the semiconductor package 10 of the present embodiment, as shown in FIG. 29, a heat radiating member 160 is also arranged on the second sealing member 100. In the present embodiment, the heat radiating member 160 is arranged in a portion of the second sealing member 100 different from the portion where the contact hole 101 is formed, while facing the semiconductor chip 30.

In the second sealing member 100, an upper connecting via 103 is formed in a through hole 102 penetrating the second sealing member 100 so as to connect the heat radiating member 160 and the source pattern 92. As a result, the heat radiating member 160 and the source pattern 92 are thermally connected to each other.

According to this, the heat generated by the semiconductor chip 30 can be radiated from the heat radiating member 160 as well, so the heat radiating property can be further improved.

Nineteenth Embodiment

A nineteenth embodiment will be described hereinafter. In the present embodiment, a high heat radiating member is added on the heat radiating member 20 side of the semiconductor package 10 in the configuration of the ninth embodiment. Other configurations are the same as those of the ninth embodiment, and therefore the descriptions of the same configurations will be omitted.

Figure 30:
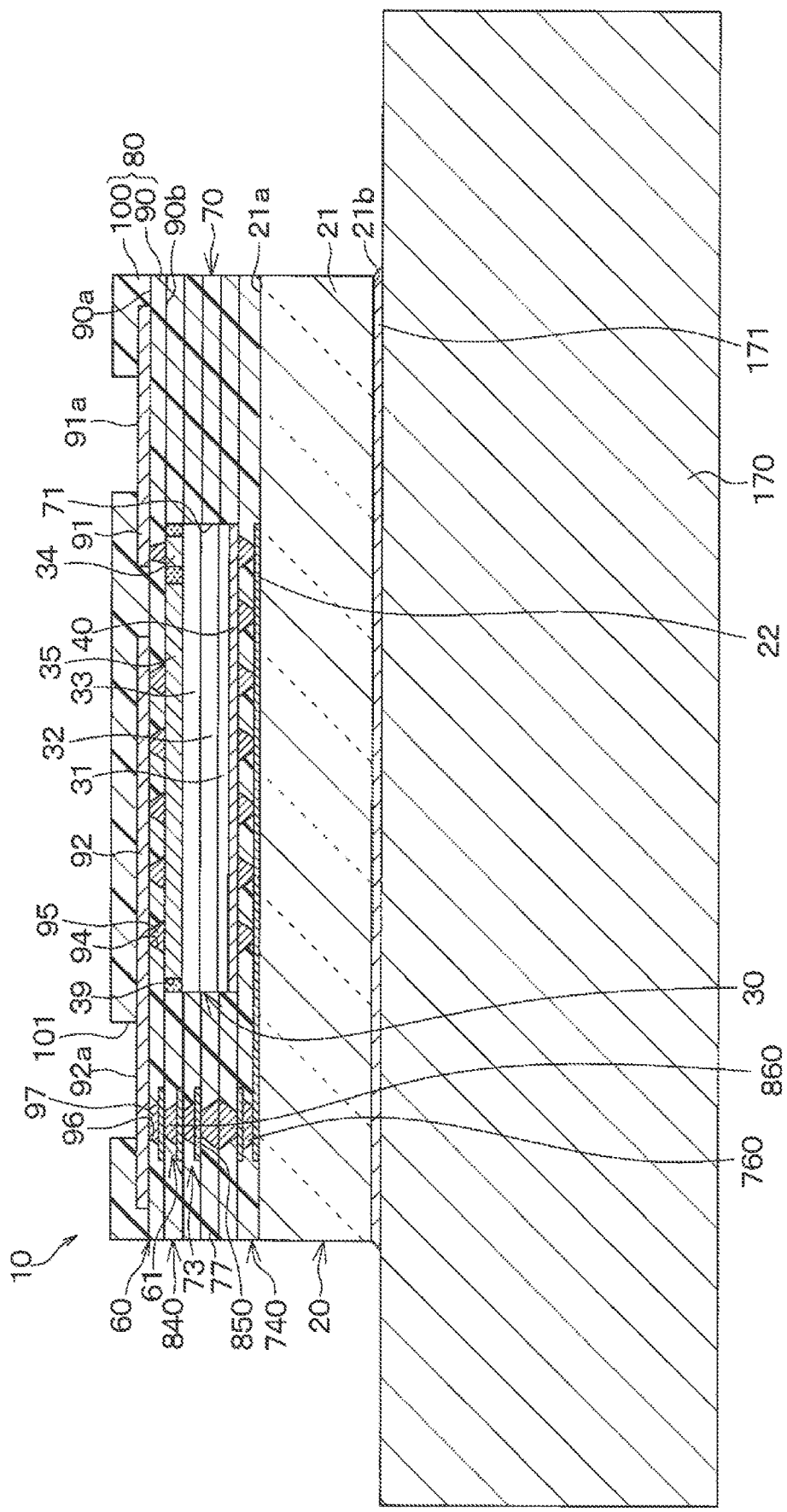
FIG. 30 is a cross-sectional view of a semiconductor package according to a nineteenth embodiment.

As shown in FIG. 30, the semiconductor package 10 of the present embodiment has a high heat radiating member 170 on the second surface 21b of the insulating substrate 21 of the heat radiating member 20. The high heat radiating member 170 is made of a material having a higher thermal conductivity than that of the insulating substrate 21. The high heat radiating member 170 of the present embodiment is larger in the size in the planar direction than the heat radiating member 20. For example, the high heat radiating member 170 is made of a metal material such as copper or aluminum.

The insulating substrate 21 and the high heat radiating member 170 are connected by a bonding member 171 such as a sintered body containing silver tin as a main component. The insulating substrate 21 and the high heat radiating member 170 may be connected through a covalent bond in which active groups are bonded to each other.

According to this, heat can be radiated from the heat radiating member 20 via the high heat radiating member 170, so the heat radiating property can be further improved. Further, in the present embodiment, since the size of the high heat radiating member 170 in the planar direction is larger than that of the insulating substrate 21. Therefore, the heat radiating property can be further improved, as compared with the configuration in which the high heat radiating member 170 is equal to or smaller than the insulating substrate 21 in the planar direction. In a case where the semiconductor package 10 of the present embodiment is mounted on the cooler 140 as in the seventh embodiment, the high heat radiating member 170 is mounted on the cooler 140 via a connecting member 141 such as thermal paste. Therefore, by increasing the size of the high heat radiating member 170 in the planar direction, the contact area between the high heat radiating member 170 and the connecting member 141 can be increased, and thus the heat radiating property can be further improved.

Modification of Nineteenth Embodiment

A modification of the nineteenth embodiment will be described hereinafter. In the nineteenth embodiment described above, the high heat radiating member 170 may be arranged on the back surface electrode 40 side of the semiconductor chip 30, without using the insulating substrate 21, as the heat radiating member 20. In this case, the high heat radiating member 170 has conductivity when it is made of metal. Therefore, when the heat radiating member 20 is provided by the high heat radiating member 170, the LCP film or the like may be arranged between the high heat radiating member 170 and the first surface metal film 22.

In the nineteenth embodiment described above, the second surface metal film 23 may be arranged on the second surface 21b of the insulating substrate 21 and the thickness of the second surface metal film 23 may be increased as in the first embodiment, so that the second surface metal film 23 functions as the high heat radiating member 170.

Further, in the nineteenth embodiment described above, the high heat radiating member 170 may have a smaller size in the planar direction than the insulating substrate 21.

Twentieth Embodiment

A twentieth embodiment will be described hereinafter. In the present embodiment, the semiconductor package 10 has two semiconductor chips 30 formed with the vertical semiconductor elements in the configuration of the sixteenth embodiment described above. Other configurations are the same as those of the sixteenth embodiment, and therefore the descriptions of the same configurations will be omitted.

Figure 31:
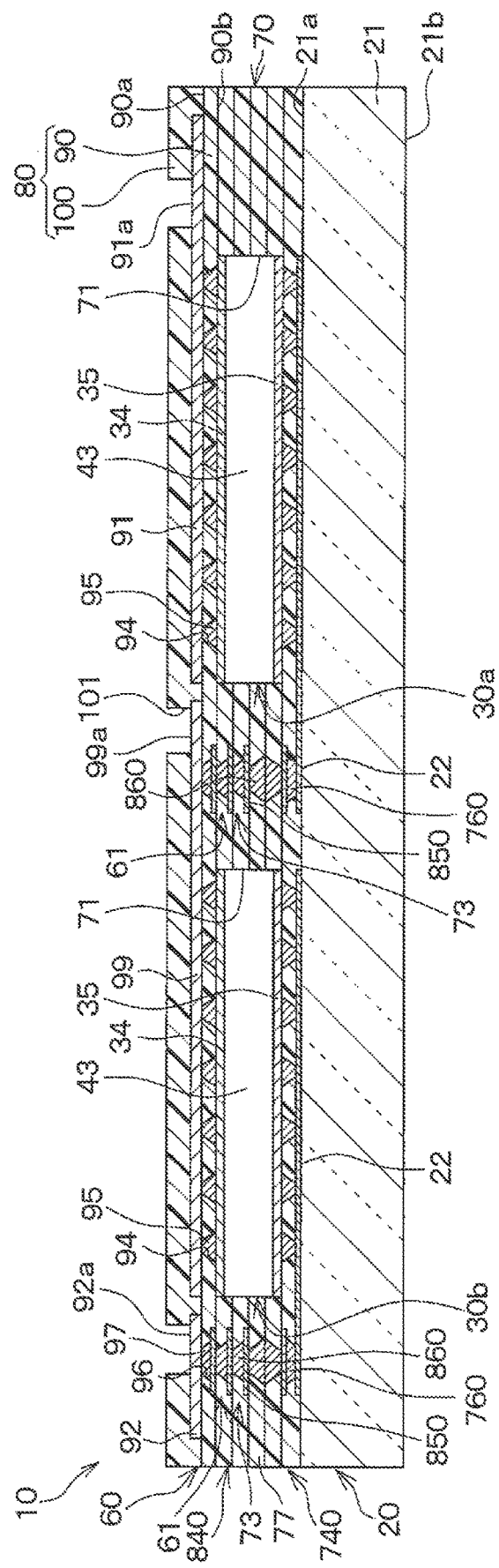
FIG. 31 is a cross-sectional view of a semiconductor package according to a twentieth embodiment.

As shown in FIG. 31, the semiconductor package 10 of the present embodiment is a so-called 2-in-1 package in which two semiconductor chips 30 are integrally sealed by the sealing member 60, as in the seventh embodiment. The two semiconductor chips 30 each have the same configuration as that of the sixteenth embodiment. That is, each semiconductor chip 30 is formed with the drain electrode 34 on one side and the source electrode 35 and the gate electrode 38 on the other side. Hereinafter, one semiconductor chip 30 will be referred to as a first semiconductor chip 30a, and the other semiconductor chip 30 will be referred to as a second semiconductor chip 30b. In FIG. 31, the first semiconductor chip 30a is shown on the right side, and the second semiconductor chip 30b is shown on the left side. The first semiconductor chip 30a and the second semiconductor chip 30b are arranged so that the source electrode 35 and the gate electrode 38 are located on the heat radiating member 20 side and the drain electrode 34 is located on the side opposite to the heat radiating member 20. The gate electrode 38 is located in a cross section different from that shown in FIG. 31.

The first sealing member 90 and the second sealing member 100 have the same configurations as those of the seventh embodiment. That is, the first sealing member 90 is formed with the drain pattern 91 connected to the drain electrode 34 of the first semiconductor chip 30a. The first sealing member 90 is formed with the connection pattern 99 for connecting the source electrode 35 of the first semiconductor chip 30a and the drain electrode 34 of the second semiconductor chip 30b. The first sealing member 90 is formed with the source pattern 92 connected to the source electrode 35 of the second semiconductor chip 30b.

Further, the first sealing member 90 is formed with the drain pattern 91, the source pattern 92, and the upper connecting via 95 connected to the connection pattern 99, respectively. The first sealing member 90 is formed with the gate pattern 93 connected to the gate electrode 38 of the first semiconductor chip 30a and the upper connecting via 95 connected to the gate pattern 93, in a cross section different from that shown in FIG. 31. The first sealing member 90 is formed with the gate pattern 93 connected to the gate electrode 38 of the second semiconductor chip 30b and the upper connecting via 95 connected to the gate pattern 93, in a cross section different from that shown in FIG. 31.

The second sealing member 100 is formed with the contact holes 101 that expose a part of the drain pattern 91, a part of the source pattern 92, and a part of the connection pattern 99. The parts of the drain pattern 91, the source pattern 92, and the connection pattern 99 exposed from the contact holes 101 serve as the drain pad 91a, the source pad 92a, and the connection pad 99a. Further, the second sealing member 100 is formed with the contact hole 101 to expose a part of the gate pattern 93, in a cross section different from that shown in FIG. 31. The part of the gate pattern 93 exposed from the contact hole 101 serves as the gate pad 93a.

The first surface metal film 22 is formed in the area facing the first semiconductor chip 30a and in the area facing the second semiconductor chip 30b. The part of the first surface metal film 22 facing the first semiconductor chip 30a and the part of the first surface metal film 22 facing the second semiconductor chip 30b are separated from each other. Further, the part of the first surface metal film 22 facing the first semiconductor chip 30a has a portion facing the source electrode 35 and a portion facing the gate electrode 38, and these portions are separated from each other. The part of the first surface metal film 22 facing the second semiconductor chip 30b has a portion facing the source electrode 35 and a portion facing the gate electrode 38, and these portions are separated from each other.

The source electrode 35 of the first semiconductor chip 30a is connected to the first surface metal film 22 facing the source electrode 35 through the lower layer connecting via 760. The source electrode 35 of the second semiconductor chip 30b is connected to the first surface metal film 22 facing the source electrode 35 through the lower layer connecting via 760. Further, the gate electrode 38 of the first semiconductor chip 30a is connected to the first surface metal film 22 facing the gate electrode 38 through the lower layer connecting via 760, in a cross section different from that shown in FIG. 31. The gate electrode 38 of the second semiconductor chip 30b is connected to the first surface metal film 22 facing the gate electrode 38 through the lower layer connecting via 760, in a cross section different from that shown in FIG. 31.

The first surface metal film 220 facing the first semiconductor chip 30a extends up to the position outside of the first semiconductor chip 30a when viewed in the stacking direction. Similarly, the first surface metal film 22 facing the second semiconductor chip 30b extends up to the position outside of the second semiconductor chip 30b when viewed in the stacking direction.

The sealing member 60 is formed with a connecting via 61 that connects the connection pattern 99 and the first surface metal film 22 connected to the source electrode 35 of the first semiconductor chip 30a. The sealing member 60 is formed with a connecting via 61 for connecting the source pattern 92 and the first surface metal film 22 connected to the source electrode 35 of the second semiconductor chip 30b. Further, the sealing member 60 is formed with a connecting via 61 for connecting the first surface metal film 22 connected to the gate electrode 38 of the first semiconductor chip 30a and the gate pad 93a, in a cross section different from that shown in FIG. 31. The sealing member 60 is formed with a connecting via 61 for connecting the first surface metal film 22 connected to the gate electrode 38 of the second semiconductor chip 30b and the gate pad 93a, in a cross section different from that shown in FIG. 31.

Such a semiconductor package 10 is used, for example, in a DC/DC converter circuit or an inverter circuit so that the first semiconductor chip 30a constitutes an upper arm and the second semiconductor chip 30b constitutes a lower arm. In this case, the drain pad 91a serves as the higher voltage side pad, the source pad 92a serves as the lower voltage side pad, and the connection pad 99a serves as the output pad.

As described above, the semiconductor package 10 may be configured such that the two semiconductor chips 30 each formed with the vertical semiconductor element are integrally sealed by the sealing member 60. Further, in the semiconductor package 10, since the first semiconductor chip 30a and the second semiconductor chip 30b can be arranged close to each other, the wiring layer connecting the first semiconductor chip 30a and the second semiconductor chip 30b can be shortened. Therefore, it is possible to reduce the parasitic inductance.

In the present embodiment, as an example, the first semiconductor chip 30a and the second semiconductor chip 30b are arranged such that the drain electrode 34 is located on the opposite side of the heat radiating member 20, and the source electrode 35, the gate electrode 38, and the like are located on the heat radiating member 20 side. As another example, the first semiconductor chip 30a and the second semiconductor chip 30b may be arranged such that the source electrode 35, the gate electrode 38, and the like are located on the opposite side of the heat radiating member 20, and the drain electrode 34 is located on the heat radiating member 20 side. In such a configuration, the connection relationship between the first surface metal film 22, the lower layer connecting via 760 and the connecting via 61 formed in the sealing member 60 may be appropriately adjusted so that the connection relationship between the pads 91a, 92a, 93a, 99a and the first semiconductor chip 30a and the second semiconductor chip 30b has the above-mentioned relationship.

Twenty-First Embodiment

A twenty-first embodiment will be described hereinafter. In the present embodiment, the arrangement of the first semiconductor chip 30a and the second semiconductor chip 30b is modified from that of the twentieth embodiment described above. Other configurations are the same as those of the twentieth embodiment, and therefore the descriptions of the same configurations will be omitted.

Figure 32:
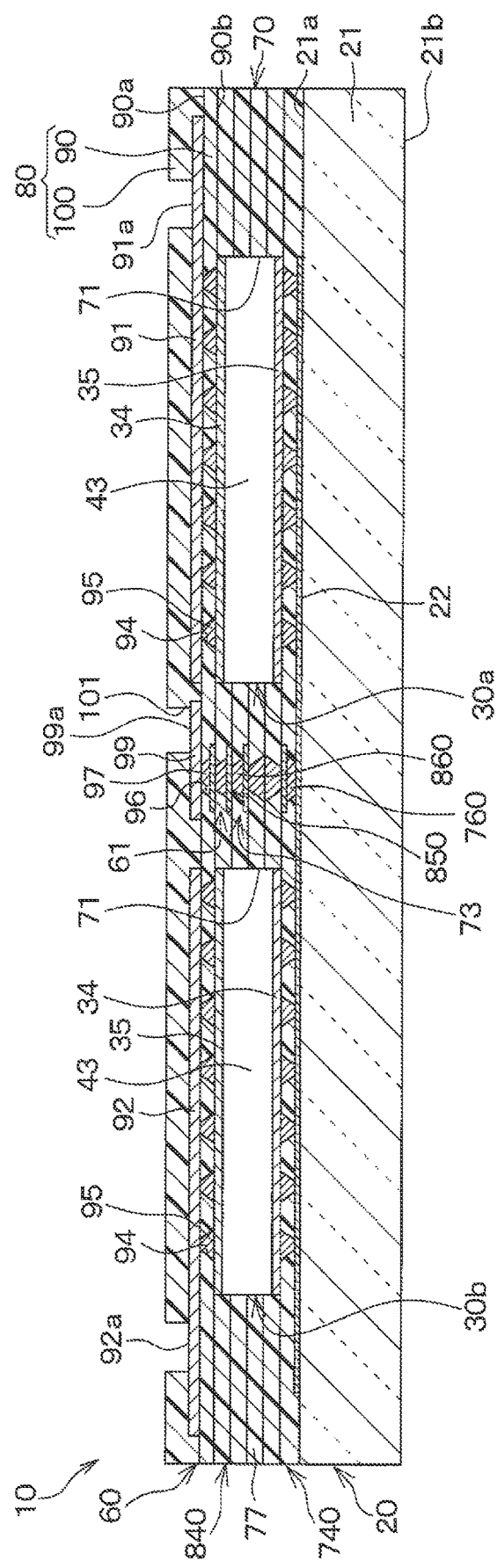
FIG. 32 is a cross-sectional view of a semiconductor package according to a twenty-first embodiment.

In the semiconductor package 10 of the present embodiment, as shown in FIG. 32, the first semiconductor chip 30a is arranged such that the drain electrode 34 is located on the side opposite to the heat radiating member 20, and the source electrode 35 and the gate electrode 38 are located on the heat radiating member 20 side. On the other hand, the second semiconductor chip 30b is arranged such that the drain electrode 34 is located on the heat radiating member 20 side, and the source electrode 35, the gate electrode 38, and the like are located on the opposite side of the heat radiating member 20. That is, the first semiconductor chip 30a and the second semiconductor chip 30b are arranged in opposite directions.

Further, the first surface metal film 22 formed on the insulating substrate 21 has a part facing the source electrode 35 of the first semiconductor chip 30a and a part facing the drain electrode 34 of the second semiconductor chip 30b, and these parts are connected to each other. The source electrode 35 of the first semiconductor chip 30a and the drain electrode 34 of the second semiconductor chip 30b are connected to a common first surface metal film 22 through the lower layer connecting via 760.

The drain electrode 34 of the first semiconductor chip 30a is connected to the drain pattern 91 formed in the first sealing member 90 through the upper connecting via 95. The source electrode 35 of the second semiconductor chip 30b is connected to the source pattern 92 formed in the first sealing member 90 through the upper connecting via 95. The gate electrode 38 of the second semiconductor chip 30b is connected to the gate pattern 93 formed in the first sealing member 90 through the upper connecting via 95, in a cross section different from that shown in FIG. 32.

The sealing member 60 is formed with a connecting via 61 to connect the connection pattern 99 and the first surface metal film 22 connected to the source electrode 35 of the first semiconductor chip 30a and the drain electrode 34 of the second semiconductor chip 30b.

As described above, the first semiconductor chip 30a and the second semiconductor chip 30b may be arranged in opposite directions. In such a semiconductor package 10, the source electrode 35 of the first semiconductor chip 30a and the drain electrode 34 of the second semiconductor chip 30b are connected only through the first surface metal film 22 and the lower layer connecting via 760, so the structure can be simplified.

Twenty-Second Embodiment

A twenty-second embodiment will be described hereinafter. In the present embodiment, the arrangement of the pads 91a, 92a, and 93a of the semiconductor package 10 is modified from that of the ninth embodiment. Other configurations are the same as those of the ninth embodiment, and therefore the descriptions of the same configurations will be omitted.

Figure 33:
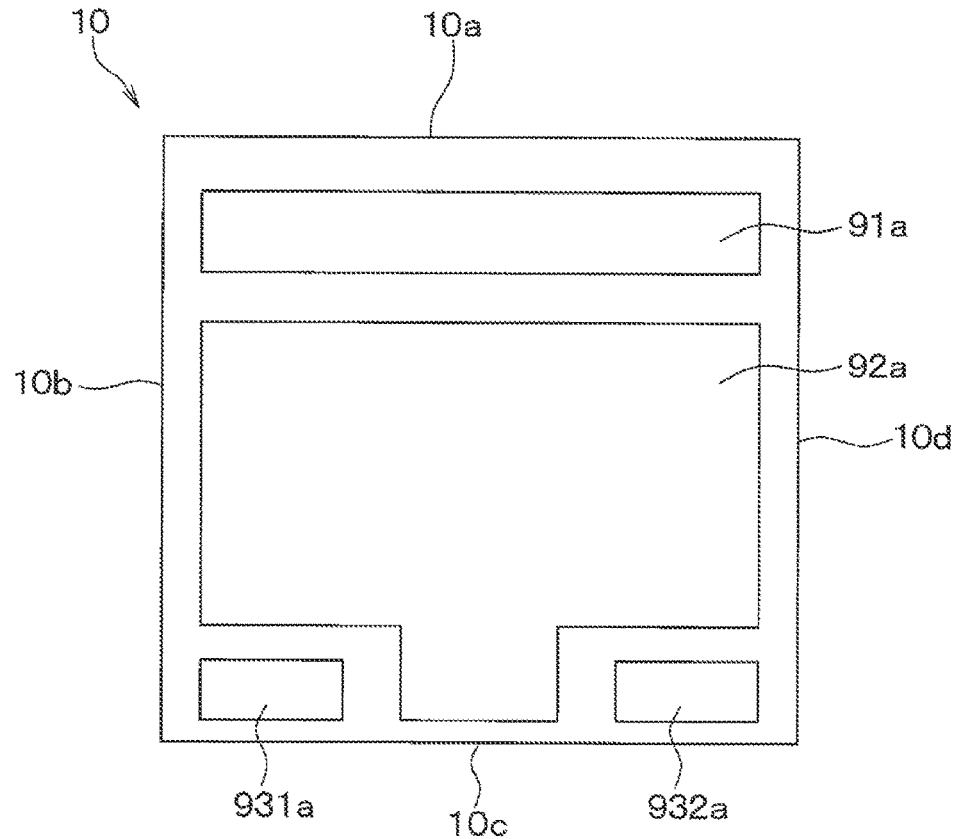
FIG. 33 is a plan view of a semiconductor package according to a twenty-second embodiment.

The semiconductor package 10 of the present embodiment has a substantially rectangular shape having first to fourth sides 10a to 10d when viewed in the stacking direction, as shown in FIG. 33. The first to fourth sides 10a to 10d form two sets of opposed sides. The semiconductor package 10 has a first gate pad 931a and a second gate pad 932a as the gate pad 93a. The first gate pad 931a and the second gate pad 932a are located in the outer edge portion of the semiconductor package 10.

Specifically, the first gate pad 931a is arranged near the corner where the second side 10b and the third side 10c are connected to each other, and the second gate pad 932a is arranged near the corner where the third side 10c and the fourth side 10d are connected to each other. That is, the first gate pad 931a and the second gate pad 932a are arranged at opposite portions in the outer edge portion, respectively. More specifically, the source pad 92a is arranged up to the vicinity of the third side 10c, and the first gate pad 931a and the second gate pad 932a are arranged so as to sandwich the source pad 92a. The gate electrode 38 of the semiconductor chip 30 is connected to the first gate pad 931a and the second gate pad 932a.

In such a semiconductor package 10, the first gate pad 931a and the second gate pad 932a of the semiconductor package 10 are arranged at opposite portions of the outer edge portion, respectively. Therefore, when the semiconductor package 10 is connected to the printed circuit board 110, one of the gate pads 931a and 932a may be connected to the printed circuit board 110, so that the degree of freedom of wiring on the printed circuit board 110 side can be improved. In this case, for example, when connecting the first gate pad 931a and the printed circuit board 110, the length of a wiring layer connecting the first gate pad 931a and a drive circuit for applying a predetermined voltage to the first gate pad 931a can be shortened, thereby to suppress the variation in drive voltage. Further, when the semiconductor package 10 is connected to the printed circuit board 110, one of the gate pads 931a and 932a may be connected to the printed circuit board 110, so that the wiring on the printed circuit board 110 side can be easily routed. For example, it is not necessary to route the wiring of the printed circuit board 110 in multiple layers. As a result, it is possible to suppress the influence of the extra magnetic flux.

Twenty-Third Embodiment

A twenty-third embodiment will be described hereinafter. The present embodiment is configured by combining the twentieth embodiment with the twenty-second embodiment, and the arrangements of the pads 91a, 92a, 93a, and 99a of the semiconductor package 10 are modified. Other configurations are the same as those of the twenty-second embodiment, and therefore the descriptions of the same configurations will be omitted.

Figure 34:
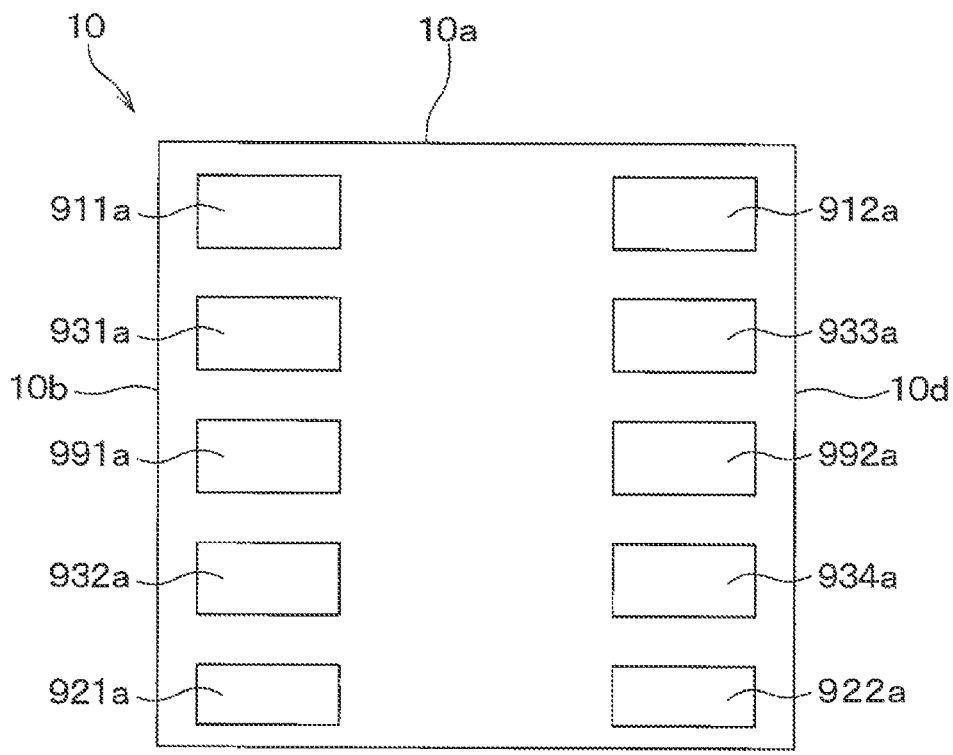
FIG. 34 is a plan view of a semiconductor package according to a twenty-third embodiment.

The semiconductor package 10 of the present embodiment is configured to have the first semiconductor chip 30a and the second semiconductor chip 30b as in the twenty-second embodiment. When viewed in the stacking direction, as shown in FIG. 34, the semiconductor package 10 has pads 911a, 931a, 991a, 932a, 921a, 912a, 933a, 992a, 934a, 922a arranged along the outer edge.

Specifically, in the semiconductor package 10, a first drain pad 911a, a first gate pad 931a, a first connection pad 991a, a second gate pad 932a, and a first source pad 921a are arranged side by side in order along the second side 10b. Further, a second drain pad 912a, a third gate pad 933a, a second connection pad 992a, a fourth gate pad 934a, and a second source pad 922a are arranged side by side in order along the fourth side 10d. That is, the pads 911a, 931a, 991a, 923a, 921a, 912a, 933a, 992a, 934a, and 922a are arranged at opposite portions of the outer edge portion of the semiconductor package 10.

Although not particularly shown, the drain electrode 34 of the first semiconductor chip 30a is connected to the first drain pad 911a and the second drain pad 912a. The source electrode 35 of the second semiconductor chip 30b is connected to the first source pad 921a and the second source pad 922a. The source electrode 35 of the first semiconductor chip 30a and the drain electrode 34 of the second semiconductor chip 30b are connected to the first connection pad 991a and the second connection pad 992a. The gate electrode 38 of the first semiconductor chip 30a is connected to the first gate pad 931a and the third gate pad 933a. The gate electrode 38 of the second semiconductor chip 30b is connected to the second gate pad 932a and the fourth gate pad 934a.

According to the present embodiment described above, in the semiconductor package 10, the pads 911a, 931a, 991a, 932a, 921a, 912a, 933a, 992a, 934a, and 922a are arranged on the opposite portions of the outer edge portions, respectively. The electrodes 34, 35, and 38 of the first semiconductor chip 30a are electrically connected to the pads 911a, 931a, and 991a arranged side by side along the second side 10b, and are electrically connected to the pads 912a, 933a, and 992a arranged side by side along the fourth side 10d. Similarly, the electrodes 34, 35, 38 of the second semiconductor chip 30b are electrically connected to the pads 991a, 932a, 921a arranged side by side along the second side 10b, and are electrically connected to the pads 992a, 934a, and 922a arranged side by side along the fourth side 10d.

Therefore, the semiconductor package 10 of the present embodiment can form the DC/DC converter circuit or the inverter circuit by connecting the pads 911a, 931a, 991a, 932a and 921a arranged along the second side 10b or the pads 912a, 933a, 992a, 934a and 922a arranged along the fourth side 10d to the printed board 110. Therefore, the degree of freedom of wiring on the printed circuit board 110 side can be improved, and the same effects as those of the twenty-second embodiment can be achieved.

It should be noted that such a semiconductor package 10 can also be employed, for example, in a 4-in-1 package or a 6-in-1 package.

Twenty-Fourth Embodiment

A twenty-fourth embodiment will be described hereinafter. In the present embodiment, the arrangement of the gate pad 93a is modified from that of the twenty-second embodiment. Other configurations are the same as those of the twenty-second embodiment, and therefore the descriptions of the same configurations will be omitted.

Figure 35:
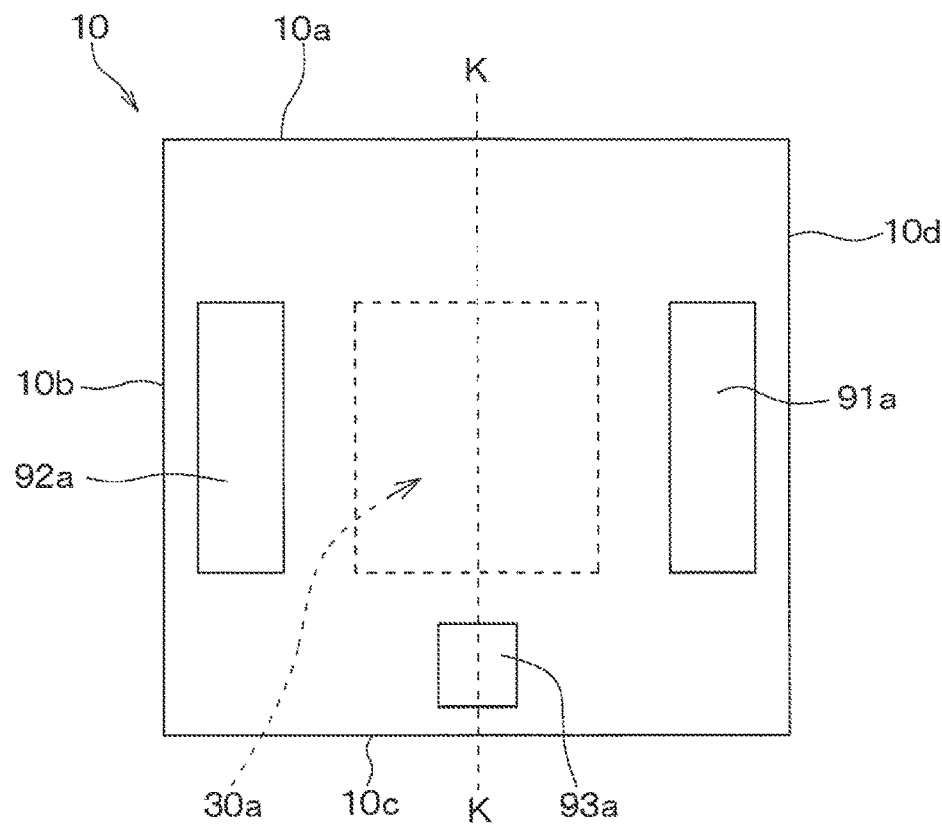
FIG. 35 is a plan view of the semiconductor package according to a twenty-fourth embodiment.

As shown in FIG. 35, in the semiconductor package 10 of the present embodiment, the semiconductor chip 30 is arranged at a substantially central portion when viewed in the stacking direction. In the semiconductor package 10, the drain pad 91a and the source pad 92a are symmetrically arranged with respect to the virtual line K extending in one direction through the center of the semiconductor chip 30. In FIG. 35, the drain pad 91a is arranged along the fourth side 10d, and the source pad 92a is arranged along the second side 10b. The gate pad 93a is arranged on the third side 10c side and is arranged so as to intersect the virtual line K. That is, in the semiconductor package 10 of the present embodiment, there is only one gate pad 93a.

Figure 36:
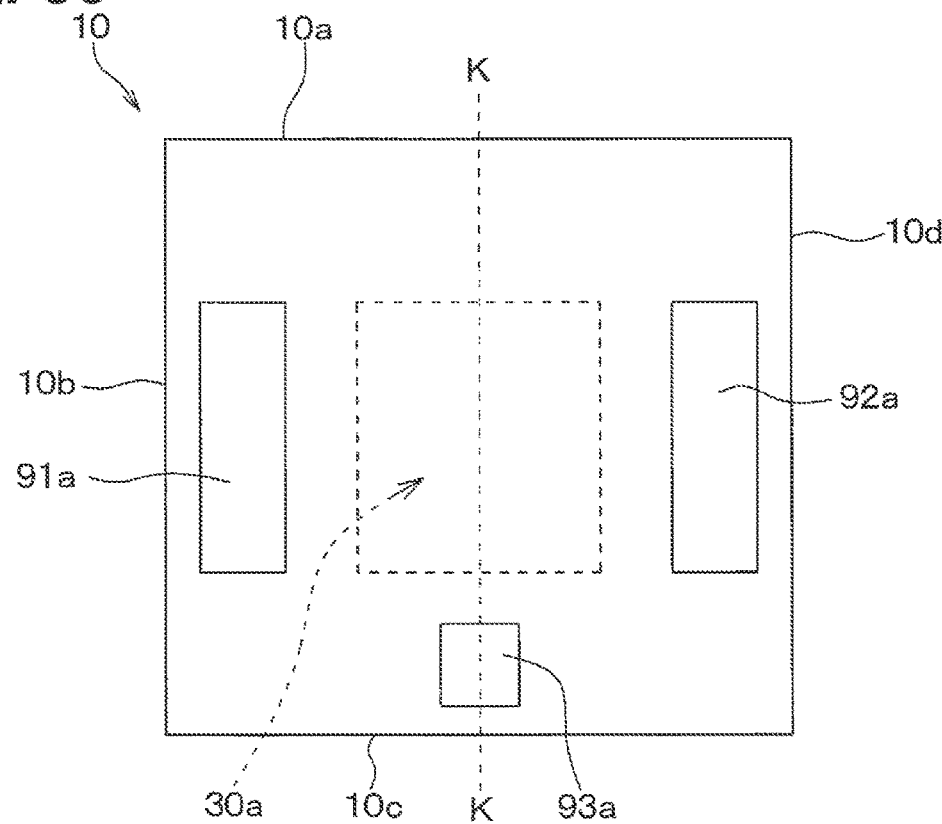
FIG. 36 is a plan view of the semiconductor package according to the twenty-fourth embodiment.

According to the present embodiment described above, when the electronic device 1 is configured together with the printed circuit board 110 and the like as in the seventh embodiment, the degree of freedom of wiring on the printed circuit board 110 side can be improved. That is, when the electronic device 1 is configured, the semiconductor package 10 as shown in FIG. 36 is prepared together with the semiconductor package 10 shown in FIG. 35. The semiconductor package 10 shown in FIG. 36 is obtained by reversing the arrangement of the drain pad 91a and the source pad 92a with respect to the semiconductor package 10 shown in FIG. 35. That is, the drain pad 91a is arranged along the second side 10b, and the source pad 92a is arranged along the fourth side 10d. Note that, also in the semiconductor package 10 shown in FIG. 36, there is only one gate pad 93a.

When the electronic device 1 is configured, either the semiconductor package 10 shown in FIG. 35 or the semiconductor package 10 shown in FIG. 36 is used according to the restrictions on the printed circuit board 110 side. Therefore, the degree of freedom of wiring on the printed circuit board 110 side can be improved. In other words, the versatility of the semiconductor package 10 can be improved. Further, in the present embodiment, even if the semiconductor package 10 is provided with only one gate pad 93a as described above, the degree of freedom of wiring on the printed circuit board 110 side can be improved. Therefore, as compared with the case where the two gate pads 93a are arranged in the semiconductor package 10, the degree of freedom of wiring on the printed circuit board 110 side can be improved while reducing the size of the semiconductor package 10.

Although not particularly shown, even in the semiconductor chip 30 formed with a vertical semiconductor element, the portion where the source electrode 35 can be arranged can be enlarged by using one gate electrode 38. Therefore, in such a semiconductor chip 30, it becomes easy to increase the effective region to allow a current to flow, and it is possible to reduce the on-resistance. In other words, when the semiconductor chip 30 having the same on-resistance is configured, the size of the semiconductor chip 30 can be reduced.

Twenty-Fifth Embodiment

A twenty-fifth embodiment will be described hereinafter. In the present embodiment, two capacitors are arranged in the configuration of the twentieth embodiment. Other configurations are the same as those of the twentieth embodiment, and therefore the descriptions of the same configurations will be omitted.

Figure 37:
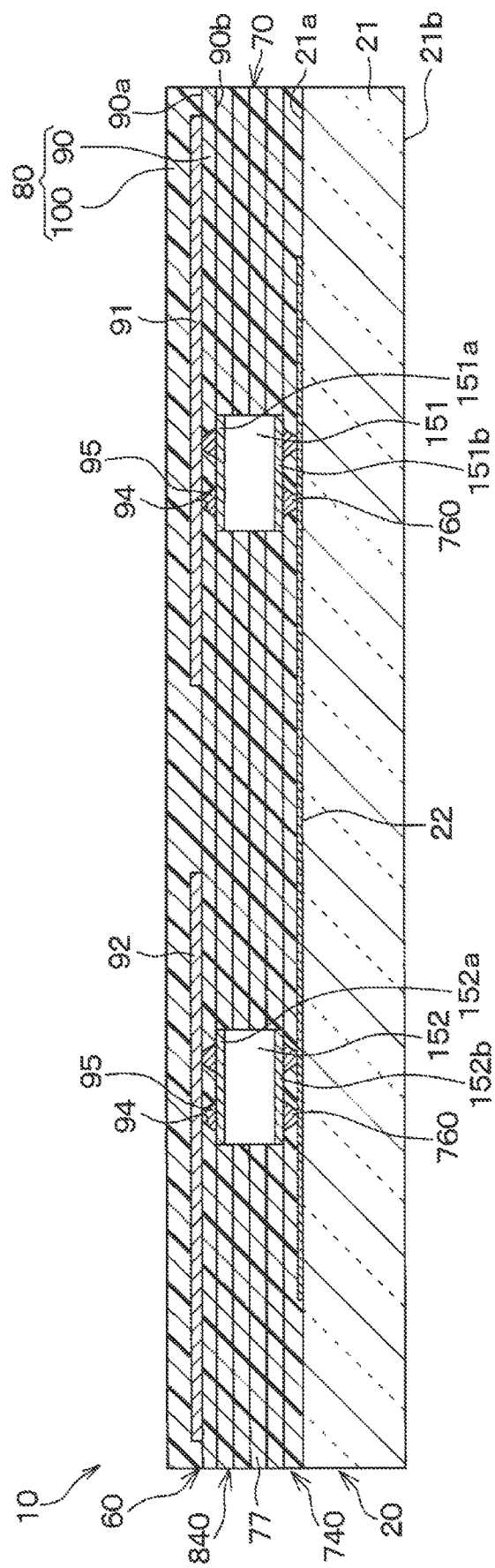
FIG. 37 is a cross-sectional view of a semiconductor package according to a twenty-fifth embodiment.

In the present embodiment, as shown in FIG. 37, a first capacitor 151 having a pair of electrodes 151a and 151b and a second capacitor 152 having a pair of electrodes 152a and 152b are arranged in the sealing member 60 together with the first semiconductor chip 30a and the second semiconductor chip 30b. Note that FIG. 37 shows a cross section at a different position from the cross section shown in FIG. 32 of the twenties embodiment, and the first semiconductor chip 30a and the second semiconductor chip 30b are arranged in a different cross section from FIG. 37. Further, the first capacitor 151 and the second capacitor 152 of the present embodiment are made of silicon or the like, and the thicknesses of the first capacitor 151 and the second capacitor 152 are substantially equal to the thickness of the semiconductor chip 30.

The first capacitor 151 and the second capacitor 152 are arranged on the lower layer plate-shaped member 740 in the same manner as the first semiconductor chip 30a and the second semiconductor chip 30b. Specifically, each of the first capacitor 151 and the second capacitor 152 is arranged on the lower layer plate-shaped member 740 such that one electrode 151b, 152b is located on the lower layer plate-shaped member 740 side, and the other electrode 151a, 152a is located on the first sealing member 90 side.

The electrode 151a of the first capacitor 151 is connected to the drain pattern 91 formed in the first sealing member 90 through the upper connecting via 95. The electrode 152a of the second capacitor 152 is connected to the source pattern 92 formed in the first sealing member 90 through the upper connecting via 95. Further, the electrode 151b of the first capacitor 151 and the electrode 152b of the second capacitor 152 are connected to the first surface metal film 22 through the lower layer connecting via 760. That is, in the present embodiment, the series structure of the first capacitor 151 and the second capacitor 152 is connected in parallel to the series structure of the first semiconductor chip 30a and the second semiconductor chip 30b. In the embodiment, the drain pattern 91, the source pattern 92, the upper connecting via 95, the first surface metal film 22, and the lower layer connecting via 760 correspond to the wiring layer.

According to this, the first capacitor 151 and the second capacitor 152 are arranged together with the first semiconductor chip 30a and the second semiconductor chip 30b. Therefore, the first semiconductor chip 30a and the second semiconductor chip 30b can be arranged in close proximity to the first capacitor 151 and the second capacitor 152, and the wiring layer connecting these elements can be shortened. Therefore, it is possible to reduce the parasitic inductance.

Further, it is possible to restrict the semiconductor package 10 from increasing in size in the thickness direction, as compared with a twenty-fifth embodiment described later.

In the above, an example of a state in which the series structure of the first capacitor 151 and the second capacitor 152 is connected in parallel to the series structure of the first semiconductor chip 30a and the second semiconductor chip 30b has been described. However, the first capacitor 151 and the second capacitor 152 may be connected in parallel with each other with respect to the series structure of the first semiconductor chip 30a and the second semiconductor chip 30b.

Further, the first capacitor 151 and the second capacitor 152 may be formed thinner than the first semiconductor chip 30a and the second semiconductor chip 30b, as in the seventeenth embodiment.

Twenty-Sixth Embodiment

A twenty-sixth embodiment will be described hereinafter. In the present embodiment, the arrangement of the first capacitor 151 and the second capacitor 152 is modified from that of the twenty-fifth embodiment. Other configurations are the same as those of the twenty-fifth embodiment, and therefore the descriptions of the same configurations will be omitted.

Figure 38:
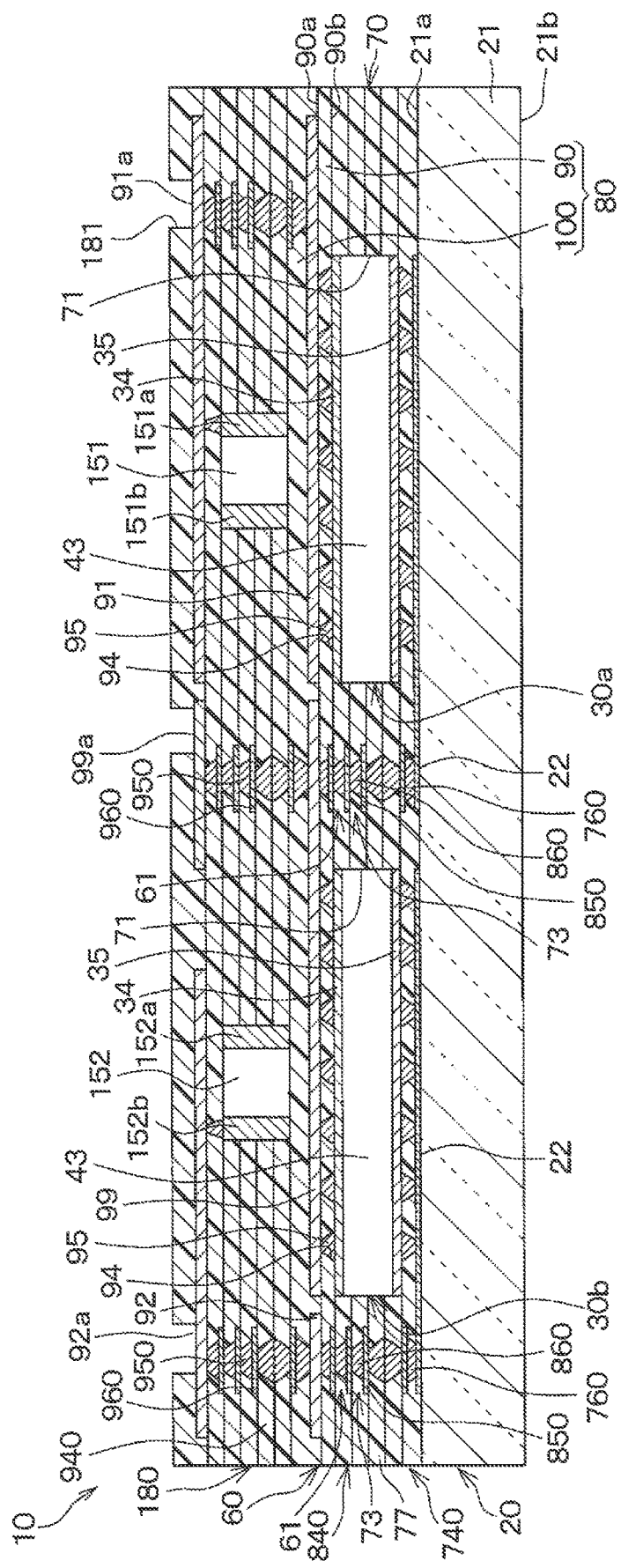
FIG. 38 is a cross-sectional view of a semiconductor package according to a twenty-sixth embodiment.

In the present embodiment, as shown in FIG. 38, the first capacitor 151 is arranged on the first semiconductor chip 30a, and the second capacitor 152 is arranged on the second semiconductor chip 30b. In the present embodiment, the first capacitor 151 and the second capacitor 152 are arranged so that the pair of electrodes 151a, 151b, 152a, 152b are located on the second sealing member 100 in the planar direction of the semiconductor package 10.

The sealing member 60 is formed so as to seal the first capacitor 151 and the second capacitor 152 as well. In the present embodiment, the sealing member 60 include an upper layer sealing member 180 arranged on the second sealing member 100. The upper layer sealing member 180 is configured by a stack of upper layer plate-shaped members 940 having the same structure as the intermediate layer plate-shaped member 840, and is appropriately formed with an upper layer pattern 950 and an upper layer connecting via 960.

In the upper layer sealing member 180, contact holes 181 that expose the upper layer pattern 950 connected to the drain pattern 91, the source pattern 92, and the connection pattern 99 are formed in a layer furthest from the insulating substrate 21 and on the opposite side to the insulating substrate 21. Of the upper layer pattern 950, the portions exposed from the contact hole 181 serves as the drain pad 91a, the source pad 92a, and the connection pad 99a. In a cross section different from that shown in FIG. 38, the gate pad 93a is also provided by the upper layer pattern 950.

In the first semiconductor chip 30a, the drain electrode 34 is connected to the drain pad 91a through the upper connecting via 97, the drain pattern 91, the upper layer connecting via 960, and the like. In the second semiconductor chip 30b, the source electrode 35 is connected to the source pad 92a through the upper connecting via 97, the source pattern 92, the upper layer connecting via 960, and the like. The connection pattern 99 is connected to the connection pad 99a through the upper connecting via 97, the upper layer connecting via 960, and the like. The gate electrode 38 of the first semiconductor chip 30a and the gate electrode 38 of the second semiconductor chip 30b are connected to the gate pad 93a through the upper connecting via 95, the gate pattern 93, the upper connecting via 960, and the like in the cross-section different from that shown in FIG. 38.

In the first capacitor 151, the one electrode 151a is connected to the upper layer pattern 950, which serves as the drain pad 91a, through the upper layer connecting via 960 formed in the upper layer sealing member 180. In the second capacitor 152, the other electrode 152b is connected to the upper layer pattern 950, which serves as the source pad 92a, through the upper layer connecting via 960 formed in the upper layer sealing member 180. The other electrode 151b of the first capacitor 151 and the one electrode 152a of the second capacitor 152 are connected through the upper layer pattern 950 formed in the upper layer sealing member 180 and the upper layer connecting via 960 in a cross section different from that shown in FIG. 38.

As described above, even if the first capacitor 151 and the second capacitor 152 are stacked and arranged on the first semiconductor chip 30a and the second semiconductor chip 30b, the same effects as those of the twenty-fourth embodiment can be achieved. Further, in such a semiconductor package 10, it is possible to suppress an increase in the size in the planar direction, as compared with the configuration of the twenty-fourth embodiment.

Twenty-Seventh Embodiment

A twenty-seventh embodiment will be described hereinafter. In the present embodiment, connection bumps are arranged in the semiconductor package 10 of the first embodiment. Other configurations are the same as those of the first embodiment, and therefore the descriptions of the same configurations will be omitted.

Figure 39:
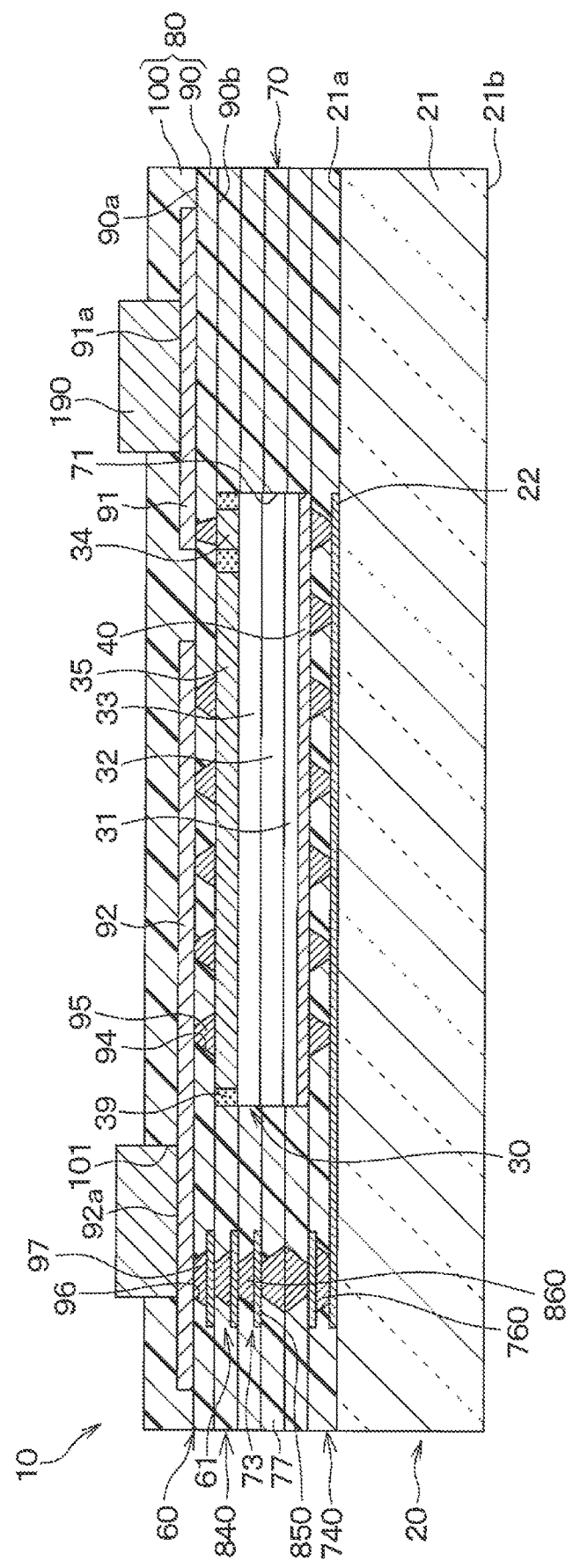
FIG. 39 is a cross-sectional view of a semiconductor package according to a twenty-seventh embodiment.

In the semiconductor package 10 of the present embodiment, as shown in FIG. 39, connection bumps 190 are arranged on the drain pad 91a and the source pad 92a. In addition, in a cross section different from that shown in FIG. 39, the connection bump 190 is also arranged on the gate pad 93a. The connection bump 190 is made of, for example, a sintered body containing silver tin as a main component.

The semiconductor package 10 of the present embodiment has the configuration as described above. Next, a method for manufacturing the semiconductor package 10 will be described with reference to FIGS. 40A and 40B.

Figure 40A:
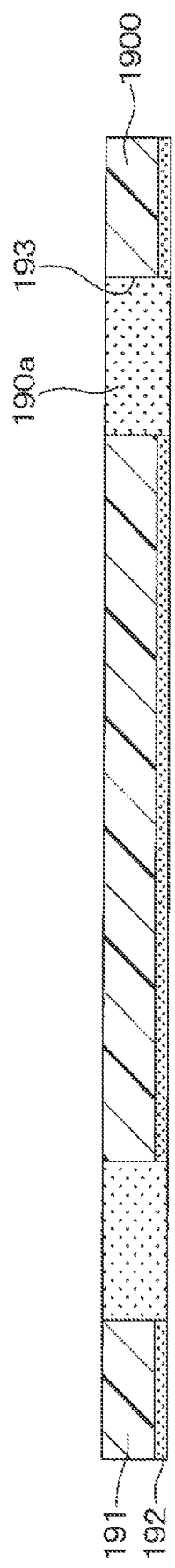
FIG. 40A is a cross-sectional view showing a manufacturing process of the semiconductor package according to the twenty-seventh embodiment.

First, as shown in FIG. 40A, a bump forming body 1900 having a LCP film 191 and a peeling member 192 is prepared. The peeling member 192 is made of a Teflon (registered trademark) film and is provided on the LCP film 191. Next, through holes 193 are formed in the bump forming body 1900, and a bump constituent member 190a for constituting the bump is arranged in the through holes 193. The through hole 193 is formed at a position and a size corresponding to the contact hole 101. The bump constituent member 190a is formed by arranging a conductive paste by a printing method or the like. As the conductive paste, for example, a paste obtained by mixing a powder containing silver tin as a main component with an organic solvent is used. In this case, the organic solvent is evaporated by temporary sintering or the like, if necessary, so that the conductive paste does not come out from the through hole 193.

The bump forming body 1900 has the same size in the planar direction as the first constituent member 900 and the like. Although the manufacturing method of one semiconductor package 10 is illustrated in FIGS. 40A and 40B, in reality, a plurality of semiconductor packages 10 are collectively manufactured as in the first embodiment.

Figure 40B:
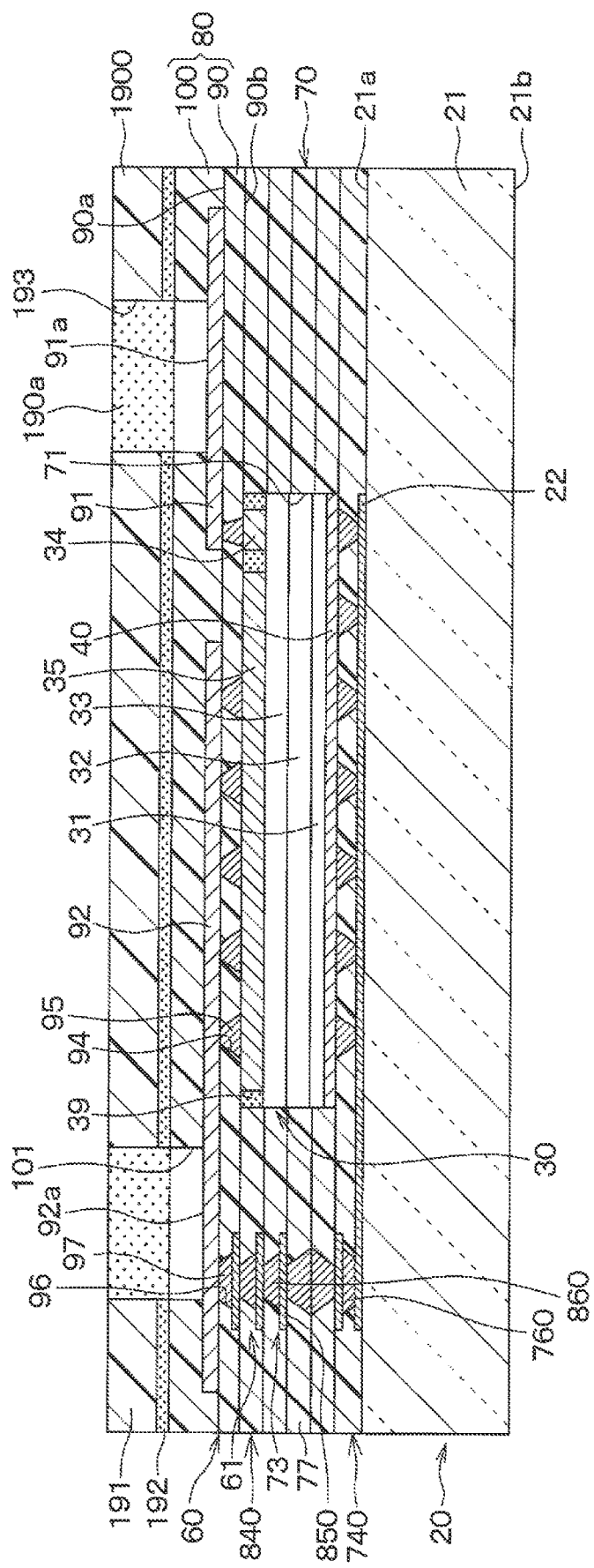
FIG. 40B is a cross-sectional view showing a manufacturing process of the semiconductor package following FIG. 40A.

Subsequently, as shown in FIG. 40B, the bump forming body 1900 is arranged so that the bump constituent members 190a are located on the contact holes 101 of the stacked body subjected up to the process shown in FIG. 5F. Then, by pressurizing the stacked body in the stacking direction while heating, the connection bumps 190 are produced from the bump forming body 1900 and are connected to the pads 91a, 92a, and 99a. Thereafter, the bump forming body 1900 is removed from the second constituent member 1000 by the peeling member 192 while leaving the connection bumps 190 on the pads 91a, 92a, and 99a. As a result, the connection bumps 190 are arranged on the respective pads 91a, 92a, and 99a.

Thereafter, although not particularly shown, the stacked body is divided into chips along the dicing line DL, and thus the semiconductor package 10 shown in FIG. 39 is manufactured.

According to this, when the semiconductor package 10 is mounted on the printed circuit board 110 via the solders 120 as in the seventh embodiment, it becomes easy to secure the space between the semiconductor package 10 and the printed circuit board 110, and thus easy to secure the thickness of the solders 120. Therefore, it is possible to reduce the variation in height of the solders 120. Further, since the distance between the semiconductor package 10 and the printed circuit board 110 can be easily secured, it is possible to improve the injectability of the underfill material 130.

Twenty-Eighth Embodiment

A twenty-eighth embodiment will be described hereinafter. In the present embodiment, the method for manufacturing the semiconductor package 10 is modified from that of the first embodiment. Other configurations are the same as those of the first embodiment, and therefore the descriptions of the same configurations will be omitted.

Figure 41:
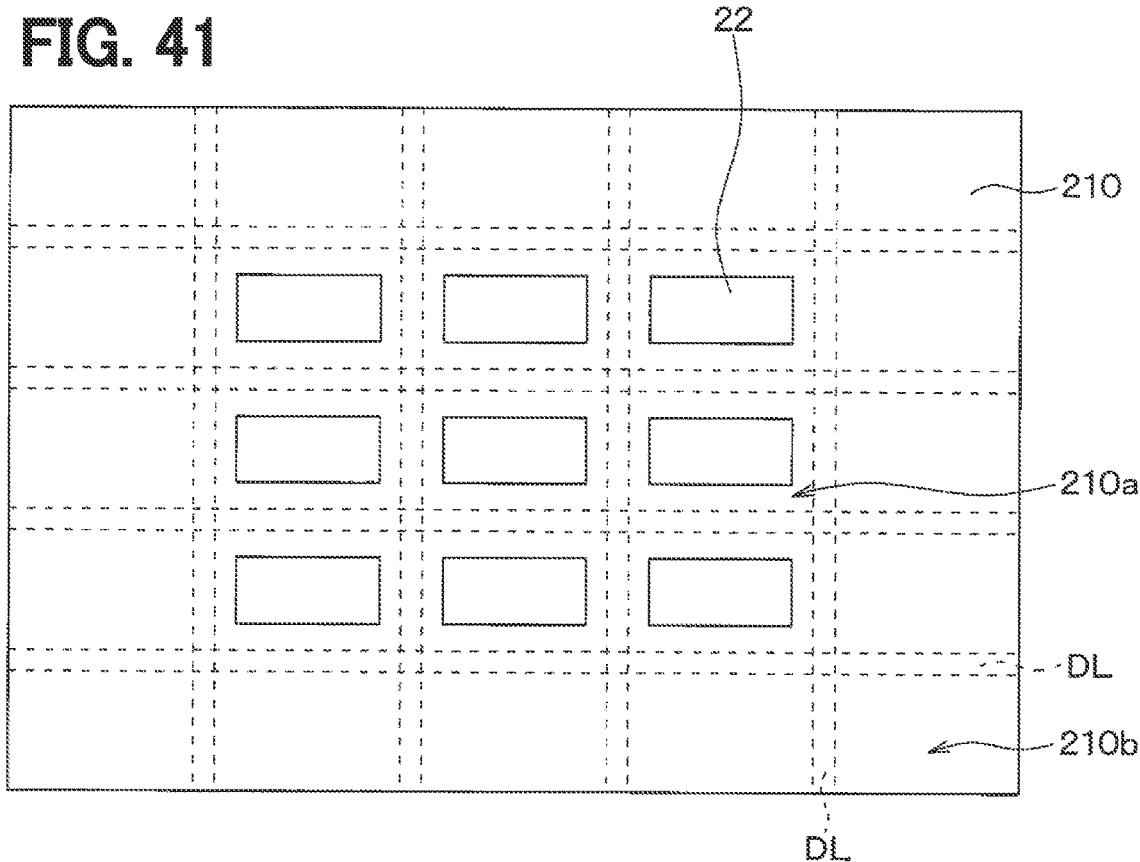
FIG. 41 is a diagram for explaining a problem in the manufacturing method according to the first embodiment.

First, in the first embodiment, the constituent substrate 210, which is a multiple continuous substrate, is prepared to manufacture the semiconductor package 10. In this case, for example, as shown in FIG. 41, the inner area of the constituent substrate 210 is designated as the constituent region 210a, the outer edge portion of the constituent substrate 210 is designated as the auxiliary region 210b. The semiconductor packages 10 are produced from the constituent region 210a while forming positioning holes and the like in the auxiliary region 210b.

In FIG. 41, the region where the first surface metal films 22 are arranged is the constituent region 210a. The auxiliary region 210b is arranged so as to surround the constituent region 210a. In such a constituent substrate 210, the auxiliary region 210b tends to be a wasteful region.

Figure 42:
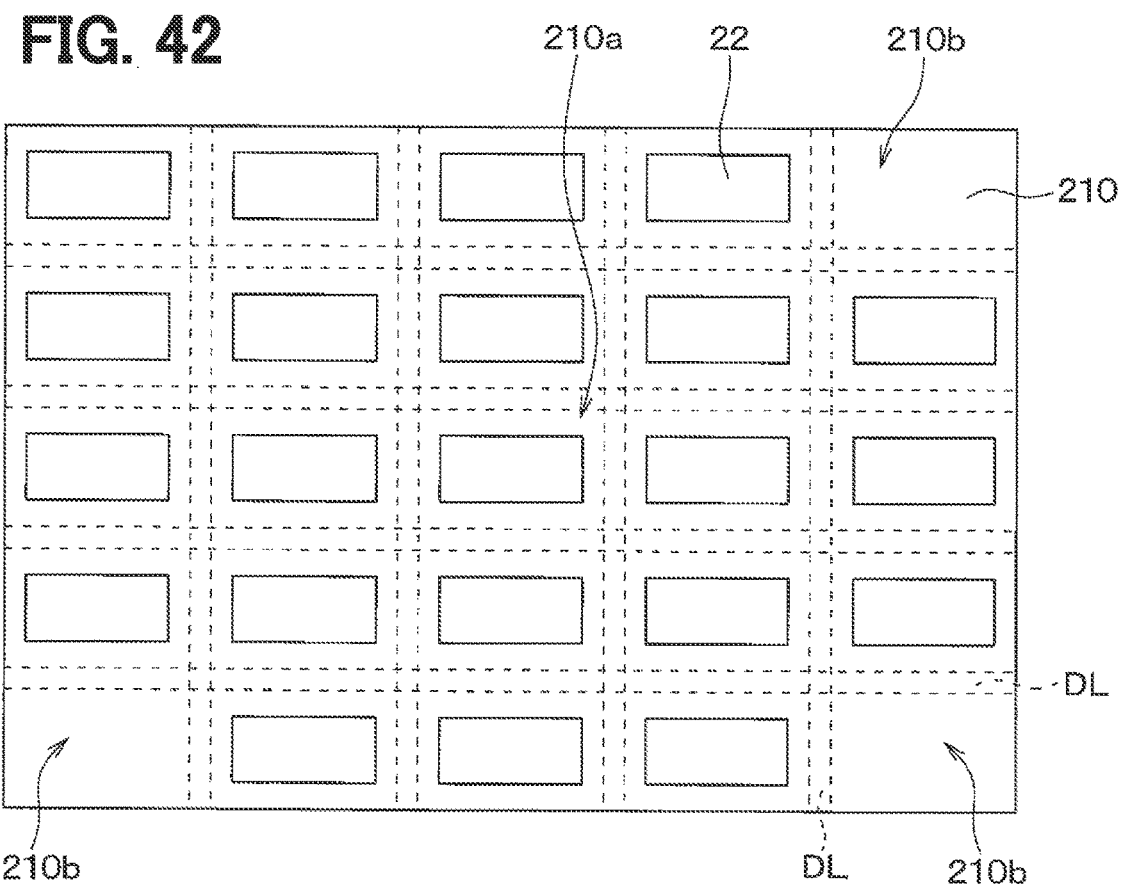
FIG. 42 is a plan view of a constituent substrate for showing a manufacturing process of a semiconductor package according to a twenty-eighth embodiment.

Therefore, in the present embodiment, as shown in FIG. 42, the outer edge portion of the constituent substrate 210 is also used the constituent region 210a for constituting the semiconductor packages 10. Further, a part of the outer edge portion of the constituent substrate 210 is used as the auxiliary region 210b. That is, in the outer edge portion of the constituent substrate 210, the constituent region 210a and the auxiliary region 210b both exist.

In the present embodiment, when the constituent substrate 210 has a rectangular shape as a planar shape, the corner portions are used as the auxiliary region 210b. In FIG. 42, the region where the first surface metal film 22 is not formed is the auxiliary region 210b. In this case, the auxiliary regions 210b are preferably arranged so as to be asymmetric with respect to the center of the constituent substrate 210, as shown in FIG. 42. As a result, the position of the constituent substrate 210 can be easily recognized, and the positioning can be enhanced.

According to this, since it is not necessary to arrange the auxiliary region 210b over the entire outer edge portion of the constituent substrate 210, the constituent substrate 210 can be effectively used. Although the manufacturing method has been described in association with the first embodiment as an example, the same applies to the case of manufacturing the semiconductor package 10 of the second embodiment and the ninth embodiment.

Twenty-Ninth Embodiment

A twenty-ninth embodiment will be described hereinafter. In the present embodiment, grooves are formed in the side constituent member 700, the first constituent member 900, and the second constituent member 1000 of the first embodiment. Other configurations are the same as those of the first embodiment, and therefore the descriptions of the same configurations will be omitted.

Figure 43:
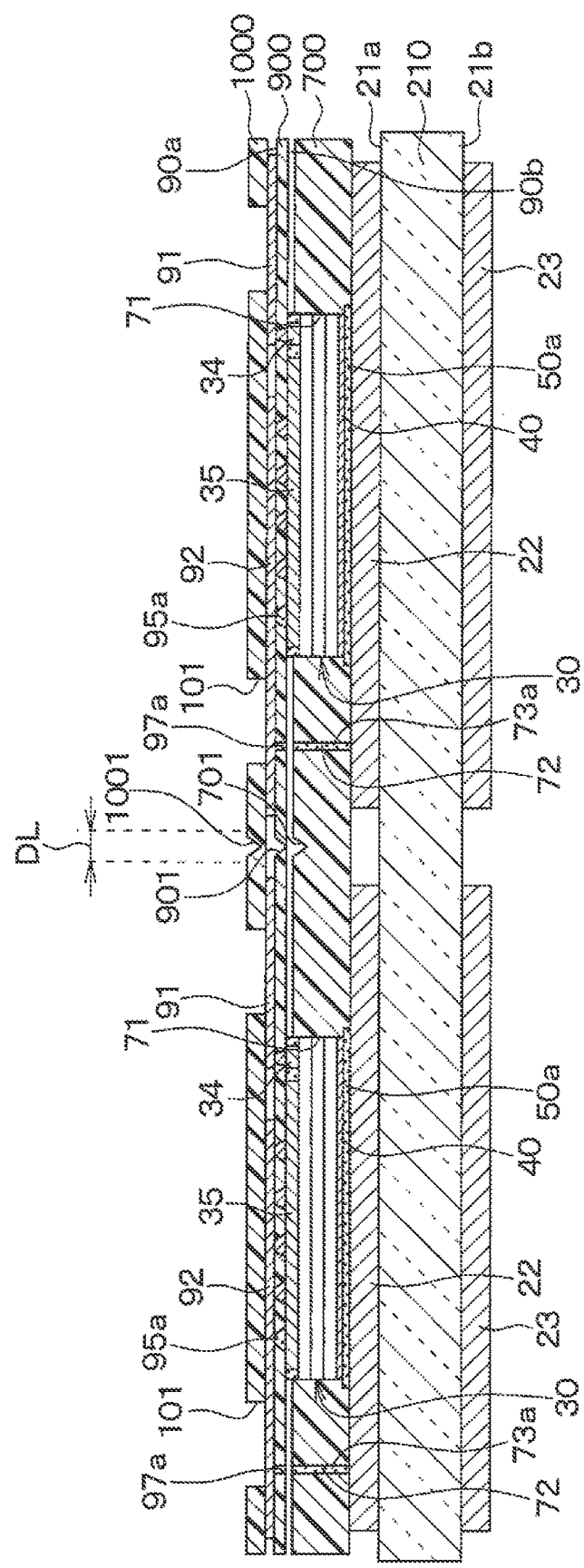
FIG. 43 is a cross-sectional view showing a manufacturing process of a semiconductor package according to a twenty-ninth embodiment.

In the present embodiment, as shown in FIG. 43, in the process of FIG. 5E, the side constituent member 700 formed with a groove 701, the first constituent member 900 formed with a groove 901, and the second constituent member 1000 formed with a groove 1001 are stacked. The grooves 701, 901, and 1001 are formed at positions corresponding to the dicing line DL.

The groove 701, 901, and 1001 are formed when the side constituent member 700, the first constituent member 900, and the second constituent member 1000 are prepared in the processes of FIGS. 5B to 5D, respectively. Further, the groove 701, 901 and 1001 are formed by, for example, a laser or the like. In the present embodiment, the groove portion 211 is not formed on the constituent substrate 210. However, the groove portion 211 may be formed in the constituent substrate 210. Thereafter, the stacked members are integrated by pressurizing while heating as shown in FIG. 5F.

As described above, even if the grooves 701, 901, and 1001 are formed on the side constituent member 700, the first constituent member 900, and the second constituent member 1000, the dicing can be facilitated. Further, since the grooves 701, 901, and 1001 are formed in the side constituent member 700, the first constituent member 900, and the second constituent member 1000, the influence of the heat shrinkage of the LCP films of the members 700, 900, and 1000 can be suppressed by the grooves 701, 901, and 1001 after the integrating in the process shown in FIG. 5F.

In the present embodiment, the grooves 701, 901, 1001 are formed before integrating the side constituent member 700, the first constituent member 900, and the second constituent member 1000, as an example. As another example, the groove 1001 may be formed in the second constituent member 1000 after integrating the side constituent member 700, the first constituent member 900, and the second constituent member 1000.

Thirtieth Embodiment

A thirtieth embodiment will be described hereinafter. In the present embodiment, the method for manufacturing the plate-shaped member 74 is modified from that of the ninth embodiment. Other configurations are the same as those of the ninth embodiment, and therefore the descriptions of the same configurations will be omitted.

Figure 44A:
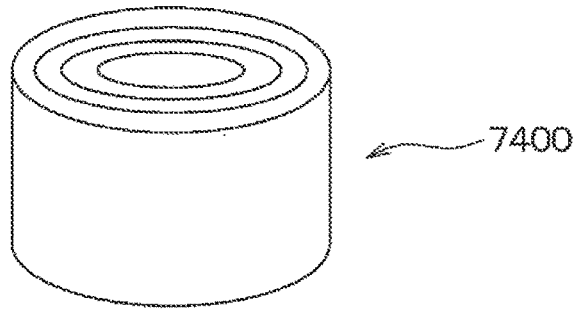
FIG. 44A is a schematic view showing a manufacturing process of a plate-shaped member constituent component according to a thirtieth embodiment.
Figure 45A:
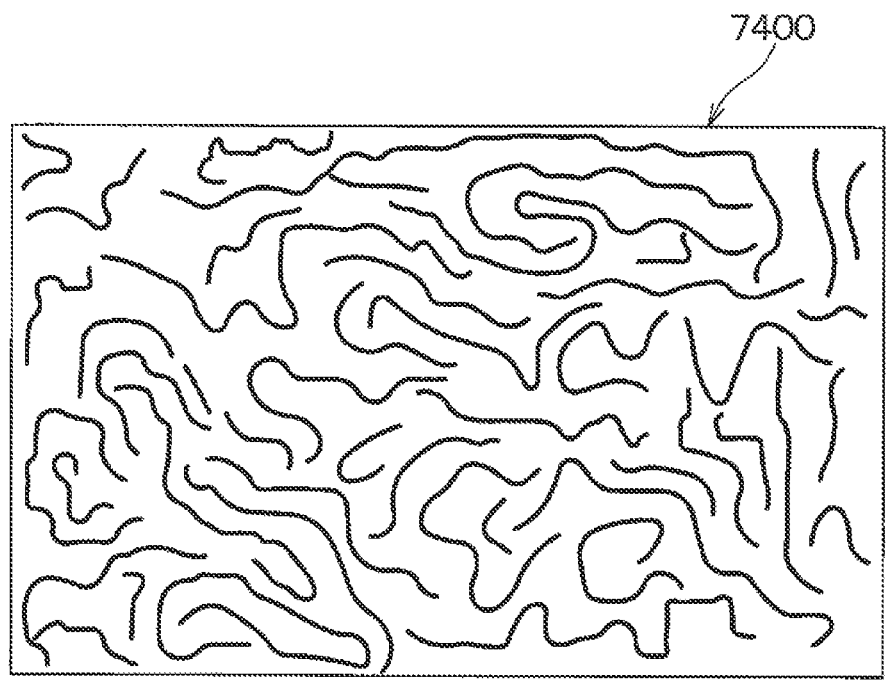
FIG. 45A is a diagram showing an internal state of an LCP film constituent member before heat treatment.

In the present embodiment, the plate-shaped member 74 constituting the sealing member 60 is manufactured as follows. First, as shown in FIG. 44A, a LCP film constituent member 7400 is prepared. In this case, the internal state of the LCP film constituent member 7400 is in an amorphous state, as shown in FIG. 45A.

Figure 45B:
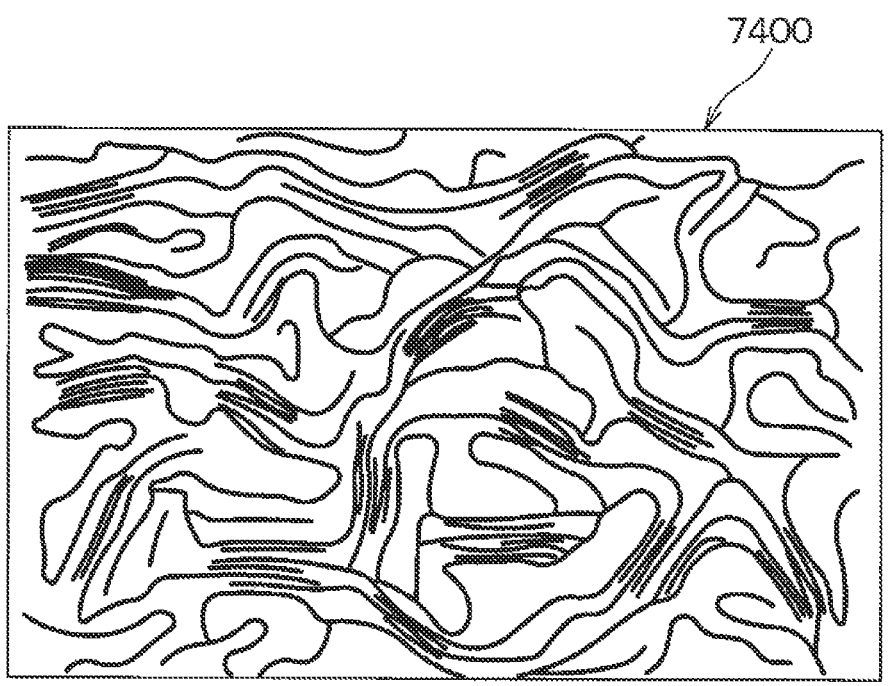
FIG. 45B is a diagram showing an internal state of the LCP film constituent member before heat treatment.

Next, the LCP film constituent member 7400 is heat-treated and crystallized as shown in FIG. 45B. The heat treatment is performed at about 300° C., which is a temperature lower than the melting point temperature of the LCP film constituent member 7400, for several tens of minutes to several hours. In this case, it is preferable to raise the temperature stepwise from about 270° C. to about 300° C. As a result, it is possible to prevent the LCP film constituent member 7400 from melting.

Figure 44B:
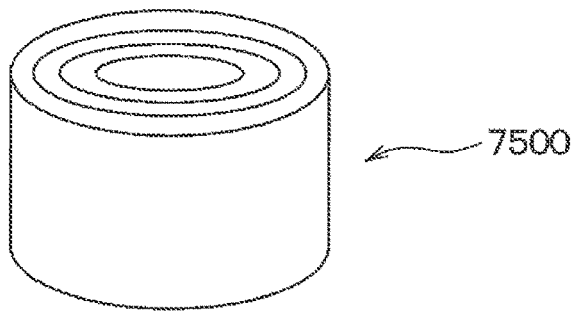
FIG. 44B is a schematic view showing a manufacturing process of the plate-shaped member constituent component following FIG. 44A.
Figure 44C:
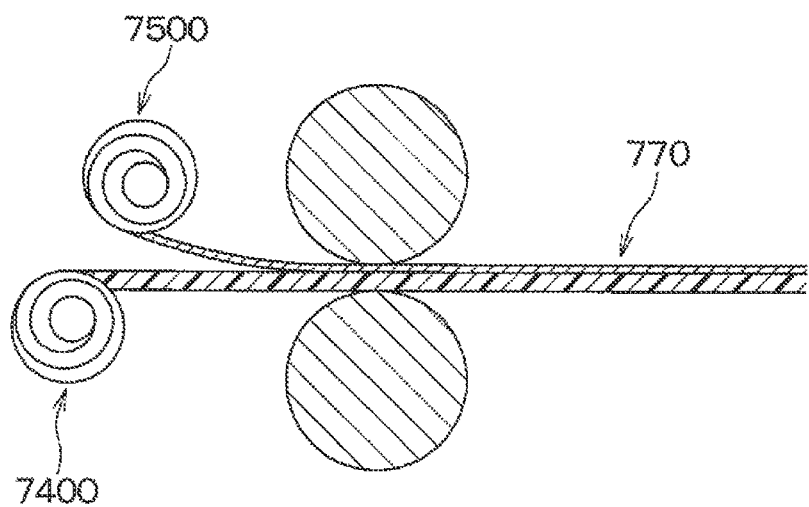
FIG. 44C is a schematic view showing a manufacturing process of the plate-shaped member constituent component following FIG. 44B.

Further, in a process different from that shown in FIG. 44A, a metal sheet constituent member 7500 made of copper or the like is prepared, as shown in FIG. 44B. Thereafter, as shown in FIG. 44C, the LCP film constituent member 7400 and the metal sheet constituent member 7500 are laminated and integrated, thereby to form the plate-shaped member constituent member 770. The laminating process is performed by pressurizing while heating. However, the heating time in the laminating process of the LCP film constituent member 7400 and the metal sheet constituent member 7500 is extremely short, as compared to the heating time in the process of the heat-treatment of the LCP film constituent member 7400 for crystallizing. Therefore, the LCP film constituent member 7400 is not crystallized only by heating in this laminating process.

Thereafter, although not shown in particular, the cutting or the like is performed as necessary, and then etching or the like is performed to form into a pattern 75 having a desired shape. Further, the sintered body or the conductive paste for constituting the connecting via 76 is arranged. In this way, the plate-shaped member 74 is produced.

Although the plate-shaped member constituent member 770 has been described above as an example, the first constituent member 900 and the second constituent member 1000 are also formed in the same manner.

According to this, since the LCP film constituent member 7400 is crystallized, when the plate-shaped member constituent member 770 (that is, the plate-shaped member 74) and the semiconductor chip 30 or the like are integrated by pressurizing while heating, the deviation of the pattern 75 and the connecting via 76 can be suppressed. Therefore, it is possible to prevent the adjacent plate-shaped members 74 from not being electrically connected in the stacking direction.

Thirty-First Embodiment

A thirty-first embodiment will be described hereinafter. In the present embodiment, the electronic device 1 is configured by mounting the semiconductor package 10 on the printed circuit board 110 with respect to the ninth embodiment. Other configurations are the same as those of the ninth embodiment, and therefore the descriptions of the same configurations will be omitted.

Figure 46:
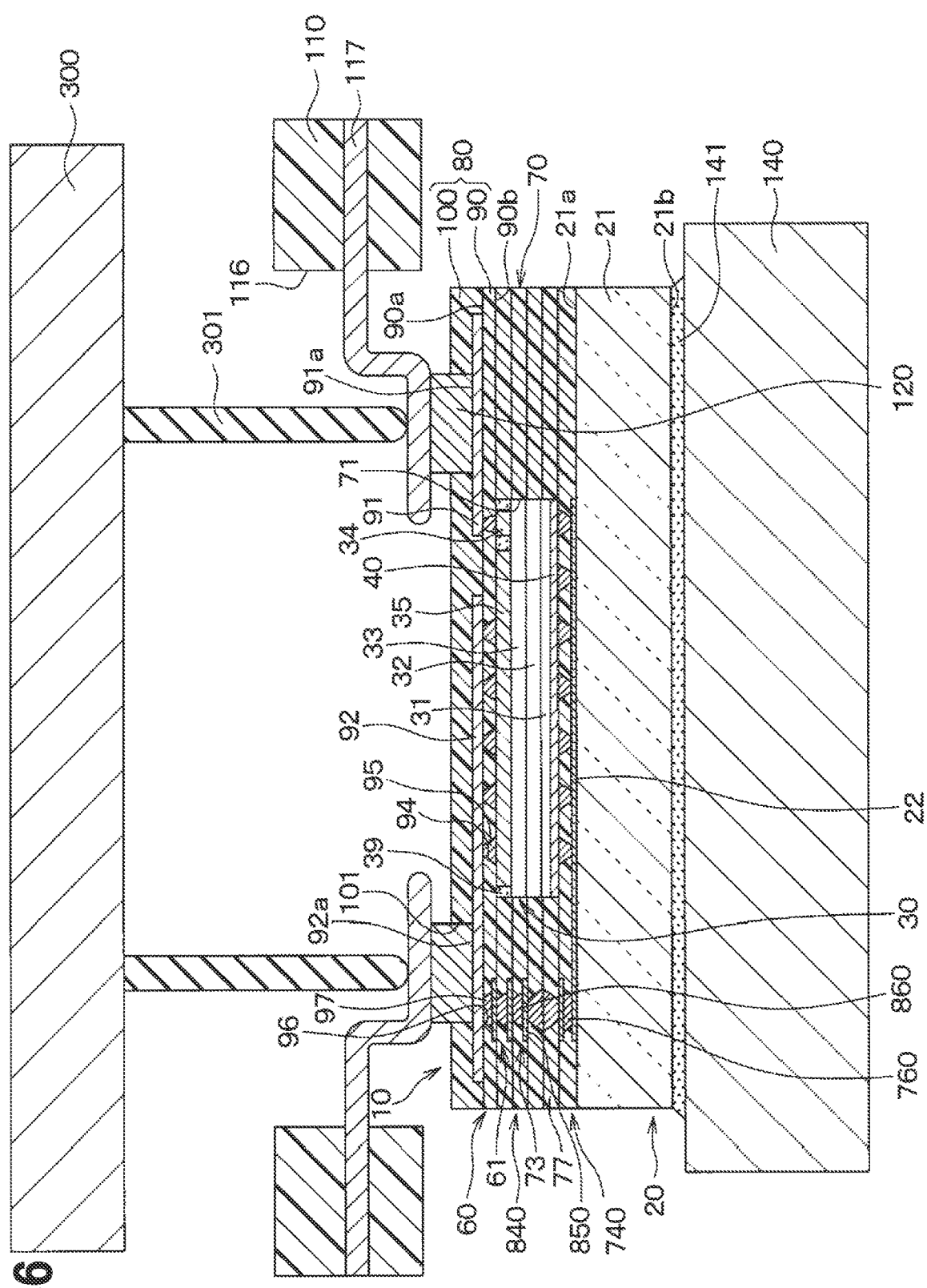
FIG. 46 is a cross-sectional view showing an electronic device according to a thirty-first embodiment.

In the present embodiment, as shown in FIG. 46, an electronic device 1 has a semiconductor package 10, a printed circuit board 110, a cooler 140, and a pressing member 300.

The printed circuit board 110 is formed with a hole 116 penetrating in the thickness direction. Further, the printed circuit board 110 is formed with a plurality of terminals 117 exposed into the holes 116. Although the configuration of the printed circuit board 110 is simplified in FIG. 46, the printed circuit board 110 is appropriately formed with the first surface wiring pattern 111, the through-hole electrode 113, and the like, similarly to the printed circuit board 110 shown in FIG. 15.

The semiconductor package 10 is connected to the printed circuit board 110 by connecting the drain pad 91a and the source pad 92a to the terminals 117 via the solder 120. The semiconductor package 10 is connected to the printed circuit board 110 by connecting the gate pad 93a to the terminals 117 via the solder 120 in a cross section different from that shown in FIG. 46.

Further, in the semiconductor package 10, the heat radiating member 20 is connected to the cooler 140 through a connecting member 141 such as grease.

The pressing member 300 is provided by a housing or the like, and has a pressing portion 301 protruding in one direction. The pressing portion 301 is made of an elastic body such as rubber, and is provided with the same number as the number of terminals 117 connected to the semiconductor package 10. In the present embodiment, since the terminals 117 are connected to the drain pad 91a, the source pad 92a, and the gate pad 93a, three pressing portions 301 are provided.

The pressing member 300 is arranged so that the portions of the terminals 117 of the printed circuit board 110 connected to the pads 91a, 92a, and 93a are pressed toward the semiconductor package 10 by the pressing portions 301.

In this way, the electronic device 1 may be configured by using the semiconductor package 10. In the electronic device 1 of the present embodiment, since the portions of the terminals 117 connected to the pads 91a, 92a, and 93a are pressed, it is possible to suppress the variation in distance between the semiconductor package 10 and the cooler 140. In addition, since the distance between the semiconductor package 10 and the cooler 140 can be easily reduced, the heat radiation property can be improved.

Thirty-Second Embodiment

A thirty-second embodiment will be described hereinafter. The present embodiment is a modification of the thirtieth embodiment in which the configuration of the electronic device 1 is modified. Other configurations are the same as those of the thirtieth embodiment, and therefore the descriptions of the same configurations will be omitted.

Figure 47:
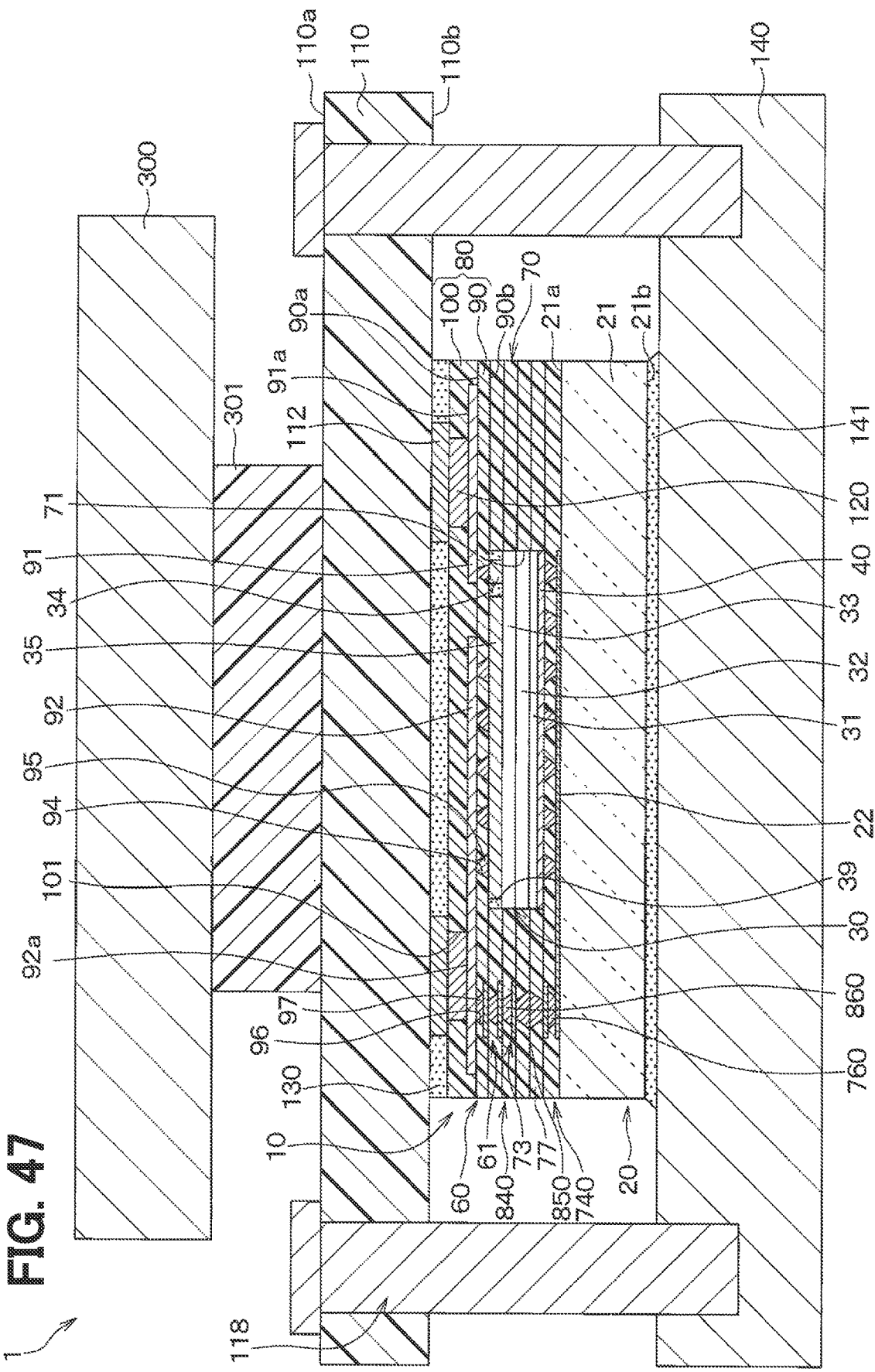
FIG. 47 is a cross-sectional view showing an electronic device according to a thirty-second embodiment.

As shown in FIG. 47, the printed circuit board 110 in the electronic device 1 of the present embodiment does not have the holes 116 in the printed circuit board 110, and has the same configuration as that of the seventh embodiment. The printed circuit board 110 is fixed to the cooler 140 by a fastening member 118 such as a screw. Although the configuration of the printed circuit board 110 is simplified in FIG. 47, the printed circuit board 110 is formed with the first surface wiring pattern 111, the through-hole electrode 113, and the like, similarly to the printed circuit board 110 shown in FIG. 15.

In the semiconductor package 10, the drain pad 91a and the source pad 92a are connected to the second surface wiring pattern 112 of the printed circuit board 110 through the solder 120, respectively. Further, the gate pad 93a is connected to the other surface wiring pattern 112 of the printed circuit board 110 through the solder 120 in a cross section different from that shown FIG. 13. The underfill material 130 is arranged between the printed circuit board 110 and the semiconductor package 10.

The pressing member 300 has a configuration in which the pressing portion 301 can press the printed circuit board 110 toward the cooler 140 as a whole. Further, the pressing member 300 presses the printed circuit board 110 toward the cooler 140, thereby pressing the semiconductor package 10 toward the cooler 140.

Even in the configuration in which the semiconductor package 10 is pressed via the printed circuit board 110 in this way, the same effects as those of the thirtieth embodiment can be achieved. Further, by directly pressing the printed circuit board 110, the pressing portion 301 can easily restrict deformation of the printed circuit board 110 away from the semiconductor package 10 and can easily absorb the thickness variation in the printed circuit board 110.

Thirty-Third Embodiment

A thirty-third embodiment will be described hereinafter. In the present embodiment, the electronic device 1 is configured using the semiconductor package 10 of the ninth embodiment. Other configurations are the same as those of the ninth embodiment, and therefore the descriptions of the same configurations will be omitted.

Figure 48:
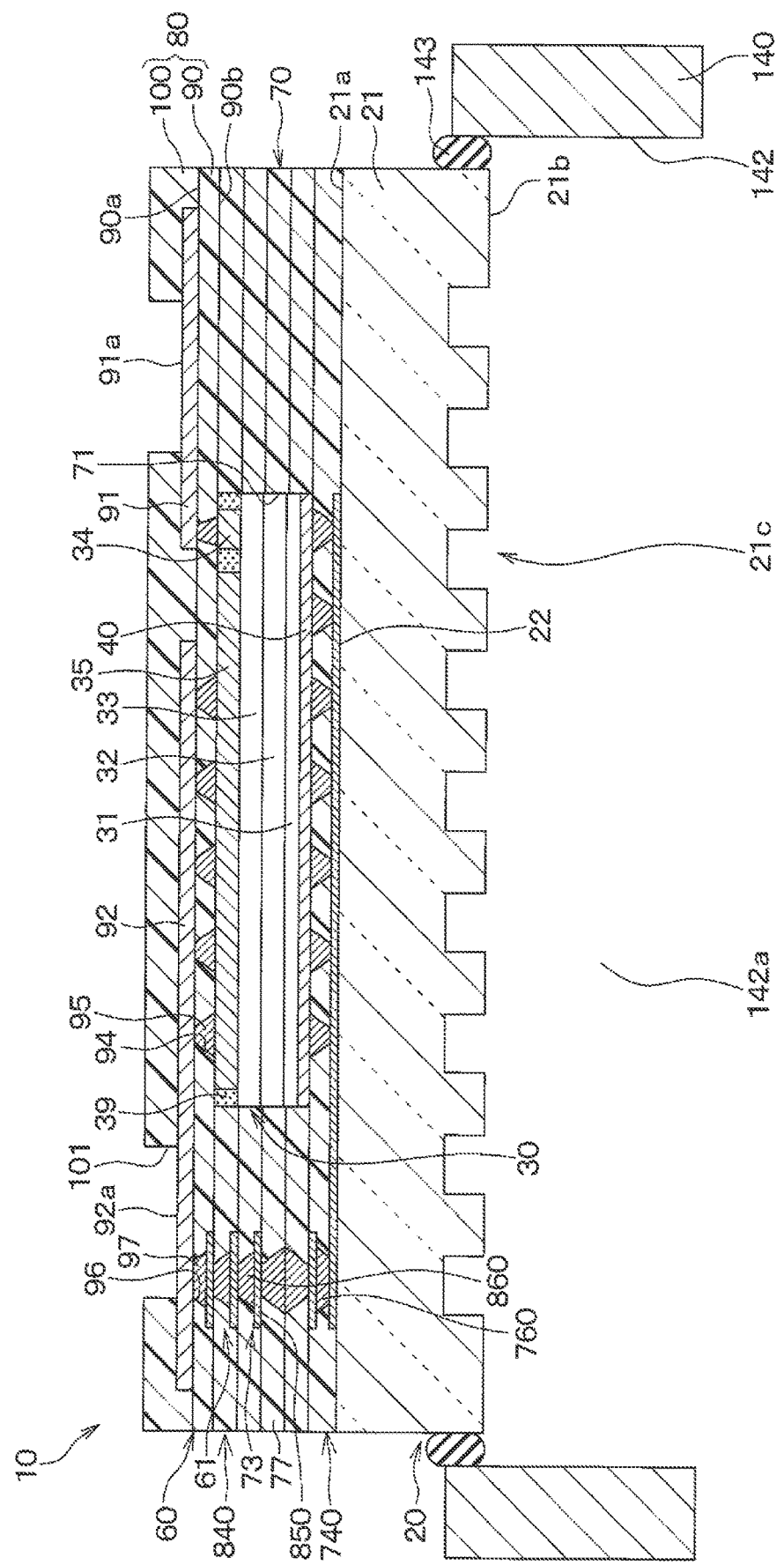
FIG. 48 is a cross-sectional view showing an electronic device according to a thirty-third embodiment.

In the electronic device 1 of the present embodiment, as shown in FIG. 48, the cooler 140 is formed with a recess 142. The semiconductor package 10 is arranged so as to cover the open end of the recess 142 via a seal member 143 such as an O-ring. The recess 142 is connected to a cooling pipe or the like (not shown), and is configured to allow a cooling medium to flow through the cooling pipe. That is, the recess 142 is formed so as to form a cooling passage 142a through which the cooling medium flows. As the cooling medium, for example, water, a general antifreeze solution, or the like is used.

In the present embodiment, the projection and recess structure 21c is formed on the second surface 21b of the insulating substrate 21. Although not shown in FIG. 48, the pads 91a, 92a, and 93a of the semiconductor package 10 are electrically connected to the printed circuit board 110 in the same manner as in the thirty-first embodiment and the like.

In such an electronic device 1, the cooling medium flows through the recess 142, so that the heat radiation can be further improved. Further, in the electronic device of the present embodiment, the projection and recess structure 21c is formed on the second surface 21b side of the insulating substrate 21, and thus the contact area between the heat radiating member 20 and the cooling medium can be increased. Therefore, the heat radiation performance can be further improved.

Other Embodiments

Although the present disclosure has been described in accordance with the embodiments, it is understood that the present disclosure is not limited to such embodiments or structures. The present disclosure encompasses various modifications and variations within the scope of equivalents. In addition, various combinations and forms, and further, other combinations and forms including only one element, or more or less than these elements are also within the scope and the scope of the present disclosure.

In each of the embodiments described above, the bonding of the members may be mechanical bonding, instead of chemical bonding, to improve the adhesion. For example, in the first embodiment, the heat radiating member 20 and the sealing member 60 may be subjected to a roughening treatment by irradiating the heat radiating member 20 with plasma or the like so that the adhesion is improved by the anchor effect.

In the first embodiment or the like, the second surface metal film 23 may not be formed symmetrically with the first surface metal film 22. Alternatively, the second surface metal film 23 may not be arranged. The bonding member 50 may be arranged within the semiconductor chip 30, when viewed in the stacking direction. The heat radiating member 20 may be arranged within the sealing member 60, when viewed in the stacking direction. Even in such a configuration, by providing the sealing member 60 by the LCP, the same effects as those of the first embodiment can be achieved. Also in the other embodiments having the first surface metal film 22 and the second surface metal film 23, the configuration thereof may be appropriately modified in these ways.

In the first embodiment described above, for example, in place of arranging the sintered body 73a in the second through hole 72 of the side constituent member 700, a metal film (that is, lower connecting via 73) may be formed in the second through hole 72 by a CVD method or the like. Such a configuration is the same for the first constituent member 900. Further, these configurations can be appropriately applied to other embodiments.

In each of the embodiments described above, the semiconductor chip 30 may be formed with a super junction MOSFET or an IGBT. Further, the semiconductor chip 30 may be configured by using a support substrate 31 made of gallium oxide, gallium nitride or the like, in place of the support substrate 31 made of silicon or SiC.

In the first embodiment described above, when the semiconductor package 10 is manufactured, the processes of FIGS. 5E and 5F may be performed as follows. That is, in the process of FIG. 5E, the side constituent member 700 may be arranged on the constituent substrate 210, and the semiconductor chip 30 may be arranged in the first through hole 71 via the sintered body 50a, and then these components may be temporarily joined to each other at a low temperature. Thereafter, the first constituent member 900 and the second constituent member 1000 may be stacked in order on the side constituent member 700 and the semiconductor chip 30, and then these components may be integrated by performing the process of FIG. 5F. Similarly, in the second embodiment described above, after the plate-shaped member constituent member 770 constituting the side sealing part 70 and the semiconductor chip 30 or the like are temporarily joined, the first constituent member 900 and the second constituent member 1000 may be stacked and integrated. Further, these manufacturing methods can be appropriately applied in each of the embodiments described above.

Figure 49:
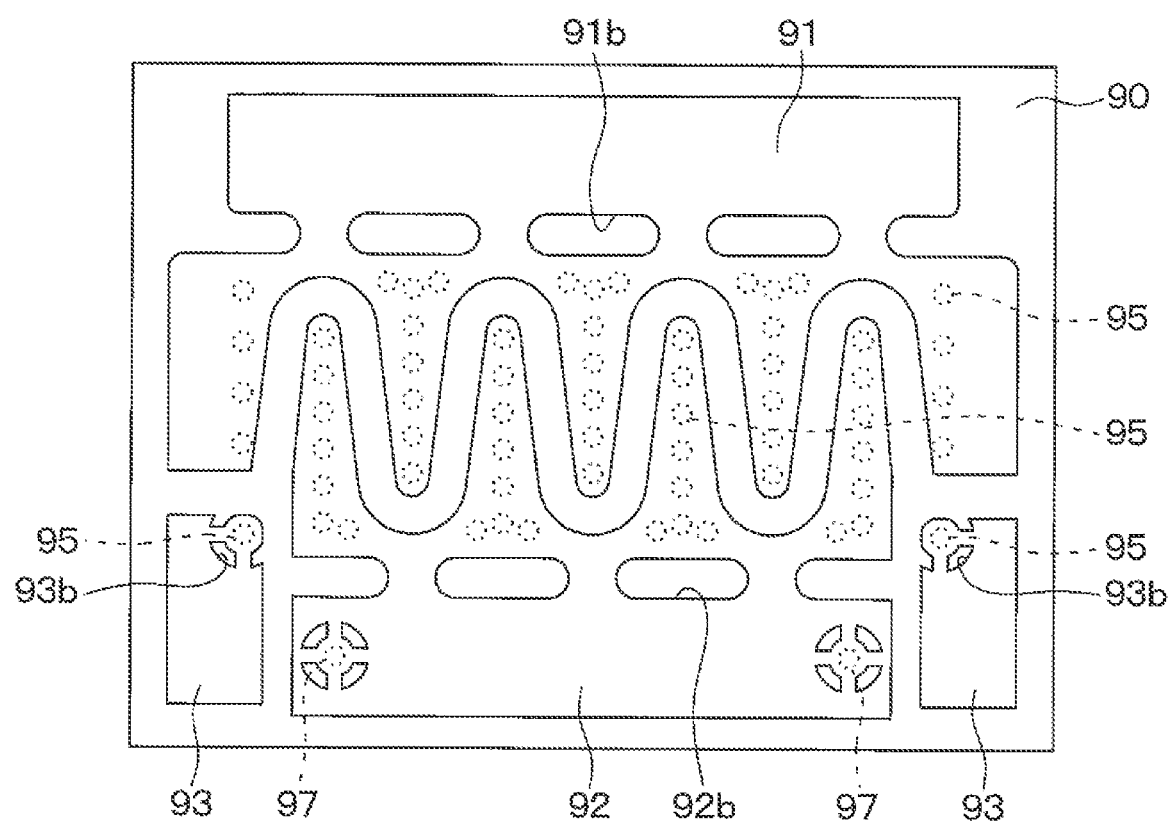
FIG. 49 is a plan view of a first sealing member of a semiconductor package according to another embodiment, when viewed from one side of a heat radiating member.

Further, in each of the embodiments described above, as shown in FIG. 49, slits 91b to 93b may be formed in the patterns 91 to 93 formed on the first sealing member 90, respectively. Specifically, in the respective patterns 91 to 93, slits 91b to 93b are formed by removing portions different from the portions connected to the upper connecting vias 95 and 97. According to this, since the stress can be released by the slits 91b to 93b, the stress applied to the upper connecting vias 95 and 97 from the patterns 91 to 93 can be relaxed. In this case, the stress applied to the upper connecting via 97 can be further reduced by forming the slits 92b so as to substantially surround the upper connecting via 97 in the stacking direction, for example, as in the upper connecting via 97 connected to the source pattern 92. It is not always necessary that all the patterns 91 to 93 have the slits 91b to 93b. The slits 91b to 93b may be formed in any one or two patterns.

Figure 50:
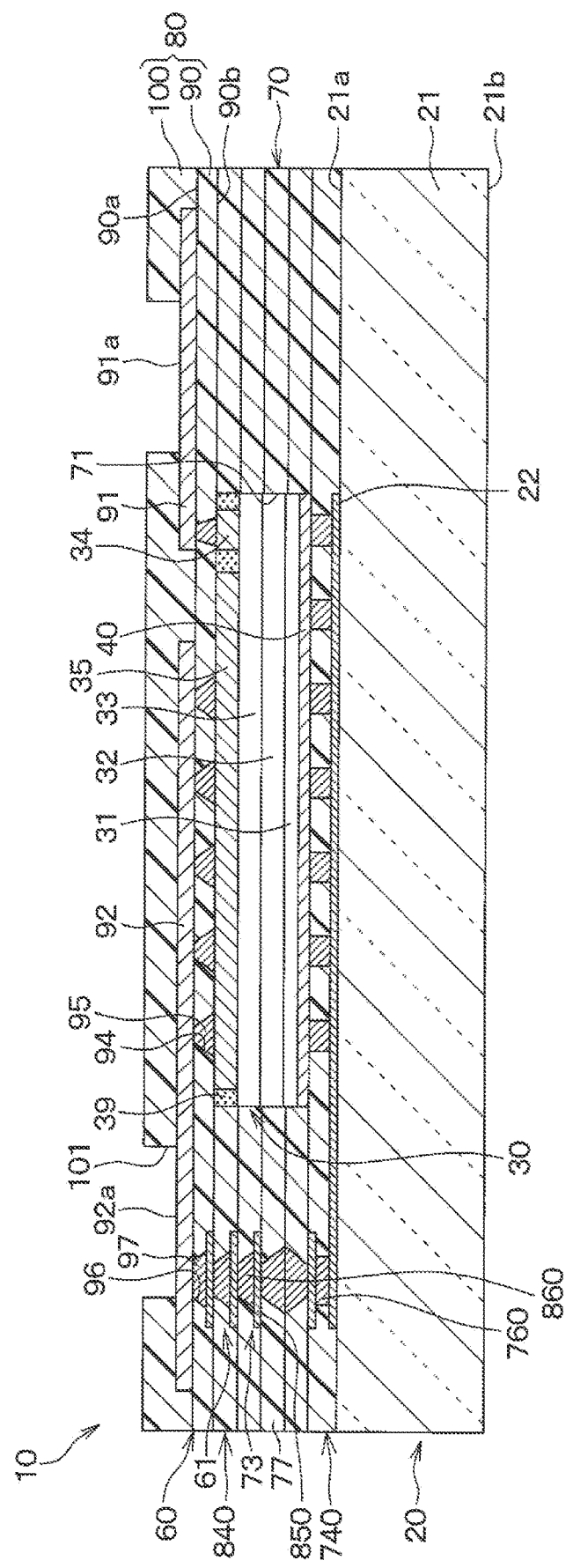
FIG. 50 is a cross-sectional view of a semiconductor package according to another embodiment.

Further, in the ninth embodiment, the lower layer connecting via 760 may have a cylindrical shape, as shown in FIG. 50. It should be noted that such a lower layer connecting via 760 is applicable to each embodiment having the lower layer connecting via 760.

Figure 51:
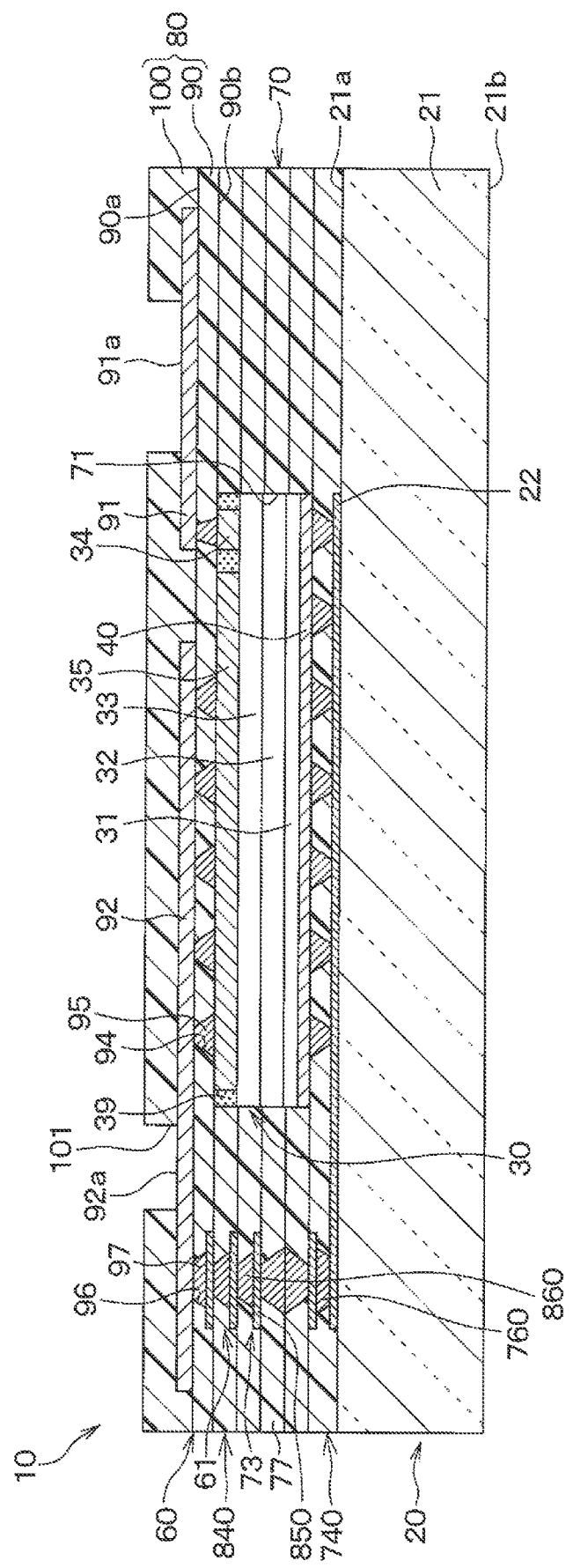
FIG. 51 is a cross-sectional view of a semiconductor package according to another embodiment.
Figure 52:
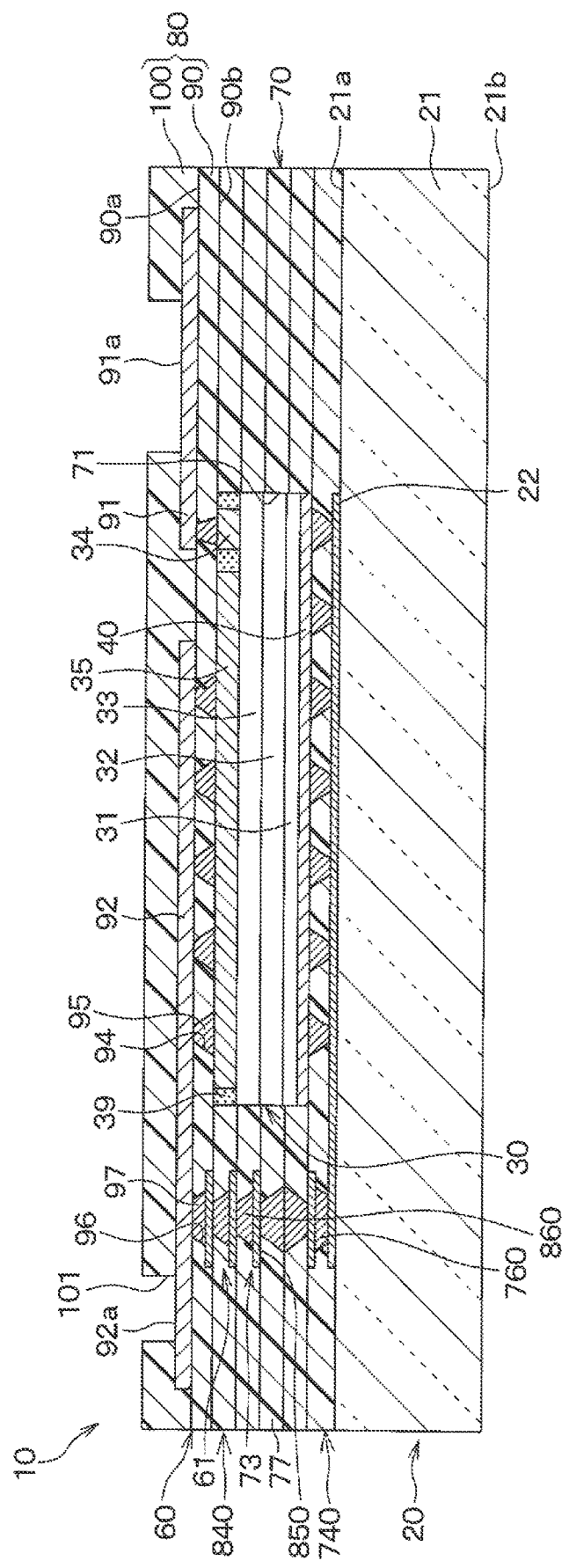
FIG. 52 is a cross-sectional view of a semiconductor package according to another embodiment.

Further, in the ninth embodiment described above, the pads 91a, 92a, 93a may be formed at different positions from the connecting via 61 in the stacking direction, as shown in FIG. 51. In other words, the pads 91a, 92a, 93a may be formed at positions that do not overlap with the connecting via 61 in the stacking direction. According to this, when the printed circuit board 110 is mounted on the pads 91a, 92a, 93a via the solder 120 or the like, the stress applied to the connecting via 61 can be reduced and the connecting via 61 can be suppressed from being broken. In this case, the source pad 92a may be arranged between the connecting via 61 and the semiconductor chip 30 in the stacking direction, as shown in FIG. 51. Alternatively, the source pad 92 may be arranged on the side opposite to the semiconductor chip 30 with respect to the connecting via 61, as shown in FIG. 52.

Figure 53:
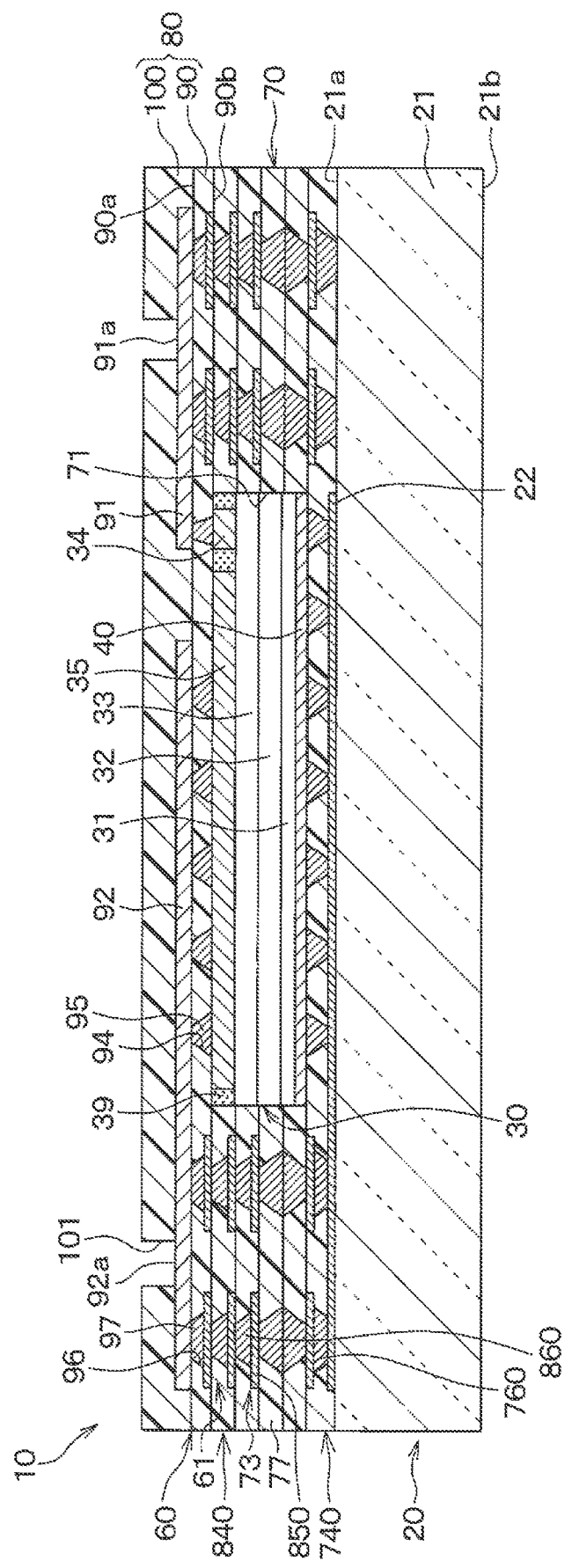
FIG. 53 is a cross-sectional view of a semiconductor package according to another embodiment.

Further, as shown in FIG. 53, a plurality of connecting vias 61 may be arranged in the circumferential direction around the pads 91a, 92a, and 93a at positions different from the pads 91a, 92a, and 93a in the stacking direction. In this case, it is preferable that the plurality of connecting vias 61 are arranged at equal intervals in the circumferential direction. According to this, when the printed circuit board 110 is mounted on the pads 91a, 92a, and 93a via the solder 120 or the like, the stress is easily applied to the connecting vias 61 in a dispersed manner, and thus the semiconductor chip 30 will not receive a large stress. The configurations shown in FIGS. 51 to 53 can also be appropriately applied to the embodiments described above.

In addition, each of the embodiments described above can be combined as appropriate. For example, the second embodiment may be appropriately combined with another embodiment so that the side sealing part 70 is composed of a plurality of plate-shaped members 74. For example, the third embodiment may be appropriately combined with another embodiment so that the bonding member 50 and the connecting via 61 are joined to each other, and the first surface metal film 22 and the second surface metal film 23 may not be provided. For example, the fourth embodiment may be appropriately combined with another embodiment so as to have a plurality of the connecting vias 61, such as the connecting via 61 connecting the drain pattern 91 and the drain region 22a. For example, the fifth embodiment may be appropriately combined with another embodiment so as to have the test pattern 98. For example, the sixth embodiment may be appropriately combined with another embodiment so that the semiconductor chip 30 has the insulating substrate 41 and the heat radiating member 20 is made of the metal plate 24. For example, the seventh embodiment may be appropriately combined with another embodiment so that the plurality of semiconductor chips 30 are integrally sealed by the sealing member 60. Further, the same described above may be appropriately applied to the eighth to the thirty-second embodiments. Moreover, the combinations of the embodiments described above may be further combined with another embodiment described above.

What is claimed is:

1. A semiconductor package comprising:
    a semiconductor chip formed with a semiconductor element;
    a heat radiating member having the semiconductor chip thereon; and
    a sealing member sealing the semiconductor chip, wherein
    the sealing member is made of a liquid crystal polymer,
    at least one of interfaces of different members including an interface between the heat radiating member and the sealing member is bonded by chemical bonding, and the chemical bonding is covalent bonding, wherein
    the sealing member includes a surface sealing part that seals a part of the semiconductor chip opposite to the heat radiating member and a side sealing part that seals a part of the semiconductor chip different from the part of the semiconductor chip sealed by the surface sealing part,
    the semiconductor chip has a first electrode and a second electrode, and the semiconductor element is configured to cause a current to flow between the first electrode and the second electrode,
    the surface sealing part is formed with a first pattern electrically connected to the first electrode and a second pattern electrically connected to the second electrode,
    the heat radiating member includes an insulating substrate and a first surface metal film disposed on a first surface of the insulating substrate,
    the side sealing part is provided by a stack of plate-shaped members each including a liquid crystal polymer film and a connecting via disposed in the liquid crystal polymer film to penetrate the liquid crystal polymer film, the stack of the plate-shaped members includes a lower layer plate-shaped member disposed between the semiconductor chip and the heat radiating member and an intermediate layer plate-shaped member disposed on the lower layer plate-shaped member,
    the intermediate layer plate-shaped member has an intermediate connecting via, as the connecting via, in the liquid crystal polymer film, and
    the lower layer plate-shaped member includes a first lower layer connecting via, as the connecting via, connecting the semiconductor chip and the first surface metal film, and a second lower layer connecting via, as the connecting via, connecting the intermediate layer connecting via formed in the intermediate layer plate-shaped member and the first surface metal film.

2. The semiconductor package according to claim 1, wherein the semiconductor element is a horizontal element that causes the current to flow in a planar direction of the semiconductor chip.

3. The semiconductor package according to claim 1, wherein the semiconductor element is a vertical element that causes the current to flow in a thickness direction of the semiconductor chip.

4. The semiconductor package according to claim 1, wherein
    the semiconductor chip has an outline including opposed sides,
    the semiconductor chip has a gate electrode that controls the current to flow between the first electrode and the second electrode,
    the surface sealing part is formed with a gate pattern that is electrically connected to the gate electrode, and a contact hole that exposes the gate pattern to provide a gate pad,
    the gate pad includes a first gate pad and a second gate pad, and the first gate pad is disposed adjacent to one of the opposed sides, and the second gate pad is disposed adjacent to another of the opposed sides.

5. The semiconductor package according to claim 1, wherein
the semiconductor chip has a part bonded with the sealing member by the covalent bonding, the part being different from a part where the first electrode is provided and a part where the second electrode is provided.

6. The semiconductor package according to claim 1, wherein
the surface sealing part is formed with a first upper connecting via connecting the first electrode and the first pattern, and a second upper connecting via connecting the second electrode and the second pattern, and
at least one of the first pattern and the second pattern is formed with a slit at a position different from a portion connected to the first upper connecting via or the second upper connecting via.

7. The semiconductor package according to claim 1, wherein
the surface sealing part is formed with a first contact hole that exposes the first pattern to provide a first pad, and a second contact hole that exposes the second pattern to provide a second pad, and
a connection bump is provided on each of the first pad and the second pad.

8. The semiconductor package according to claim 1, wherein
the first lower layer connecting via is one of a plurality of first lower layer connecting vias.

9. The semiconductor package according to claim 8, wherein
the first lower layer connecting vias are connected only to an inner edge portion of the semiconductor chip.

10. The semiconductor package according to claim 8, wherein
of the plurality of first lower layer connecting vias, one connected to an inner portion of the semiconductor chip has a larger connection area with the semiconductor chip than another connected to an outer portion of the semiconductor chip.

11. The semiconductor package according to claim 8, wherein
the lower layer plate-shaped member includes a first lower layer plate-shaped member stacked on the heat radiating member and a second lower layer plate-shaped member stacked on the first lower layer plate-shaped member,
the first lower layer plate-shaped member is formed with a first lower layer connecting via, as the lower layer connecting via, the second lower layer plate-shaped member is formed with a second lower layer connecting via, as the lower layer connecting via,
the first lower layer connecting via and the second lower layer connecting via are disposed at different positions in the stacking direction of the heat radiating member and the semiconductor chip, and
the first lower layer connecting via has a larger diameter than the second lower layer connecting via.

12. The semiconductor package according to claim 1, wherein
a plurality of the intermediate layer plate-shaped members is disposed in layers on the lower layer plate-shaped member, and
the intermediate layer connecting vias of the intermediate layer plate-shaped members adjacent in the stacking direction are directly connected to each other.

13. The semiconductor package according to claim 1, further comprising:
a capacitor disposed in the sealing member together with the semiconductor chip, and
the capacitor and the semiconductor chip are electrically connected to each other through a wiring layer disposed in the sealing member.

14. The semiconductor package according to claim 1, wherein
the heat radiating member has a roughened portion at a part bonded with the sealing member.

15. The semiconductor package according to claim 1, wherein
the heat radiating member is a first heat radiating member, the semiconductor package further comprising:
a second heat radiating member disposed opposite to the first heat radiating member with respect to the sealing member.

16. The semiconductor package according to claim 1, wherein
the heat radiating member is a first heat radiating member, the semiconductor package further comprising:
a second heat radiating member disposed opposite to the first heat radiating member with respect to the sealing member, wherein
the second heat radiating member is made of a material having a higher thermal conductivity than the first heat radiating member.

17. The semiconductor package according to claim 1, wherein
the sealing member has a surface from which a pad electrically connected to the semiconductor chip exposes, on a side opposite to the heat radiating member.

* * * * *